US012089407B2

(12) United States Patent
Kwon et al.

(10) Patent No.: US 12,089,407 B2
(45) Date of Patent: Sep. 10, 2024

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Donghoon Kwon, Hwaseong-si (KR); Chungki Min, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 431 days.

(21) Appl. No.: 17/574,740

(22) Filed: Jan. 13, 2022

(65) Prior Publication Data

US 2022/0384477 A1 Dec. 1, 2022

(30) Foreign Application Priority Data

Jun. 1, 2021 (KR) .......................... 10-2021-0070961

(51) Int. Cl.
*H10B 43/27* (2023.01)
*H01L 23/535* (2006.01)
*H10B 41/27* (2023.01)
*H10B 41/41* (2023.01)
*H10B 43/40* (2023.01)

(52) U.S. Cl.
CPC ........... *H10B 43/27* (2023.02); *H01L 23/535* (2013.01); *H10B 41/27* (2023.02); *H10B 41/41* (2023.02); *H10B 43/40* (2023.02)

(58) Field of Classification Search
CPC ........ H10B 43/27; H10B 41/27; H10B 41/41; H10B 43/40; H10B 41/40; H10B 41/50; H10B 43/50; H10B 43/20; H10B 41/20; H01L 23/535; H01L 21/823475; H01L 25/0657; H01L 2225/06541
See application file for complete search history.

(56) References Cited

U.S. PATENT DOCUMENTS

| 10,367,003 | B2  |   | 7/2019  | Kang et al. |             |
|------------|-----|---|---------|-------------|-------------|
| 10,910,396 | B2  |   | 2/2021  | Kim et al.  |             |
| 11,961,560 | B2  | * | 4/2024  | Lee         | H10B 41/50  |
| 2019/0319038 | A1 | * | 10/2019 | Zhang       | H01L 23/535 |

(Continued)

FOREIGN PATENT DOCUMENTS

KR    10-2017-0142774 A    12/2017

*Primary Examiner* — Douglas W Owens
(74) *Attorney, Agent, or Firm* — Muir Patent Law, PLLC

(57) ABSTRACT

A semiconductor device includes a peripheral circuit structure including a lower substrate, a plurality of circuits formed on the lower substrate, and a plurality of wiring layers connected to the plurality of circuits, an upper substrate covering the peripheral circuit structure and including a through opening, a memory stack structure including a plurality of gate lines, a memory cell contact passing through at least one of the plurality of gate lines to contact one gate line from among the plurality of gate lines, the memory cell contact extending to the peripheral circuit structure through the through opening and being configured to be electrically connected to a first wiring layer from among the plurality of wiring layers, and a plurality of dummy channel structures passing through at least one of the plurality of gate lines to extend to the peripheral circuit structure through the through opening.

20 Claims, 44 Drawing Sheets

(56) References Cited

U.S. PATENT DOCUMENTS

| | | |
|---|---|---|
| 2020/0058671 A1 | 2/2020 | Kim et al. |
| 2020/0168547 A1* | 5/2020 | Lim ................ H10B 43/40 |
| 2020/0350249 A1 | 11/2020 | Kim et al. |
| 2020/0365616 A1 | 11/2020 | Baek |
| 2020/0402996 A1 | 12/2020 | Cheon et al. |
| 2021/0036013 A1 | 2/2021 | Lee et al. |
| 2021/0057444 A1 | 2/2021 | Park et al. |
| 2021/0193672 A1 | 6/2021 | Kim et al. |

* cited by examiner

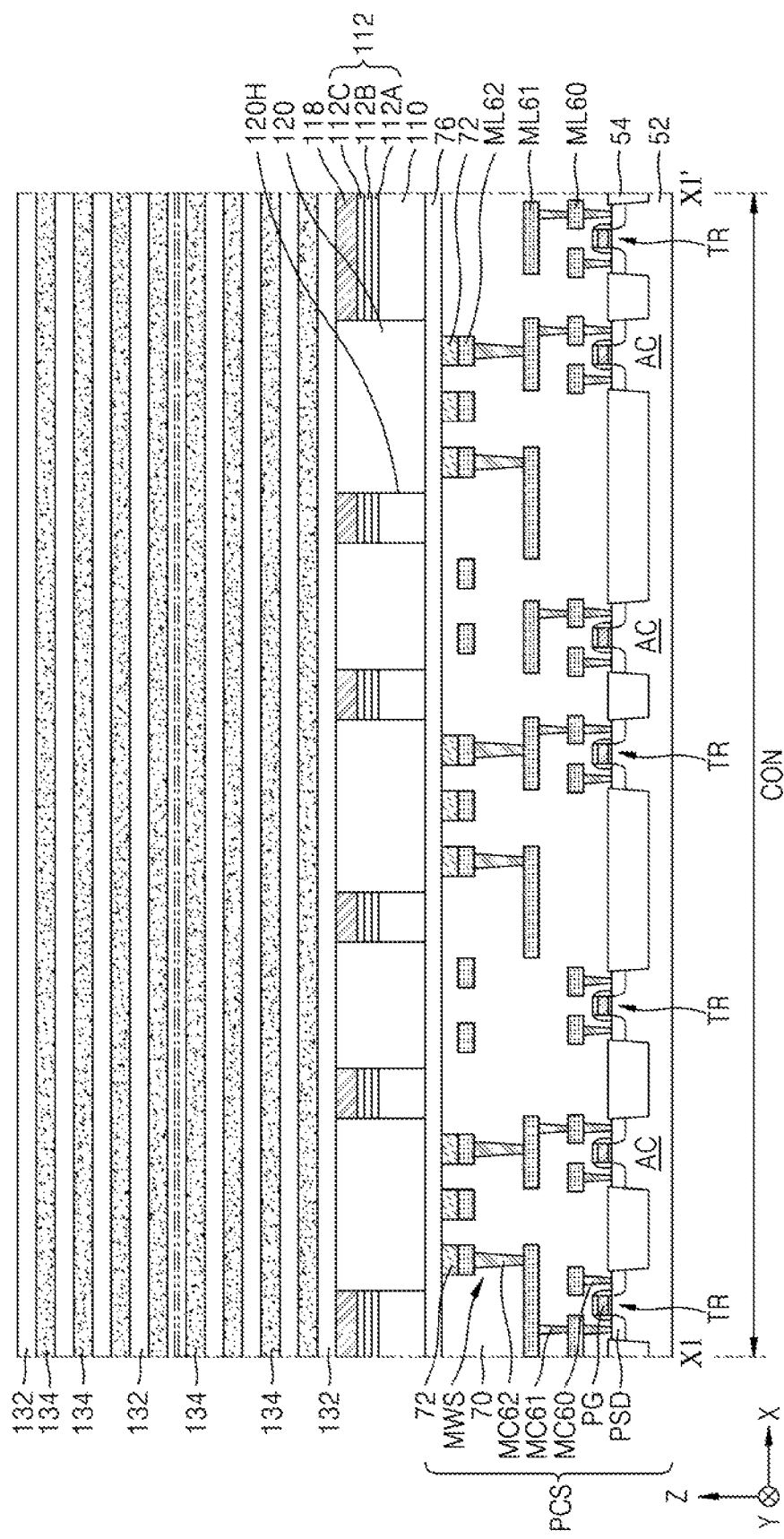

SEMICONDUCTOR DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2021-0070961, filed on Jun. 1, 2021, in the Korean Intellectual Property Office, the disclosure of which is incorporated by reference herein in its entirety.

BACKGROUND

1. Field

Embodiments relate to a semiconductor device and an electronic system including the same.

2. Description of the Related Art

Electronic systems requiring data storage need semiconductor devices for storing a high amount of data. Therefore, a method of increasing the data storage capacity of semiconductor devices has been researched. For example, in order to increase the data storage capacity of semiconductor devices, semiconductor devices including vertical memory devices, which include three-dimensionally arranged memory cells instead of two-dimensionally arranged memory cells, have been proposed.

SUMMARY

According to an embodiment, there is provided a semiconductor device including a peripheral circuit structure including a lower substrate, a plurality of circuits formed on the lower substrate, and a plurality of wiring layers connected to the plurality of circuits, an upper substrate extending in a horizontal direction to cover the peripheral circuit structure and including a through opening overlapping a partial region of the peripheral circuit structure in a vertical direction, a memory stack structure including a plurality of gate lines overlapping one another in the vertical direction on the upper substrate, a memory cell contact disposed in a first hole passing through at least one of the plurality of gate lines to contact one gate line selected from among the plurality of gate lines in the first hole and provided apart from a gate line other than the selected one gate line in a horizontal direction, the memory cell contact extending to the peripheral circuit structure through the through opening and being configured to be electrically connected to a first wiring layer selected from among the plurality of wiring layers, and a plurality of dummy channel structures disposed in a second hole passing through at least one of the plurality of gate lines to extend to the peripheral circuit structure through the through opening.

According to another embodiment, there is provided a semiconductor device including a peripheral circuit structure including a lower substrate, a plurality of circuits formed on the lower substrate, and a plurality of wiring layers connected to the plurality of circuits, an upper substrate extending in a horizontal direction in a memory cell region and a connection region on the peripheral circuit structure and including a plurality of through openings overlapping a partial region of the peripheral circuit structure in a vertical direction in the connection region, a memory stack structure including a plurality of gate lines overlapping one another in the vertical direction on the upper substrate in the memory cell region and the connection region, a memory cell contact disposed in a first hole passing through at least one of the plurality of gate lines in the connection region to contact one gate line selected from among the plurality of gate lines in the first hole and provided apart from a gate line other than the selected one gate line in a horizontal direction, the memory cell contact extending to the peripheral circuit structure through a first through opening selected from among the plurality of through openings and being configured to be electrically connected to a first wiring layer selected from among the plurality of wiring layers, a dummy channel structure disposed in a second hole passing through at least one of the plurality of gate lines in the connection region to extend to the peripheral circuit structure through the first through opening, and a through via electrode disposed in a third hole passing through at least one of the plurality of gate lines in the connection region, the through via electrode extending to the peripheral circuit structure through a second through opening selected from among the plurality of through openings and being configured to be electrically connected to a second wiring layer selected from among the plurality of wiring layers.

According to another embodiment, there is provided an electronic system including a main substrate, a semiconductor device on the main substrate, and a controller electrically connected to the semiconductor device on the main substrate, wherein the semiconductor device includes a peripheral circuit structure including a lower substrate, a plurality of circuits formed on the lower substrate, and a plurality of wiring layers connected to the plurality of circuits, an upper substrate extending in a horizontal direction to cover the peripheral circuit structure and including a through opening overlapping a partial region of the peripheral circuit structure in a vertical direction, a memory stack structure including a plurality of gate lines overlapping one another in the vertical direction on the upper substrate, a memory cell contact disposed in a first hole passing through at least one of the plurality of gate lines to contact one gate line selected from among the plurality of gate lines in the first hole and provided apart from a gate line other than the selected one gate line in a horizontal direction, the memory cell contact extending to the peripheral circuit structure through the through opening and being configured to be electrically connected to a first wiring layer selected from among the plurality of wiring layers, a plurality of dummy channel structures disposed in a second hole passing through at least one of the plurality of gate lines to extend to the peripheral circuit structure through the through opening, and an input/output pad configured to be electrically connected to the peripheral circuit structure.

BRIEF DESCRIPTION OF THE DRAWINGS

Features will become apparent to those of skill in the art by describing in detail example embodiments with reference to the attached drawings in which.

DETAILED DESCRIPTION

Figure 1:
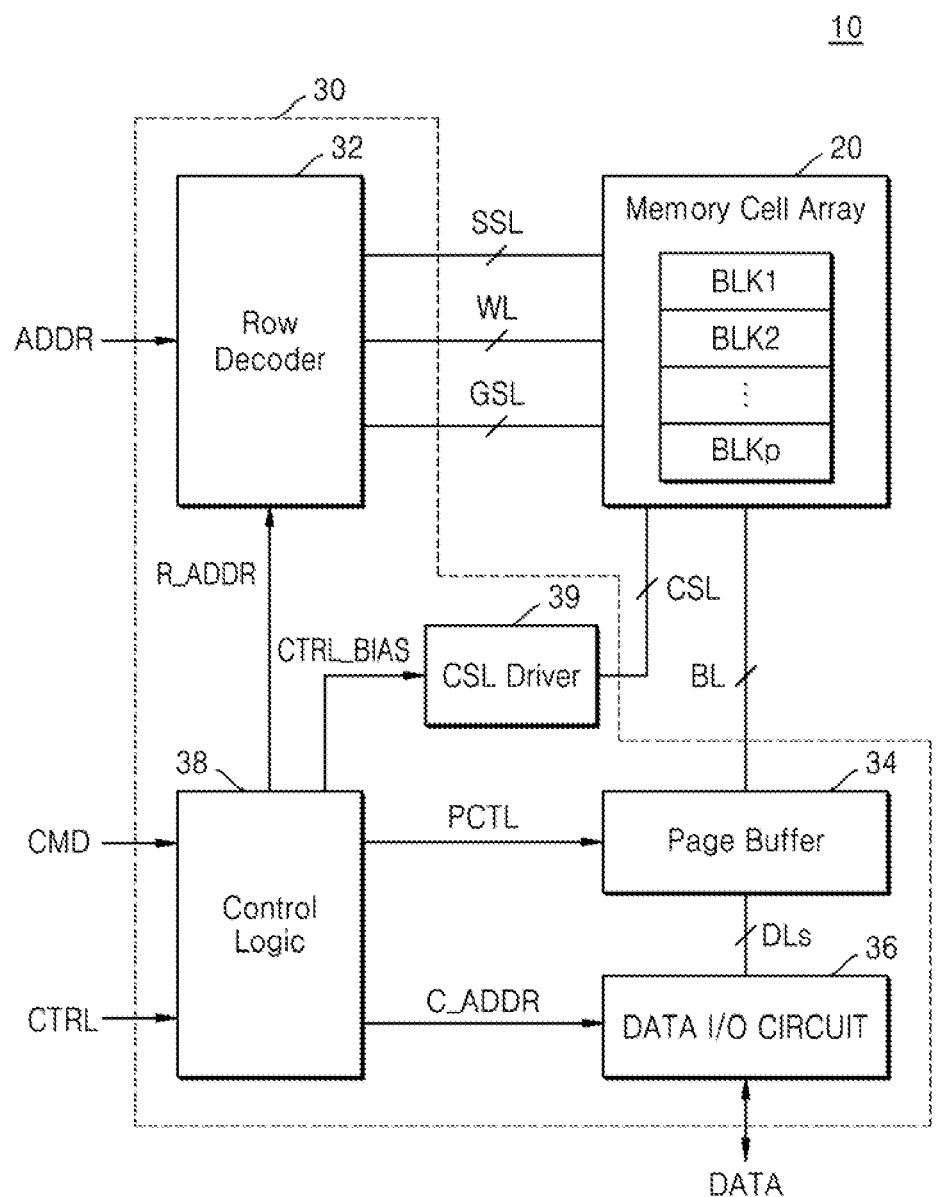
FIG. 1 is a block diagram of a semiconductor device according to embodiments.

FIG. 1 is a block diagram of a semiconductor device 10 according to embodiments.

Referring to FIG. 1, the semiconductor device 10 may include a memory cell array 20 and a peripheral circuit 30. The memory cell array 20 may include a plurality of memory cell blocks BLK1, BLK2, . . . , and BLKp. Each of the plurality of memory cell blocks BLK1, BLK2, . . . , and BLKp may include a plurality of memory cells. The plurality of memory cell blocks BLK1, BLK2, . . . , and BLKp may be connected to the peripheral circuit 30 through a bit line BL, a word line WL, a string selection line SSL, and a ground selection line GSL.

The peripheral circuit 30 may include a row decoder 32, a page buffer 34, a data input/output (I/O) circuit 36, a control logic 38, and a common source line driver 39. The peripheral circuit 30 may further include various circuits, such as a voltage generating circuit for generating various voltages used for operation of the semiconductor device 10, an error correction circuit for correcting an error of data read from the memory cell array 20, and an I/O interface.

The memory cell array 20 may be connected to the row decoder 32 through the word line WL, the string selection line SSL, and the ground selection line GSL, and may be connected to the page buffer 34 through the bit line BL. In the memory cell array 20, each of the plurality of memory cells included in each of the plurality of memory cell blocks BLK1, BLK2, . . . , and BLKp may be a flash memory cell. The memory cell array 20 may include a three-dimensional (3D) memory cell array. The 3D memory cell array may include a plurality of NAND strings, and each of the plurality of NAND strings may include a plurality of memory cells connected to a plurality of word lines WL, which are vertically stacked.

The peripheral circuit 30 may receive an address ADDR, a command CMD, and a control signal CTRL from the outside of the semiconductor device 10, and may transmit and receive data DATA to and from a device outside the semiconductor device 10.

The row decoder 32 may select at least one memory cell block from among the plurality of memory cell blocks BLK1, BLK2, . . . , and BLKp in response to the address ADDR from the outside, and may select a word line WL, a string selection line SSL, and a ground selection line GSL of the selected memory cell block. The row decoder 32 may transfer a voltage, which is for performing a memory operation, to the word line WL of the selected memory cell block.

The page buffer 34 may be connected to the memory cell array 20 through the bit line BL. In performing a program operation, the page buffer 34 may operate as a write driver to apply a voltage, based on data DATA which is to be stored in the memory cell array 20, to the bit line BL, and, in performing a read operation, the page buffer 34 may operate as a sensing amplifier to sense the data DATA stored in the memory cell array 20. The page buffer 34 may operate based on a control signal PCTL provided from the control logic 38.

The data I/O circuit 36 may be connected to the page buffer 34 through a plurality of data lines DL. In performing a program operation, the data I/O circuit 36 may receive the data DATA from a memory controller (not shown), and may provide program data DATA to the page buffer 34 on the basis of a column address C_ADDR provided from the control logic 38. In performing a read operation, the data I/O circuit 36 may provide the memory controller with read data DATA stored in the page buffer 34 on the basis of the column address C_ADDR.

The data I/O circuit 36 may transfer an address or a command, which is input thereto, to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32, and may provide the column address C_ADDR to the data I/O circuit 36. The control logic 38 may generate various internal control signals which are used in the semiconductor device 10, in response to the control signal CTRL. For example, the control logic 38 may control a voltage level to the word line WL and the bit line BL in performing a memory operation such as a program operation or an erase operation.

The common source line driver 39 may be connected to the memory cell array 20 through the common source line CSL. The common source line driver 39 may apply a common source voltage (for example, a source voltage) or a ground voltage to the common source line CSL on the basis of a control signal CTRL_BIAS of the control logic 38.

Figure 2:
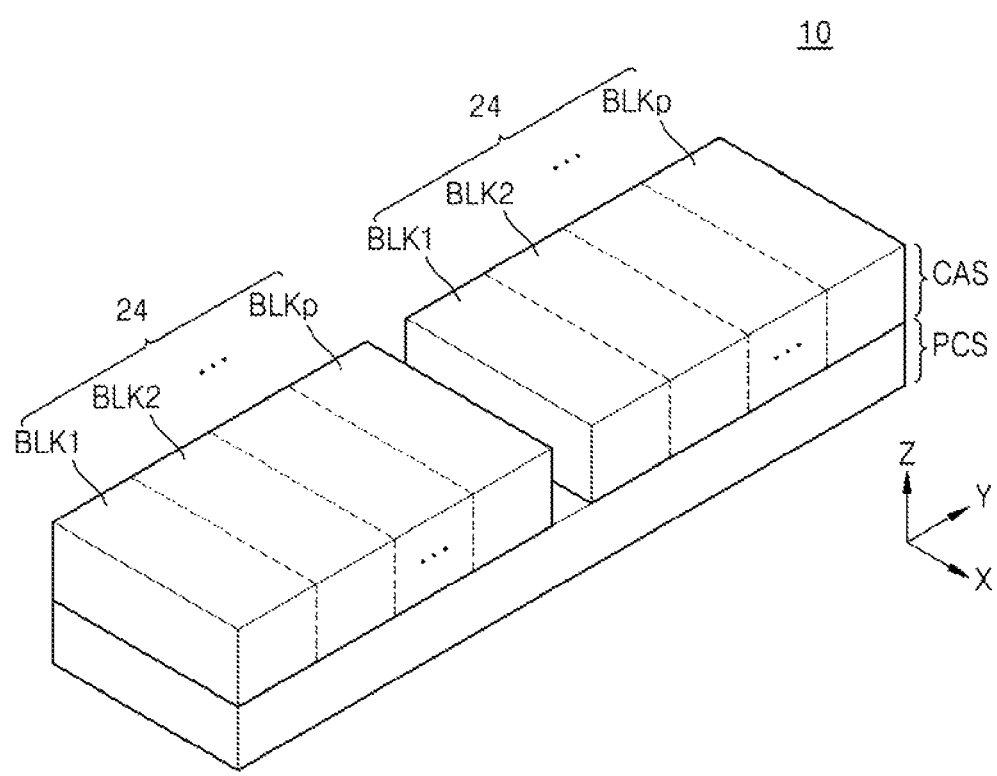
FIG. 2 is a schematic perspective view of a semiconductor device according to embodiments.

FIG. 2 is a schematic perspective view of a semiconductor device 10 according to embodiments.

Referring to FIG. 2, the semiconductor device 10 may include a cell array structure CAS and a peripheral circuit structure PCS, which overlap in a vertical direction (a Z direction). The cell array structure CAS may include the memory cell array 20 described above with reference to FIG. 1. The peripheral circuit structure PCS may include the peripheral circuit 30 described above with reference to FIG. 1.

The cell array structure CAS may include a plurality of tiles 24. Each of the plurality of tiles 24 may include a plurality of memory cell blocks BLK1, BLK2, . . . , and BLKp. Each of the plurality of memory cell blocks BLK1, BLK2, . . . , and BLKp may include a plurality of memory cells, which are three-dimensionally arranged.

In embodiments, two tiles 24 may configure one mat. The memory cell array 20 described above with reference to FIG. 1 may include a plurality of mats (for example, four mats).

Figure 3:
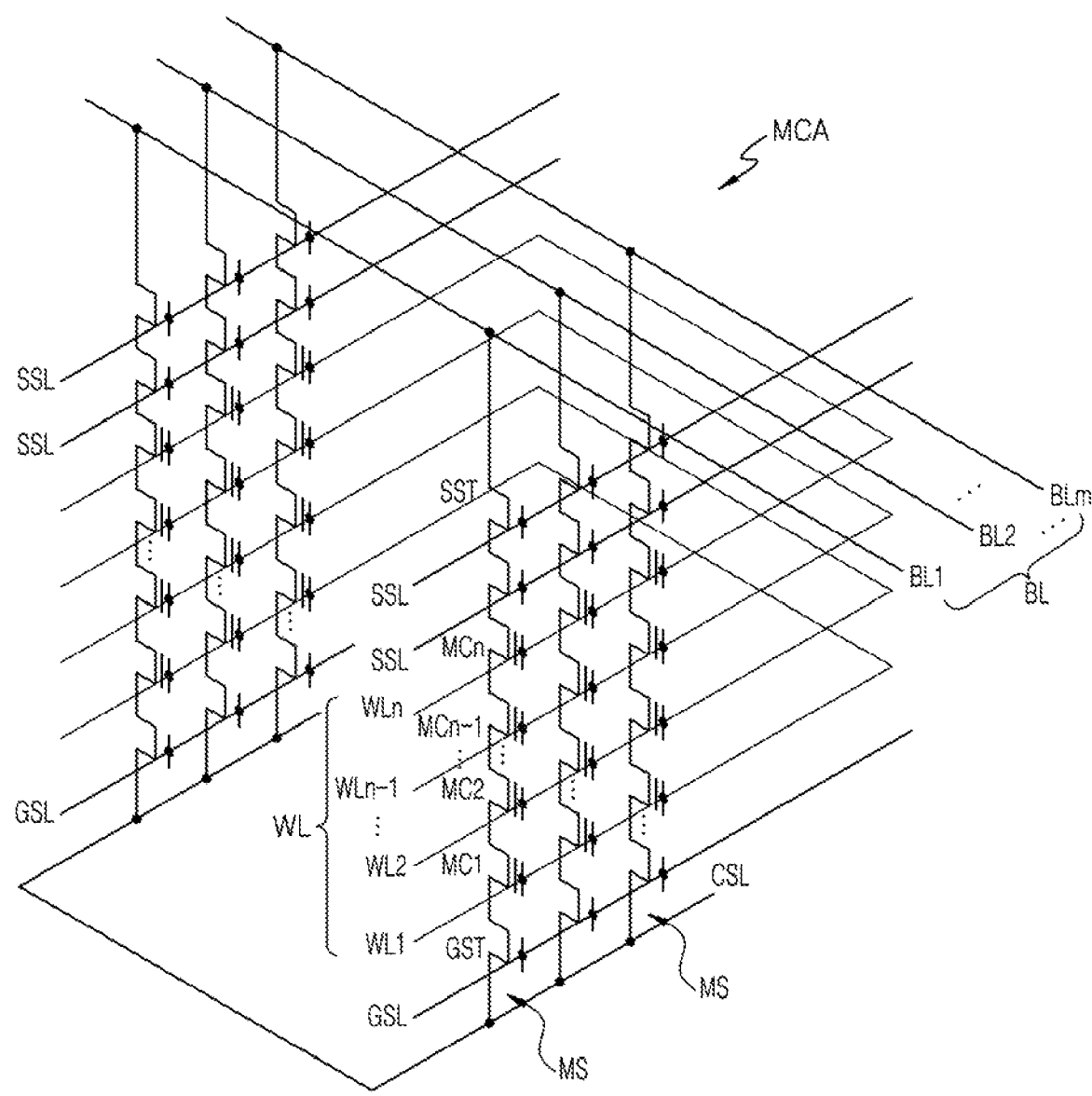
FIG. 3 is an equivalent circuit diagram of a memory cell array of a semiconductor device according to embodiments.

FIG. 3 is an equivalent circuit diagram of a memory cell array MCA of a semiconductor device according to embodiments.

In FIG. 3, an equivalent circuit diagram of a vertical NAND flash memory having a vertical channel structure is illustrated. Each of the plurality of memory cell blocks BLK1, BLK2, . . . , and BLKp illustrated in FIGS. 1 and 2 may include a memory cell array MCA having a circuit configuration illustrated in FIG. 3.

Referring to FIG. 3, the memory cell array MCA may include a plurality of memory cell strings MS. The memory cell array MCA may include a plurality of bit lines BL (BL1, BL2, . . . , and BLm), a plurality of word lines WL (WL1, WL2, . . . , WLn−1, and WLn), at least one string selection line SSL, at least one ground selection line GSL, and a common source line CSL. The plurality of memory cell strings MS may be formed between the plurality of bit lines BL and the common source line CSL. In FIG. 3, an example is illustrated where each of the plurality of memory cell strings MS includes one ground selection line GSL and two string selection lines SSL, but each of the plurality of memory cell strings MS may include, e.g., one string selection line SSL.

Each of the plurality of memory cell strings MS may include a string selection transistor SST, a ground selection transistor GST, and a plurality of memory cell transistors MC1, MC2, . . . , MCn−1, and MCn. A drain region of the string selection transistor SST may be connected to a bit line BL, and a source region of the ground selection transistor GST may be connected to the common source line CSL. The common source line CSL may be a region which is connected to source regions of the plurality of ground selection transistors GST in common.

The string selection transistor SST may be connected to the string selection line SSL, and the ground selection transistor GST may be connected to the ground selection line GSL. Each of the plurality of memory cell transistors MC1, MC2, . . . , MCn−1, and MCn may be connected to a word line WL.

Figure 4:
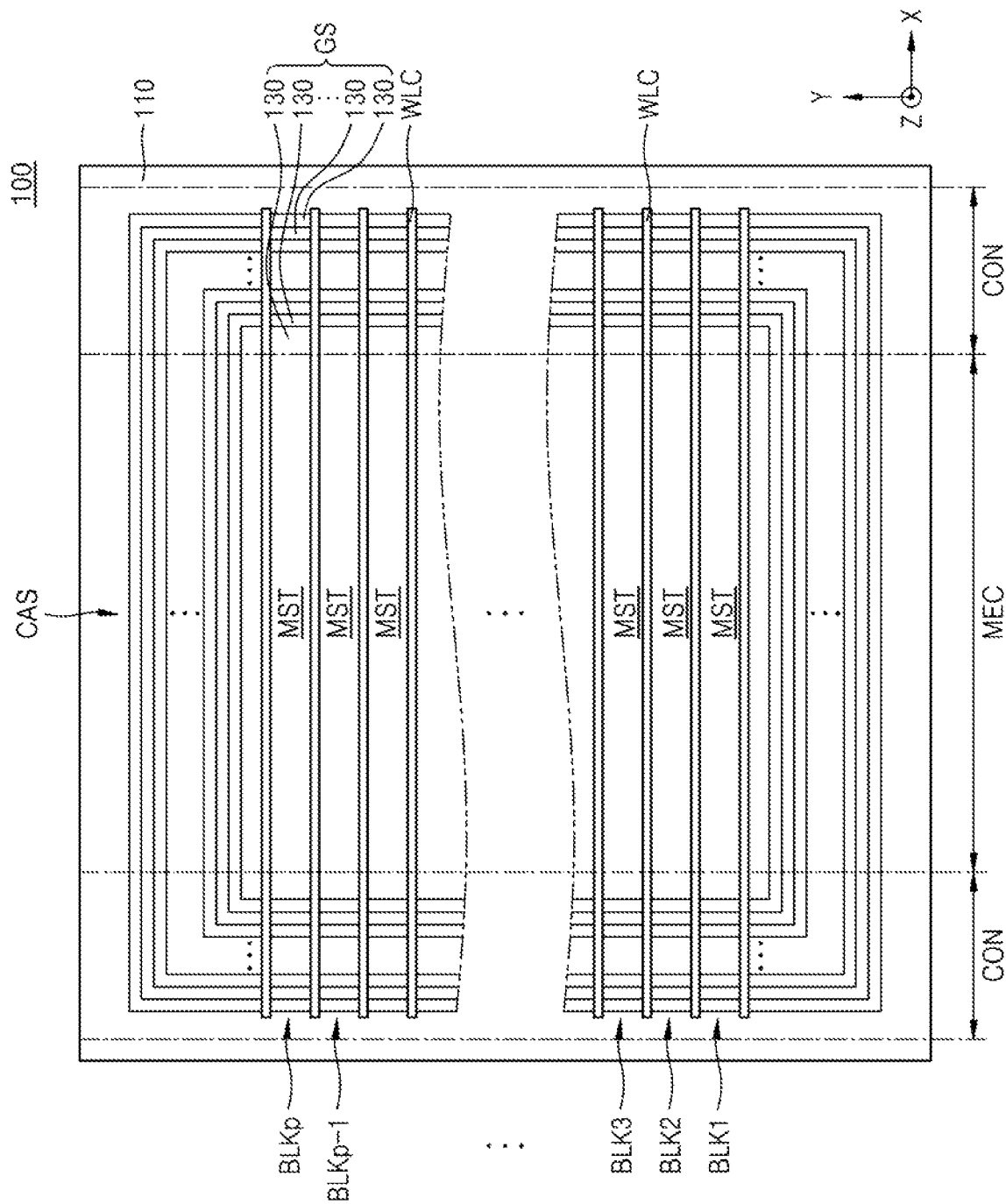
FIG. 4 is a schematic plan view of a partial region of a semiconductor device according to embodiments.

FIG. 4 is a schematic plan view of a partial region of a semiconductor device 100 according to embodiments.

Referring to FIG. 4, a cell array structure CAS of the semiconductor device 100 may include an upper substrate 110 and a plurality of memory cell blocks BLK1, BLK2, . . . , and BLKp disposed on the upper substrate 110.

The peripheral circuit structure PCS (see FIG. 2) may be disposed under the upper substrate 110. The plurality of memory cell blocks BLK1, BLK2, . . . , and BLKp may overlap the peripheral circuit structure PCS in a vertical direction (a Z direction) with the upper substrate 110 therebetween. The peripheral circuit structure PCS disposed under the upper substrate 110 may include the peripheral circuit 30 described above with reference to FIG. 1.

The cell array structure CAS may include a memory cell region MEC and a connection region CON which is disposed at each of both sides of the memory cell region MEC in a first horizontal direction (an X direction). Each of the plurality of memory cell blocks BLK1, BLK2, . . . , and BLKp may include a memory stack structure MST which extends in the first horizontal direction (the X direction) over the memory cell region MEC and the connection region CON. The memory stack structure MST may include a plurality of gate lines 130, which are stacked to overlap in the vertical direction (the Z direction) in the memory cell region MEC and the connection region CON of the upper substrate 110. In each of the plurality of memory stack structures MST, the plurality of gate lines 130 may configure a gate stack GS. In each of the plurality of memory stack structures MST, the plurality of gate lines 130 may configure the ground selection line GSL, the plurality of word lines WL, and the string selection line SSL each illustrated in FIG. 3. In an X-Y plane, the plurality of gate lines 130 may be progressively reduced in area as a distance from the upper substrate 110 increases. A center portion of each of the plurality of gate lines 130 overlapping in the vertical direction (the Z direction) may configure the memory cell region MEC, and an edge portion of each of the plurality of gate lines 130 may configure the connection region CON.

A plurality of word line cut structures WLC, extending long in the first horizontal direction (the X direction) in the memory cell region MEC and the connection region CON, may be disposed on the upper substrate 110. The plurality of word line cut structures WLC may be arranged apart from one another in a second horizontal direction (a Y direction). The plurality of memory cell blocks BLK1, BLK2, . . . , and BLKp may each be disposed between two adjacent word line cut structures WLC of the plurality of word line cut structures WLC.

FIGS. 5 to 10 are diagrams illustrating in more detail a semiconductor device 100 according to embodiments.

Figure 5:
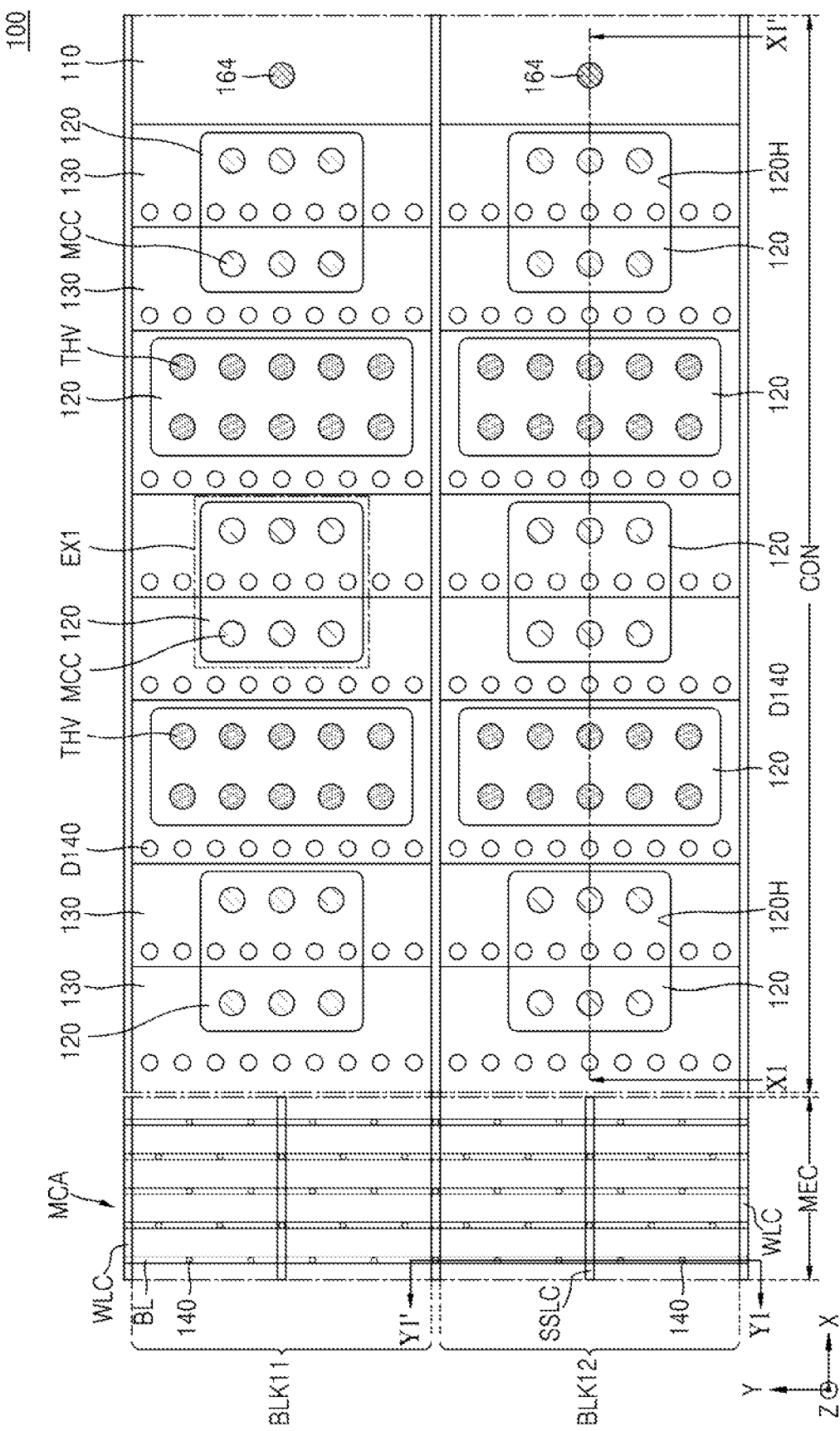
FIG. 5 is a schematic plan view illustrating some elements of a memory cell block included in a semiconductor device according to embodiments.
Figure 6:
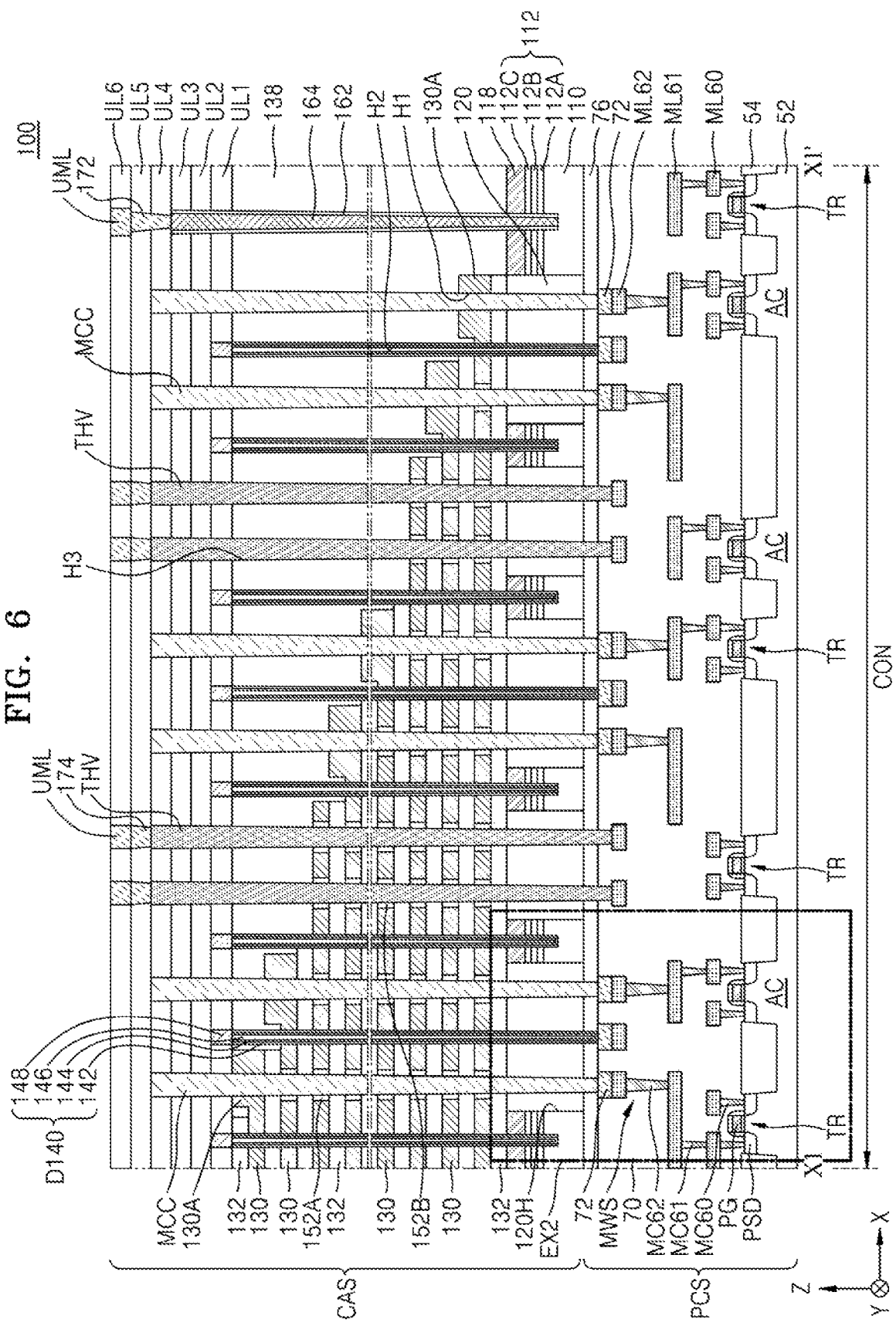
FIG. 6 is a cross-sectional view taken along line X1-X1' of FIG. 5.
Figure 7:
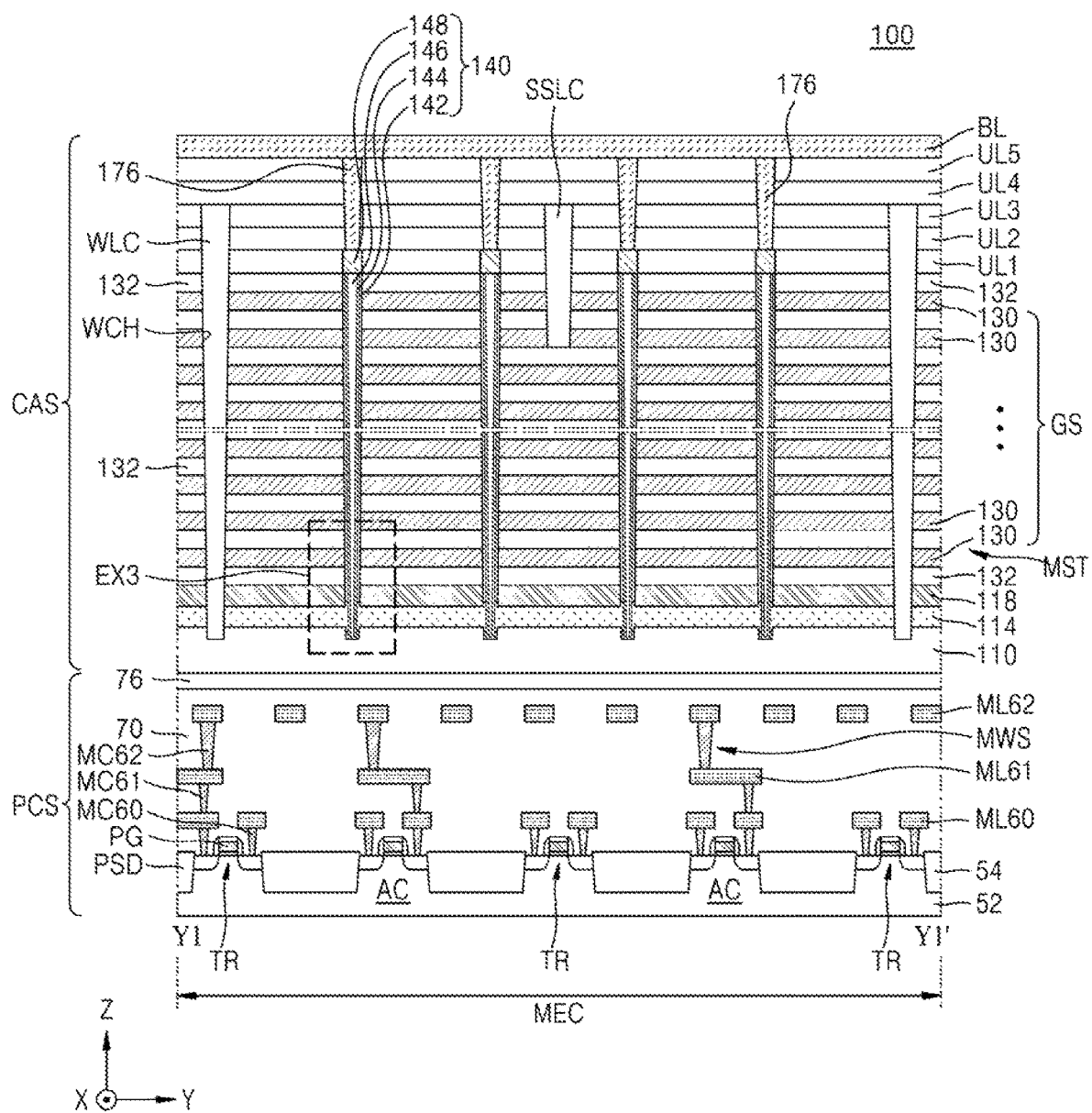
FIG. 7 is a cross-sectional view taken along line Y1-Y1' of FIG. 5.
Figure 8:
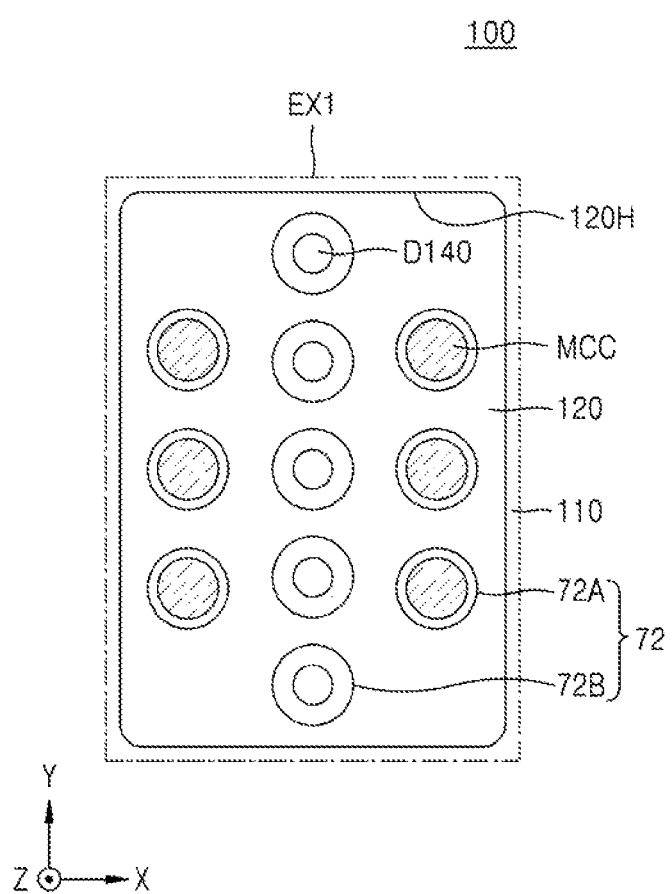
FIG. 8 is a plan view illustrating the enlargement of some elements included in a region EX1 of FIG. 5.
Figure 9:
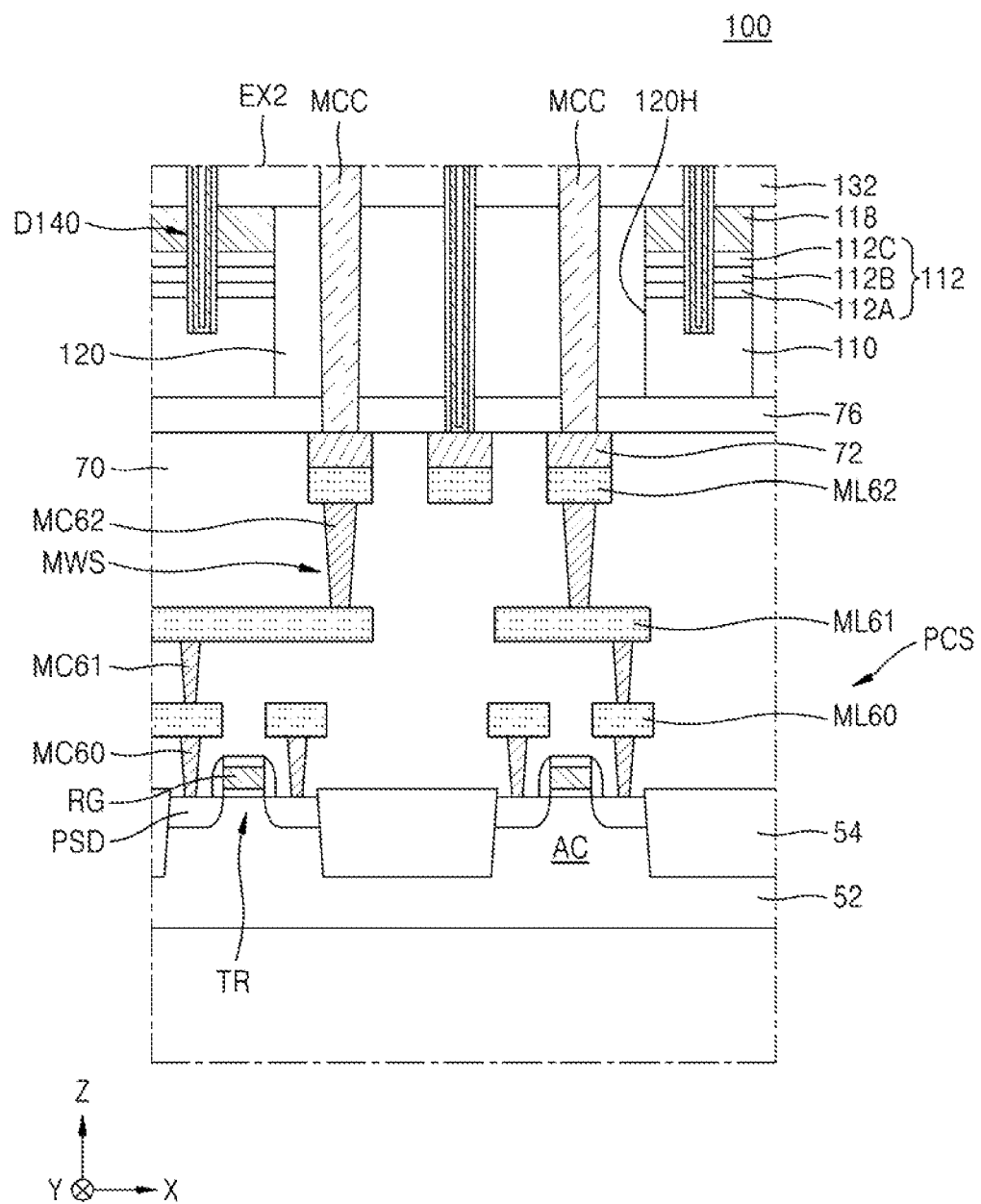
FIG. 9 is a cross-sectional view illustrating an enlarged view of some elements included in a region EX2 of FIG. 6.
Figure 10:
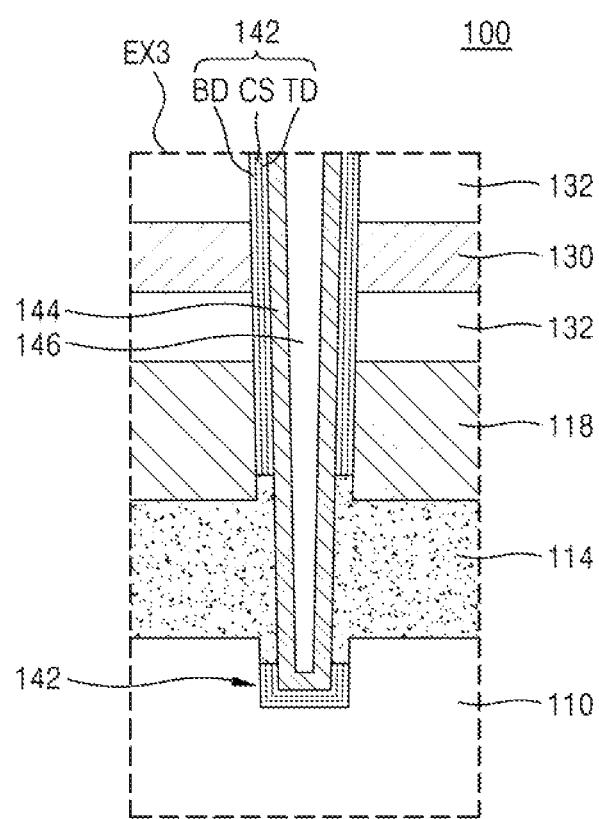
FIG. 10 is a cross-sectional view illustrating an enlarged view of some elements included in a region EX3 of FIG. 7.

In particular, FIG. 5 is a schematic plan view illustrating some elements of memory cell blocks BLK11 and BLK12, FIG. 6 is a cross-sectional view taken along line X1-X1' of FIG. 5, and FIG. 7 is a cross-sectional view taken along line Y1-Y1' of FIG. 5. FIG. 8 is a plan view illustrating an enlargement of some elements included in a region EX1 of FIG. 5. FIG. 9 is a cross-sectional view illustrating an enlargement of some elements included in a region EX2 of FIG. 6. FIG. 10 is a cross-sectional view illustrating an enlargement of some elements included in a region EX3 of FIG. 7.

The memory cell blocks BLK11 and BLK12 illustrated in FIG. 5 may configure the plurality of memory cell blocks BLK1, BLK2, . . . , BLKp−1, and BLKp illustrated in FIG. 4.

Referring to FIGS. 5 to 10, the semiconductor device 100 may include a peripheral circuit structure PCS and a cell array structure CAS, which is disposed on the peripheral circuit structure PCS and overlaps the peripheral circuit structure PCS in a vertical direction (a Z direction).

The cell array structure CAS may include an upper substrate 110, a first conductive plate 114, a second conductive plate 118, an insulation plate 112, and a memory stack structure MST.

Referring to FIG. 6, in the cell array structure CAS, the insulation plate 112, the second conductive plate 118, and the memory stack structure MST may be sequentially stacked on the upper substrate 110 in the connection region CON.

Referring to FIG. 7, in the cell array structure CAS, the first conductive plate 114, the second conductive plate 118, and the memory stack structure MST may be sequentially stacked on the upper substrate 110 in the memory cell region MEC.

The first conductive plate 114 and the second conductive plate 118 may perform a function of the common source line CSL described above with reference to FIG. 3. The first conductive plate 114 and the second conductive plate 118 may function as a source region which provides a current to a plurality of vertical memory cells included in the cell array structure CAS.

In embodiments, the upper substrate 110 may include a semiconductor material such as polysilicon. Each of the first conductive plate 114 and the second conductive plate 118 may include doped polysilicon, a metal layer, or a combination thereof. The metal layer may include tungsten (W).

The memory stack structure MST may include a gate stack GS. The gate stack GS may include a plurality of gate lines 130 which extend in parallel in a horizontal direction and overlap in the vertical direction (the Z direction). Each of the plurality of gate lines 130 may include metal, metal silicide, an impurity-doped semiconductor, or a combination thereof. For example, each of the plurality of gate lines 130 may include metal such as tungsten, nickel, cobalt, or tantalum, metal silicide such as tungsten silicide, nickel silicide, cobalt silicide, or tantalum silicide, doped polysilicon, or a combination thereof.

An insulation layer 132 may be disposed between the second conductive plate 118 and the plurality of gate lines 130, and between two adjacent gate lines 130 of the plurality of gate lines 130. An uppermost gate line 130 of the plurality of gate lines 130 may be covered by the insulation layer 132. The insulation layer 132 may include silicon oxide.

In the memory cell region MEC and the connection region CON, the plurality of word line cut structures WLC may extend long in a first horizontal direction (an X direction) on the upper substrate 110. A width of each of the plurality of gate lines 130 included in the memory cell blocks BLK11 and BLK12 in a second horizontal direction (a Y direction) may be limited by the plurality of word line cut structures WLC.

The plurality of word line cut structures WLC may each include an insulation structure. In embodiments, the insulation structure may include silicon oxide, silicon nitride, silicon oxynitride, or a low-k dielectric material. For example, the insulation structure may include a silicon oxide layer, a silicon nitride layer, a SiON layer, a SiOCN layer, a SiCN layer, or a combination thereof. In other embodiments, at least a portion of the insulation structure may include an air gap. Herein, the term "air" may denote other gases which are in air or in a manufacturing process.

A plurality of gate lines 130 configuring one gate stack GS may be stacked on the second conductive plate 118 to overlap in the vertical direction (the Z direction), between two adjacent word line cut structures WLC. The plurality of gate lines 130 configuring one gate stack GS may include the ground selection line GSL, the plurality of word lines WL, and the string selection line SSL each described above with reference to FIG. 3.

Referring to FIG. 7, two upper gate lines 130 of the plurality of gate lines 130 may be spaced apart from each other in the second horizontal direction (the Y direction), with a string selection line cut structure SSLC therebetween. The two upper gate lines 130, which are spaced apart from each other with the string selection line cut structure SSLC therebetween, may configure the string selection line SSL described above with reference to FIG. 3. In FIG. 7, an example where one string selection line cut structure SSLC is formed in one gate stack GS is illustrated, but at least two string selection line cut structures SSLC may be formed in one gate stack GS. The string selection line cut structure SSLC may be filled with an insulation layer. In embodiments, the string selection line cut structure SSLC may include an insulation layer which includes oxide, nitride, or a combination thereof. In embodiments, at least a portion of the string selection line cut structure SSLC may include an air gap.

Referring to FIGS. 5 and 7, a plurality of channel structures 180 may pass through the plurality of gate lines 130, a plurality of insulation layers 132, the second conductive plate 118, and the first conductive plate 114, and may extend in the vertical direction (the Z direction), on an upper substrate 110 in the memory cell region MEC. The plurality of channel structures 140 may be arranged apart from one another by a certain interval in the first horizontal direction (the X direction) and the second horizontal direction (the Y direction). The plurality of channel structures 140 may each include a gate dielectric layer 142, a channel region 144, a buried insulation layer 146, and a drain region 148.

Referring to FIG. 10, the gate dielectric layer 142 may include a tunneling dielectric layer TD, a charge storage layer CS, and a blocking dielectric layer BD, which are formed sequentially from the channel region 144. A relative thickness of each of the tunneling dielectric layer TD, the charge storage layer CS, and the blocking dielectric layer BD may be variously modified.

The tunneling dielectric layer TD may include silicon oxide, hafnium oxide, aluminum oxide, zirconium oxide, or tantalum oxide. The charge storage layer CS may be a region which stores electrons passing through the tunneling dielectric layer TD from the channel region 144, and may include silicon nitride, boron nitride, silicon boron nitride, or impurity-doped polysilicon. The blocking dielectric layer BD may include metal oxide which is greater in dielectric constant than silicon oxide, silicon nitride, or silicon oxynitride. The metal oxide may include hafnium oxide, aluminum oxide, zirconium oxide, tantalum oxide, or a combination thereof.

Referring to FIG. 10, the first conductive plate 114 may pass through a partial region of the gate dielectric layer 142 in a horizontal direction (the X direction and/or the Y direction), and may contact the channel region 144. A thickness (a size in the Z-direction) of a portion, vertically overlapping the gate dielectric layer 142, of the first conductive plate 114 may be greater than a thickness (a size in the Z-direction) of a portion, vertically overlapping the second conductive plate 118, of the first conductive plate 114. The gate dielectric layer 142 may include a portion covering a sidewall of the channel region 144 at a level which is higher than the first conductive plate 114, and a portion covering a bottom surface of the channel region 144 at a level which is lower than the first conductive plate 114. The channel region 144 may be spaced apart from the upper substrate 110, with a lowermost portion of the gate dielectric layer 142 between the channel region 144 and the upper substrate 110. A sidewall of the channel region 144 may contact the first conductive plate 114, and may be electrically connected to the first conductive plate 114.

Referring to FIGS. 7 and 10, the channel region 144 may have a cylinder shape. The channel region 144 may include doped polysilicon or undoped polysilicon.

The buried insulation layer 146 may fill an inner space of the channel region 144. The buried insulation layer 146 may include an insulating material. For example, the buried insulation layer 146 may include silicon oxide, silicon nitride, silicon oxynitride, or a combination thereof. In some embodiments, the buried insulation layer 146 may be omitted, in which case the channel region 144 may have a pillar structure which is not hollow.

The drain region 148 may include doped polysilicon. A plurality of drain regions 148 may be insulated from one another by a first upper insulation layer 147. In the memory cell region MEC, the plurality of channel structures 140 and a first upper insulation layer UL1 may be covered by a second upper insulation layer UL2.

The string selection line cut structure SSLC may pass through the first upper insulation layer UL1 and the second upper insulation layer UL2 in the vertical direction (the Z direction). A top surface of the string selection line cut structure SSLC, a top surface of the word line cut structure WLC, and a top surface of the second upper insulation layer UL2 may extend at approximately the same vertical level. A third upper insulation layer UL3, a fourth upper insulation layer UL4, and a fifth upper insulation layer UL5 may be formed sequentially on the string selection line cut structure SSLC, the word line cut structure WLC, and the second upper insulation layer UL2. The first upper insulation layer UL1, the second upper insulation layer UL2, the third upper insulation layer UL3, the fourth upper insulation layer UL4, and the fifth upper insulation layer UL5 may each include oxide, nitride, or a combination thereof.

Referring to FIGS. 5 and 7, in the memory cell region MEC of the memory stack structure MST, a plurality of bit lines BL may be disposed on the fifth upper insulation layer UL5. The plurality of bit lines BL may extend in parallel in the second horizontal direction (the Y direction). Each of the plurality of channel structures 140 may be connected to the plurality of bit lines BL by a plurality of contact plugs 176 which pass through the second upper insulation layer UL2, the third upper insulation layer UL3, the fourth upper insulation layer UL4, and the fifth upper insulation layer UL5.

Referring to FIG. 6, in the connection region CON of the memory stack structure MST, the insulation plate 112 and the second conductive plate 118 may be sequentially stacked on the upper substrate 110. The insulation plate 112 may include an insulation layer having a multi-layer structure including a first insulation layer 112A, a second insulation layer 112B, and a third insulation layer 112C which are sequentially stacked on the upper substrate 110. In embodiments, the first insulation layer 112A and the third insulation layer 112C may include silicon oxide, and the second insulation layer 112B may include silicon nitride.

In the connection region CON, each of the plurality of gate lines 130 may include a gate pad portion 130A which is greater in thickness than another portion of the gate line 130 in the vertical direction (the Z direction). The gate pad portion 130A of the gate line 130 may be disposed at an edge portion, which is farthest away from the memory cell region MEC, of the gate line 130. In FIG. 6, only the gate pad portion 130A provided in one end portion of each of some gate lines 130 of the plurality of gate lines 130 is illustrated, but in FIG. 6, in a gate line 130 where the gate pad portion 130A is not seen, the gate pad portion 130A may be provided at another portion which is not seen.

In the connection region CON, an edge portion of each of a plurality of gate lines 130 and a plurality of insulation layers 132 may be covered by an interlayer insulation layer 138. The interlayer insulation layer 138 may include silicon oxide.

Referring to FIGS. 5 and 6, a plurality of memory cell contacts MCC may be disposed in the connection region CON. Each of the plurality of memory cell contacts MCC may pass through at least a portion of the interlayer insulation layer 138, the plurality of gate lines 130, and the plurality of insulation layers 132. Each of the plurality of memory cell contacts MCC may be disposed in a first hole H1 which passes through at least one gate line 130 of the plurality of gate lines 130. Each of the plurality of memory cell contacts MCC may pass through at least one gate line 130, at least one insulation layer 132, the second conductive plate 118, the insulation plate 112, and the upper substrate 110, and may extend to the peripheral circuit structure PCS in the vertical direction (the Z direction).

Each of the plurality of memory cell contacts MCC may be connected to one gate line 130 selected from among the plurality of gate lines 130, and may not be connected to the other gate line 130 except the selected one gate line 130. Each of the plurality of memory cell contacts MCC may contact the gate pad portion 130A of one gate line 130 selected from among the plurality of gate lines 130 and may be connected to the selected one gate line 130 through the gate pad portion 130A. Each of the memory cell contacts MCC may be spaced apart from the other gate lines 130 except the selected one gate line 130 in a horizontal direction, in the first hole H1. A respective first insulation ring 152A may be disposed between the memory cell contact MCC and the gate lines 130 which are not connected to the memory cell contact MCC. In embodiments, the first insulation ring 152A may include silicon oxide.

Referring to FIGS. 5 and 6, a plurality of dummy channel structures D140 may be disposed in the connection region CON. Each of the plurality of dummy channel structures D140 may pass through at least a portion of each of the interlayer insulation layer 138, the plurality of gate lines 130, and the plurality of insulation layers 132. Each of the plurality of dummy channel structures D140 may be disposed in a second hole H2 which passes through at least one gate line 130 of the plurality of gate lines 130. Each of the plurality of dummy channel structures D140 may pass through at least one gate line 130, at least one insulation layer 132, the second conductive plate 118, the insulation plate 112, and the upper substrate 110, and may extend to the peripheral circuit structure PCS in the vertical direction (the Z direction).

The plurality of dummy channel structures D140 may be arranged apart from one another by a certain interval in the first horizontal direction (the X direction) and the second horizontal direction (the Y direction). Similar to the channel structure 140, each of the plurality of dummy channel structures D140 may include a gate dielectric layer 142, a channel region 144, a buried insulation layer 146, and a drain region 148. A plane size of each of the plurality of dummy channel structures D140 may be greater than that of the channel structure 140. Referring to FIG. 5, the number and arrangement form of the plurality of dummy channel structures D140 are merely an example. In the connection region CON, the plurality of dummy channel structures D140 may be variously arranged at various positions selected in the memory stack structure MST.

In the connection region CON, the interlayer insulation layer 138 may be covered by the first upper insulation layer UL1. The drain region 148 of each of the plurality of dummy channel structures D140 may be insulated from an adjacent drain region 148 by the first upper insulation layer UL1. In the connection region CON, the plurality of dummy channel structures D140 and the first upper insulation layer UL1 may be covered by the second upper insulation layer UL2.

Referring to FIGS. 5 and 6, a plurality of through via electrodes THV may be disposed in the connection region CON. Each of the plurality of through via electrodes THV may pass through at least a portion of each of the interlayer insulation layer 138, the plurality of gate lines 130, and the plurality of insulation layers 132. Each of the plurality of through via electrodes THV may be disposed in a third hole H3 which passes through at least one gate line 130 of the plurality of gate lines 130. Each of the plurality of through via electrodes THV may pass through at least one gate line 130, at least one insulation layer 132, the second conductive plate 118, the insulation plate 112, and the upper substrate 110, and may extend to the peripheral circuit structure PCS in the vertical direction (the Z direction). Each of the plurality of through via electrodes THV may not be connected to any one of the plurality of gate lines 130, in the third hole H3. A second insulation ring 152B may be disposed between the gate line 130 and the through via electrode THV, in the third hole H3. In embodiments, the second insulation ring 152B may include silicon oxide. The plurality of through via electrodes THV may be configured to be connected to a peripheral circuit included in the peripheral circuit structure PCS.

Referring to FIGS. 5 and 6, a conductive plate contact 164 may be disposed in the connection region CON. The conductive plate contact 164 may pass through the third upper insulation layer UL3, the second upper insulation layer UL2, the first upper insulation layer UL1, the interlayer insulation layer 138, the second conductive plate 118, and the insulation plate 112, and may extend to the upper substrate 110 in the vertical direction (the Z direction). A sidewall of the conductive plate contact 164 may be covered by an insulation spacer 162. The fourth upper insulation layer UL4 may be covered by a top surface of each of the conductive plate contact 164 and the insulation spacer 162.

The plurality of memory cell contacts MCC and the plurality of through via electrodes THV may pass through the second upper insulation layer UL2, the third upper insulation layer UL3, and the fourth upper insulation layer UL4. A top surface of each of the plurality of memory cell contacts MCC may be covered by the fifth upper insulation layer UL5 and a sixth upper insulation layer UL6. Each of the plurality of through via electrodes THV may be connected to one of a plurality of upper wiring layers UML through a corresponding contact plug 174 from among a plurality of contact plugs 174 passing through the fifth upper insulation layer UL5.

The conductive plate contact 164 may be connected to one upper wiring layer UML of the plurality of upper wiring layers UML through a contact plug 172 passing through the fourth upper insulation layer UL4 and the fifth upper insulation layer UL5.

The plurality of upper wiring layers UML may be disposed at the same vertical level as the plurality of bit lines BL disposed in the memory cell region MEC. The sixth upper insulation layer UL6 may be filled between each of the plurality of upper wiring layers UML and a corresponding bit line BL of the plurality of bit lines BL. The sixth upper insulation layer UL6 may include oxide, nitride, or a combination thereof.

The plurality of memory cell contacts MCC, the plurality of through via electrodes THV, the conductive plate contacts 164, the plurality of contact plugs 172 and 174, and the plurality of upper wiring layers UML may each include tungsten, titanium, tantalum, copper, aluminum, titanium nitride, tantalum nitride, tungsten nitride, or a combination thereof.

Referring to FIGS. 6 and 7, the peripheral circuit structure PCS may include a lower substrate 52, a plurality of peripheral circuits formed on the lower substrate 52, and a multilayer wiring structure MWS which connects the plurality of peripheral circuits or connects the plurality of peripheral circuits to elements in the memory cell region MEC.

The lower substrate 52 may include a semiconductor substrate. For example, the lower substrate 52 may include silicon (Si), germanium (Ge), or SiGe. An active region AC may be defined in the lower substrate 52 by an isolation layer 54. A plurality of transistors TR configuring the plurality of peripheral circuits may be formed on the active region AC. Each of the plurality of transistors TR may include a gate PG and a plurality of ion implantation regions PSD which are formed in the active region AC at both sides of the gate PG. Each of the plurality of ion implantation regions PSD may configure a source region or a drain region of a corresponding transistor TR.

The plurality of peripheral circuits included in the peripheral circuit structure PCS may include various circuits included in the peripheral circuit 30 described above with reference to FIG. 1. In embodiments, the plurality of peripheral circuits included in the peripheral circuit structure PCS may each include the row decoder 32, the page buffer 34, the data I/O circuit 36, the control logic 38, and the common source line driver 39 each illustrated in FIG. 1.

The multilayer wiring structure MWS included in the peripheral circuit structure PCS may include a plurality of peripheral circuit wiring layers ML60, ML61, and ML62, and a plurality of peripheral circuit contacts MC60, MC61, and MC62. At least some of the plurality of peripheral circuit wiring layers ML60, ML61, and ML62 may be configured to be electrically connected to a transistor TR. The plurality of peripheral circuit contacts MC60, MC61, and MC62 may be configured to connect some transistors TR, selected from among a plurality of transistors TR, to some peripheral circuit wiring layers selected from among the plurality of peripheral circuit wiring layers ML60, ML61, and ML62.

The upper substrate 110, the insulation plate 112, the first conductive plate 114, and the second conductive plate 118 may extend in a horizontal direction to cover the peripheral circuit structure PCS.

Referring to FIG. 6, a plurality of through openings 120H passing through the upper substrate 110, the insulation plate 112, and the second conductive plate 118 may be formed in a partial region of the connection region CON. Each of the plurality of through openings 120H may be filled with the insulation plug 120. The plurality of through openings 120H may be disposed to overlap a partial region of the peripheral circuit structure PCS in the vertical direction (the Z direction). The insulation plug 120 may include silicon oxide, silicon nitride, or a combination thereof.

In the connection region CON, each of the plurality of memory cell contacts MCC may extend to the peripheral circuit structure PCS through the through opening 120H, and may be configured to be electrically connected to one peripheral circuit wiring layer selected from among the plurality of peripheral circuit wiring layers ML60, ML61, and ML62. For example, each of the plurality of memory cell contacts MCC may be configured to be electrically connected to an uppermost peripheral circuit wiring layer ML62 closest to the cell array structure CAS among the plurality of peripheral circuit wiring layers ML60, ML61, and ML62.

In the connection region CON, each of the plurality of dummy channel structures D140 may extend to the peripheral circuit structure PCS through the through opening 120H.

In the connection region CON, each of the plurality of through via electrodes THV may extend to the peripheral circuit structure PCS through the through opening 120H, and may be configured to be electrically connected to one peripheral circuit wiring layer selected from among the plurality of peripheral circuit wiring layers ML60, ML61, and ML62. For example, each of the plurality of memory cell contacts MCC may be configured to be electrically connected to the uppermost peripheral circuit wiring layer ML62 closest to the cell array structure CAS among the plurality of peripheral circuit wiring layers ML60, ML61, and ML62.

In embodiments, the plurality of memory cell contacts MCC and the plurality of dummy channel structures D140 may pass through one through opening 120H. The through opening 120H, through which the plurality of memory cell contacts MCC and the plurality of dummy channel structures D140 pass, may be apart from a through opening 120H through which the plurality of through via electrodes THV pass.

Each of the plurality of memory cell contacts MCC and the plurality of through via electrodes THV may be configured to be connected to at least one peripheral circuit, selected from among a plurality of peripheral circuits, through the multilayer wiring structure MWS included in the peripheral circuit structure PCS. The plurality of dummy channel structures D140 may extend to the peripheral circuit structure PCS through the through opening 120H, and may be configured to be electrically connected to one peripheral circuit wiring layer selected from among the plurality of peripheral circuit wiring layers ML60, ML61, and ML62, but may not be connected to a peripheral circuit included in the peripheral circuit structure PCS.

In FIGS. 6 and 7, the multilayer wiring structure MWS is illustrated as including a three-layer wiring layer in the vertical direction (the Z direction), but the multilayer wiring structure MWS may include a two-layer or four or more-layer wiring layer.

The plurality of peripheral circuit wiring layers ML60, ML61, and ML62 and the plurality of peripheral circuit contacts MC60, MC61, and MC62 may each include metal, conductive metal nitride, metal silicide, or a combination thereof. For example, the plurality of peripheral circuit wiring layers ML60, ML61, and ML62 and the plurality of peripheral circuit contacts MC60, MC61, and MC62 may each include a conductive material such as tungsten, molybdenum, titanium, cobalt, tantalum, nickel, tungsten silicide, titanium silicide, cobalt silicide, tantalum silicide, or nickel silicide.

The plurality of transistors TR and the multilayer wiring structure MWS, included in the peripheral circuit structure PCS, may be covered by an interlayer insulation layer 70. The plurality of through via electrodes THV may pass through a portion of the interlayer insulation layer 70, and may contact a top surface of the peripheral circuit wiring layer ML62. The interlayer insulation layer 70 may include silicon oxide, SiON, or SiOCN.

Referring to FIG. 6, in the connection region CON, a plurality of conductive landing vias 72, spaced apart from one another, may be disposed in a horizontal direction. The plurality of conductive landing vias 72 may be disposed at a position overlapping the through opening 120H in the vertical direction (the Z direction) at a level which is higher than the multilayer wiring structure MWS and lower than the upper substrate 110 in the vertical direction (the Z direction).

The plurality of conductive landing vias 72 may be disposed between the memory cell contact MCC and the peripheral circuit wiring layer ML62, and between the dummy channel structure D140 and the peripheral circuit wiring layer ML62. Some of the plurality of conductive landing vias 72 may include a top surface contacting the memory cell contact MCC and a bottom surface contacting the peripheral circuit wiring layer ML62. Some other conductive landing vias 72 of the plurality of conductive landing vias 72 may include a top surface contacting at least one dummy channel structure D140 of the plurality of dummy channel structures D140.

Referring to FIGS. 6 and 8, the plurality of conductive landing vias 72 may include a plurality of first conductive landing vias 72A, each including a top surface contacting one memory cell contact MCC and a bottom surface contacting one peripheral circuit wiring layer ML62, and a plurality of second conductive landing vias 72B which each include a top surface contacting a bottom surface of one dummy channel structure D140 and a bottom surface contacting one peripheral circuit wiring layer ML62.

Each of the plurality of first conductive landing vias 72A may be configured to be connected to, through the peripheral circuit wiring layer ML62, at least one circuit of a plurality of circuits included in the peripheral circuit structure PCS. Each of the second conductive landing via 72B and the peripheral circuit wiring layer ML62, contacting the second conductive landing via 72B, may not be connected to the other conductive region or the other circuit, and may be floated or grounded.

Referring to FIG. 6, the plurality of through via electrodes THV may not pass through the conductive landing via 72, and may be directly connected to the peripheral circuit wiring layer ML62.

The plurality of conductive landing vias 72 may include a material which differs from that of each of the plurality of peripheral circuit wiring layers ML60, ML61, and ML62 included in the peripheral circuit structure PCS. In embodiments, the plurality of conductive landing vias 72 may not include metal. In embodiments, the plurality of conductive landing vias 72 may include a doped semiconductor material or an undoped semiconductor material. For example, the plurality of conductive landing vias 72 may include doped polysilicon or undoped polysilicon.

In FIGS. 5 and 8, a configuration is illustrated where a portion of each of the plurality of memory cell contacts MCC, the plurality of dummy channel structures D140, and the plurality of through via electrodes THV is disposed in one row along a rectilinear line in the second horizontal direction (the Y direction), but a plane arrangement structure of each of the plurality of memory cell contacts MCC, the plurality of dummy channel structures D140, and the plurality of through via electrodes THV may be variously implemented.

Referring to FIGS. 5 and 6, the peripheral circuit structure PCS may include an upper interlayer insulation layer 76 disposed on the interlayer insulation layer 70. The upper interlayer insulation layer 76 may cover a top surface of the interlayer insulation layer 70 and a top surface of each of the plurality of conductive landing vias 72. The upper interlayer insulation layer 76 may include silicon oxide, SiON, SiOCN, or the like.

Each of the plurality of memory cell contacts MCC, the plurality of dummy channel structures D140, and the plurality of through via electrodes THV may pass through the insulation plug 120 and the upper interlayer insulation layer 76 in the vertical direction (the Z direction).

In the semiconductor device 100 described above with reference to FIGS. 4 to 10, despite an increase in the number of stacks of the gate lines 130 configuring the memory stack structure MST in the vertical direction (the Z direction) so as to enhance the degree of integration of the semiconductor device 100, an electrical connection structure having reliability may be provided between a peripheral circuit included in the peripheral circuit structure PCS and the plurality of memory cell contacts MCC which pass through at least one gate line 130 and extend to the peripheral circuit structure PCS from the connection region CON of the cell array structure CAS. Also, the plurality of memory cell contacts MCC and the plurality of dummy channel structures D140 may be configured to pass through one through opening 120H, and thus, a manufacturing process may be easily performed on the semiconductor device 100, and the manufacturing cost may be reduced.

Figure 11:
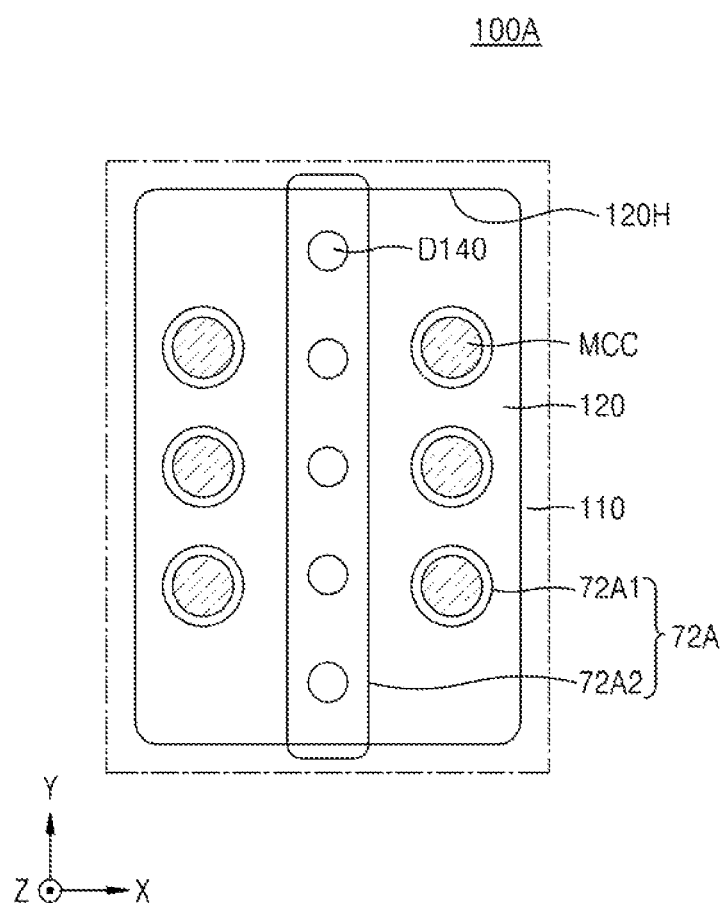
FIG. 11 is a schematic plan view for describing a semiconductor device according to another embodiment.

FIG. 11 is a schematic plan view for describing a semiconductor device 100A according to other embodiments. In FIG. 11, some elements of a region corresponding to a region EX1 of FIG. 5 are illustrated.

Referring to FIG. 11, the semiconductor device 100A may include substantially the same elements as those of the semiconductor device 100 described above with reference to FIGS. 4 to 10. The semiconductor device 100A may include a plurality of conductive landing vias 72A instead of the plurality of conductive landing vias 72 illustrated in FIGS. 5, 6, 8, and 9.

The plurality of conductive landing vias 72A may include substantially the same elements as those of the plurality of conductive landing vias 72 described above with reference to FIGS. 5, 6, 8, and 9. The plurality of conductive landing vias 72A may include a plurality of conductive landing vias 72A1 contacting a memory cell contact MCC and a plurality of conductive landing vias 72A2 contacting a plurality of dummy channel structures D140.

The plurality of conductive landing vias 72A2 may extend long in a second horizontal direction (a Y direction) and may overlap the plurality of dummy channel structures D140 in a vertical direction (a Z direction). The plurality of conductive landing vias 72A2 may each include a top surface contacting the plurality of dummy channel structures D140. The plurality of conductive landing vias 72A2 may be configured to be floated or grounded.

Figure 12:
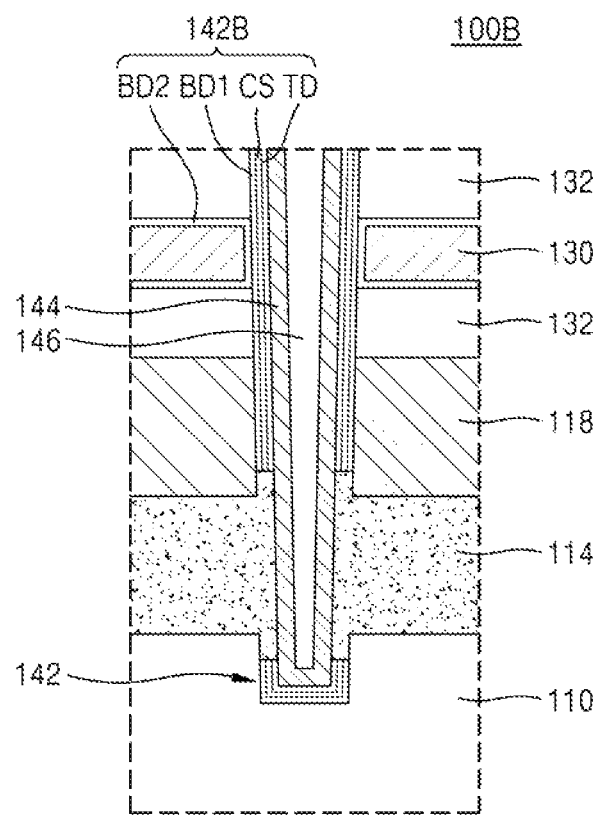
FIG. 12 is a cross-sectional view for describing a semiconductor device according to another embodiment.

FIG. 12 is a diagram for describing a semiconductor device 100B according to other embodiments. In FIG. 12, an enlarged cross-sectional surface of a region corresponding to a region EX3 of FIG. 7 is illustrated.

Referring to FIG. 12, the semiconductor device 100B may include substantially the same elements as those of the semiconductor device 100 described above with reference to FIGS. 4 to 10. However, the semiconductor device 100B may include a gate dielectric layer 142B instead of the gate dielectric layer 142. The gate dielectric layer 142B may include substantially the same elements as those of the gate dielectric layer 142 described above with reference to FIGS. 7 and 10, except the gate dielectric layer 142B may include a first blocking dielectric layer BD1 and a second blocking dielectric layer BD2, instead of the blocking dielectric layer BD. The first blocking dielectric layer BD1 may extend in parallel with the channel region 144, and the second blocking dielectric layer BD2 may be disposed to surround the gate line 130. Each of the first blocking dielectric layer BD1 and the second blocking dielectric layer BD2 may include silicon oxide, silicon nitride, or metal nitride. For example, the first blocking dielectric layer BD1 may include silicon oxide, and the second blocking dielectric layer BD2 may include metal oxide, which is greater in permittivity than silicon oxide. The metal oxide may include hafnium oxide, aluminum oxide, zirconium oxide, tantalum oxide, or a combination thereof.

Figure 13:
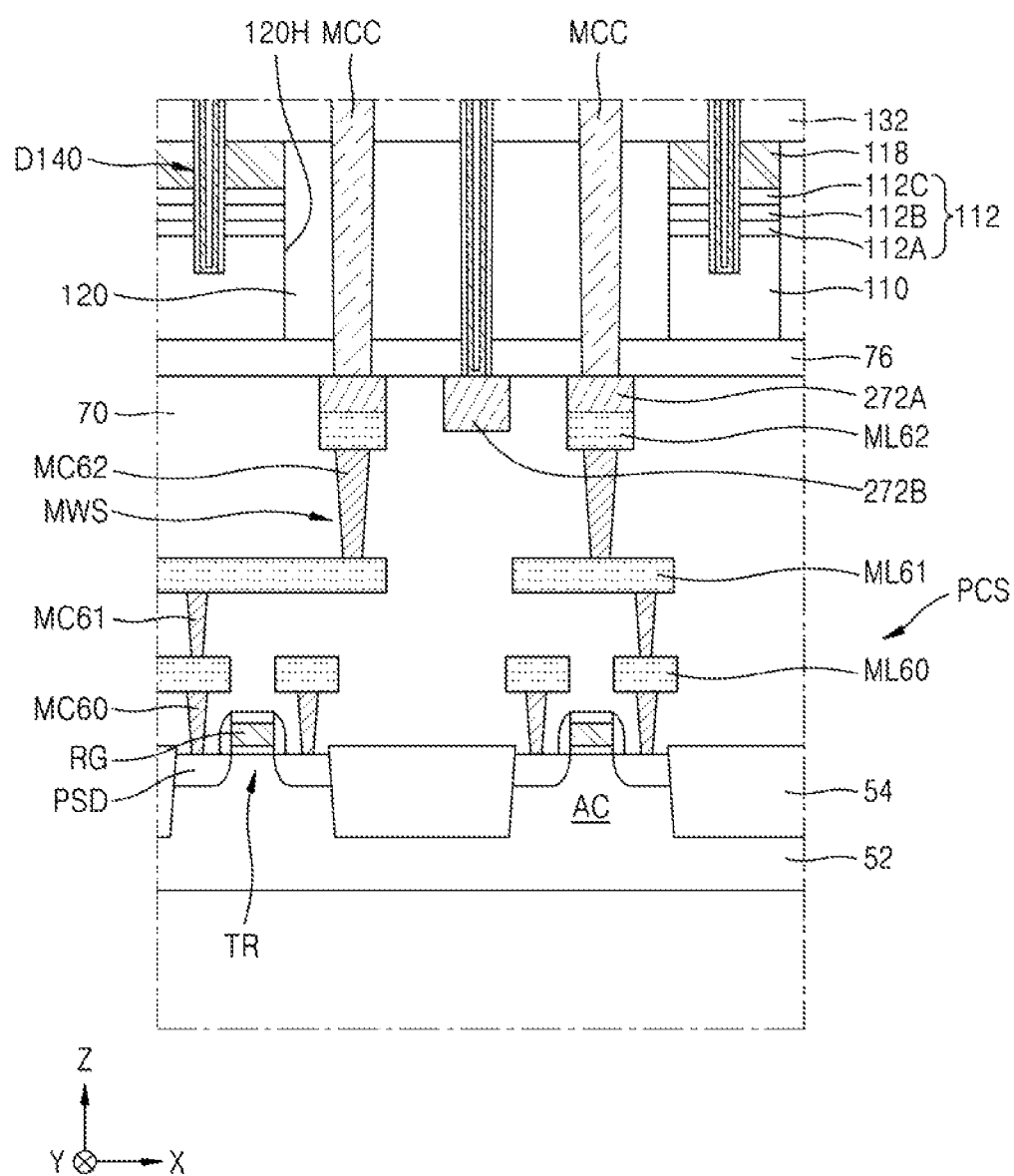
FIG. 13 is a cross-sectional view for describing a semiconductor device according to another embodiment.

FIG. 13 is a diagram for describing a semiconductor device 200 according to another embodiment, and is an enlarged cross-sectional view of a region corresponding to a region EX2 of FIG. 6.

Referring to FIG. 13, the semiconductor device 200 may include substantially the same elements as those of the semiconductor device 100 described above with reference to FIGS. 4 to 10, except the semiconductor device 200 may include a first conductive landing via 272A and a second conductive landing via 272B, instead of the plurality of conductive landing vias 72.

The first conductive landing via 272A and the second conductive landing via 272B may include substantially the same elements as those of the plurality of conductive landing vias 72 described above with reference to FIGS. 5, 6, 8, and 9. The first conductive landing via 272A may include a top surface, contacting a bottom surface of a memory cell contact MCC extending to a peripheral circuit structure PCS through a through opening 120H, and a bottom surface contacting a peripheral circuit wiring layer ML62. The second conductive landing via 272B may include a top surface which contacts a bottom surface of at least one dummy channel structure D140 of a plurality of dummy channel structures D140 extending to the peripheral circuit structure PCS through the through opening 120H.

The first conductive landing via 272A may be configured to be connected to, through the peripheral circuit wiring layer ML62, at least one circuit of a plurality of circuits included in the peripheral circuit structure PCS. The second conductive landing via 272B may not be connected to another conductive region or another circuit included in the peripheral circuit structure PCS, and may be floated or grounded.

Figure 14:
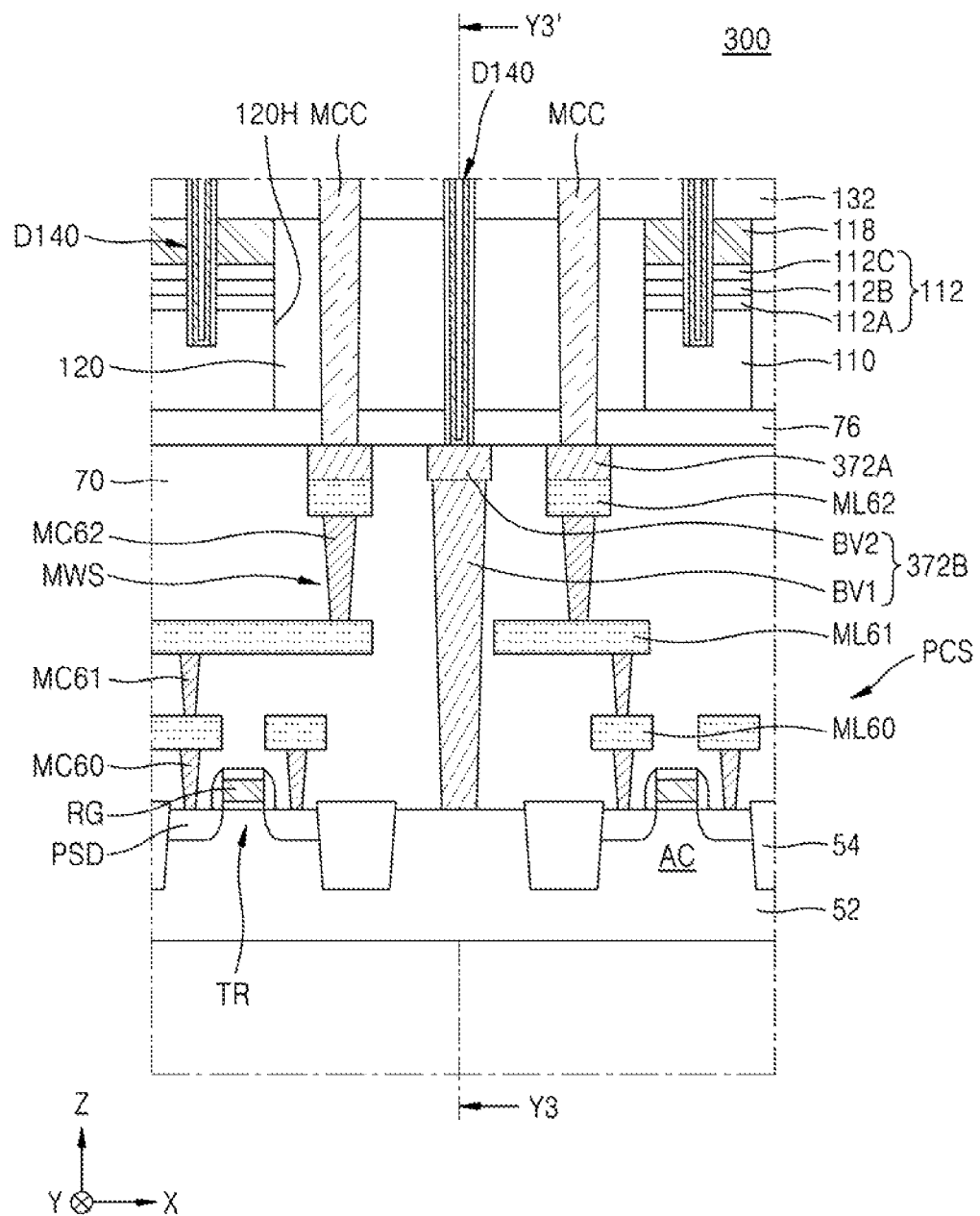
FIGS. 14 and 15 are diagrams for describing a semiconductor device according to another embodiment.
Figure 15:
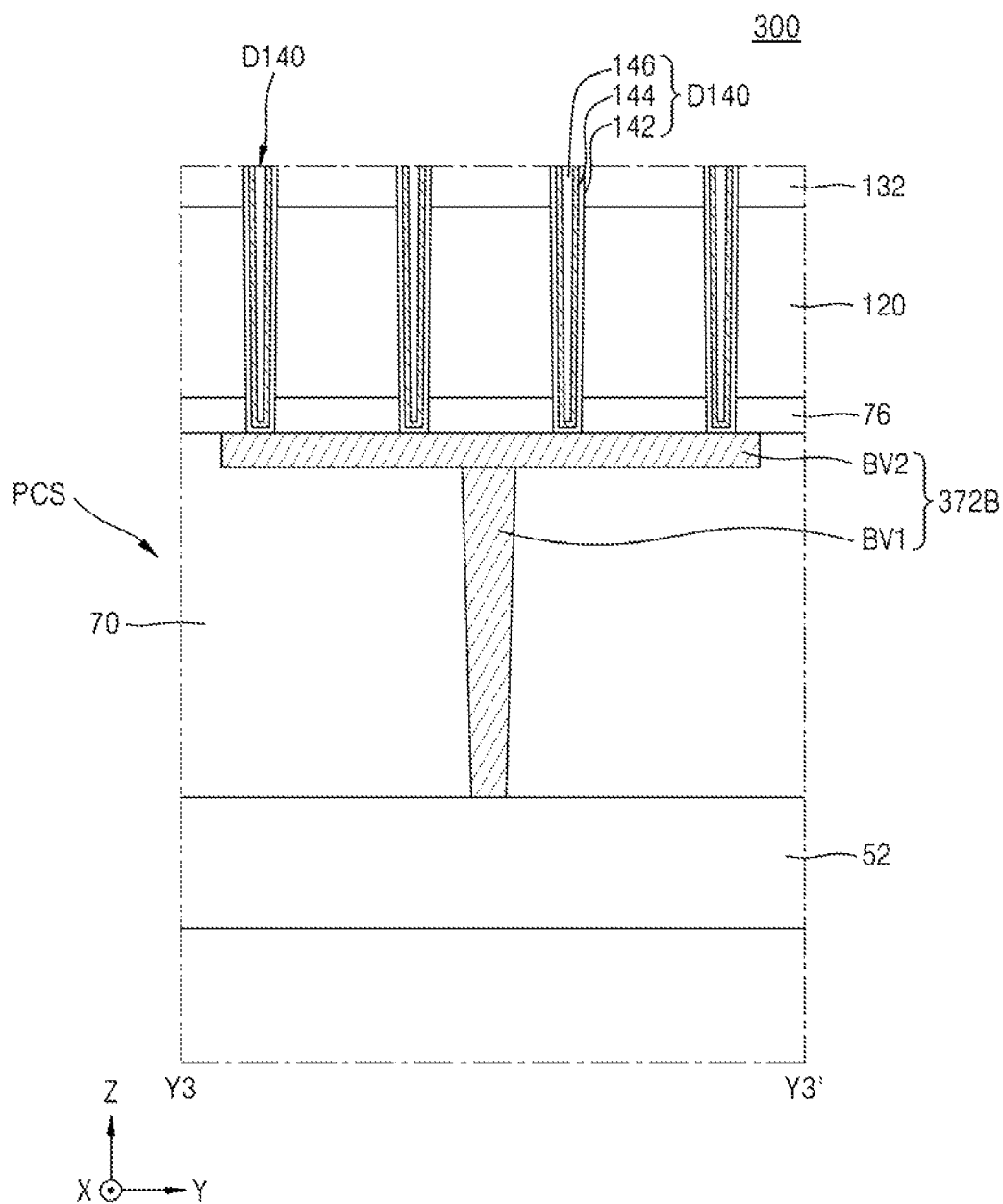

FIGS. 14 and 15 are diagrams for describing a semiconductor device 300 according to another embodiment. In particular, FIG. 14 is a cross-sectional view illustrating an enlarged view of a portion corresponding to the region EX2 in FIG. 6, and FIG. 15 is a cross-sectional view taken along line Y3-Y3' of FIG. 14.

Referring to FIGS. 14 and 15, the semiconductor device 300 may include substantially the same elements as those of the semiconductor device 100 described above with reference to FIGS. 4 to 10, except the semiconductor device 300 may include a first conductive landing via 372A and a second conductive landing via 372B, instead of the plurality of conductive landing vias 72.

The first conductive landing via 372A and the second conductive landing via 372B may include substantially the same elements as those of the plurality of conductive landing vias 72 described above with reference to FIGS. 5, 6, 8, and 9. The first conductive landing via 372A may include a top surface, contacting a bottom surface of a memory cell contact MCC extending to a peripheral circuit structure PCS through a through opening 120H, and a bottom surface contacting a peripheral circuit wiring layer ML62. The second conductive landing via 372B may include a top surface which contacts a bottom surface of each of a plurality of dummy channel structures D140 extending to the peripheral circuit structure PCS through the through opening 120H. The second conductive landing via 372B may include a lower landing via BV1 and an upper landing via BV2, which are connected to each other. The lower landing via BV1 may include a top surface which extends in a vertical direction (a Z direction) toward an upper substrate 110 from a lower substrate 52 and contacts a bottom surface of the upper landing via BV2. The upper landing via BV2 may include a bottom surface, which is disposed at the same vertical level as the first conductive landing via 372A and contacts a top surface of the lower lading via BV1, and a top surface which contacts a plurality of dummy channel structures.

The first conductive landing via 372A may be configured to be connected to, through the peripheral circuit wiring layer ML62, at least one circuit of a plurality of circuits included in the peripheral circuit structure PCS. The second conductive landing via 372B may be configured to be grounded through the lower substrate 52.

Figure 16:
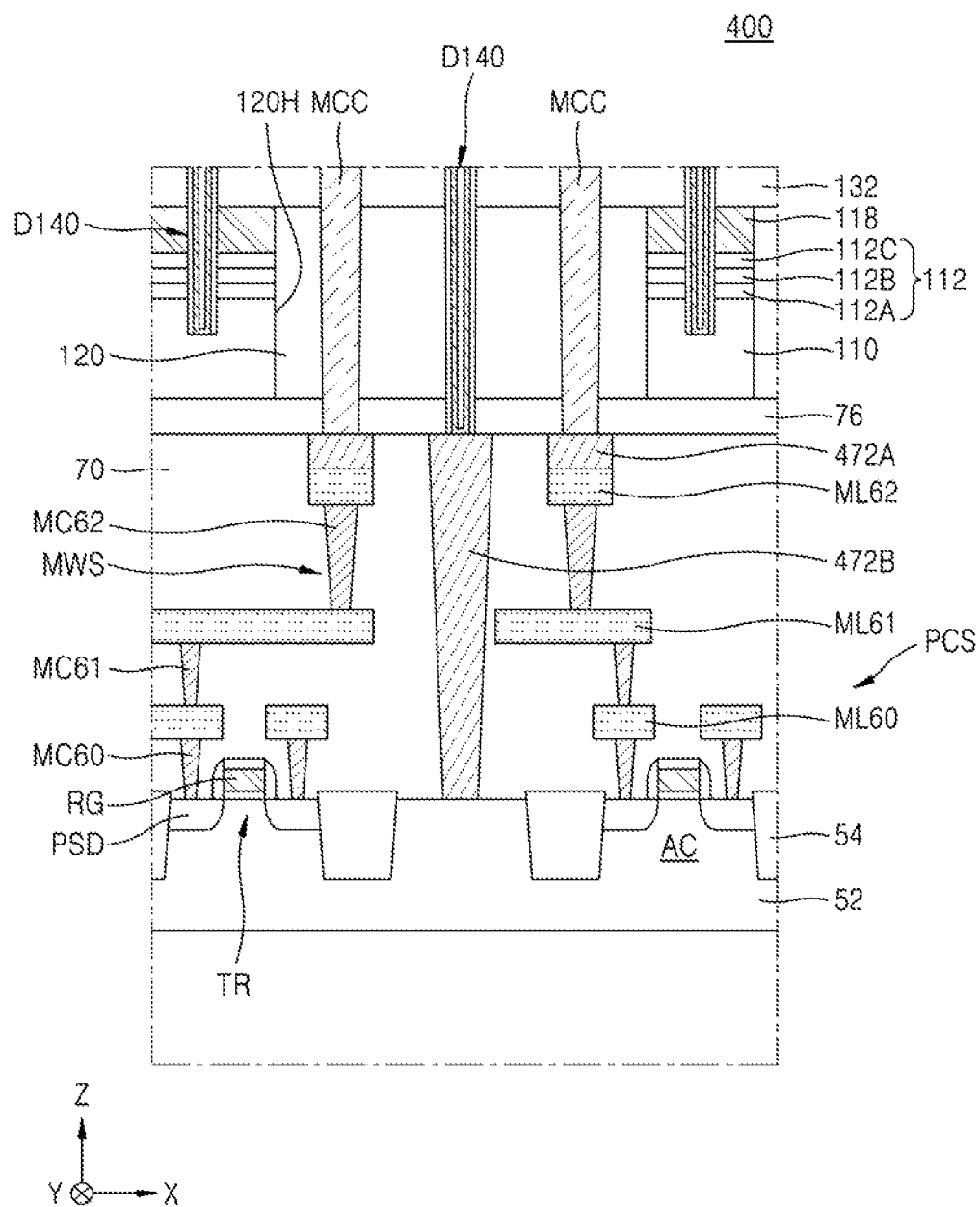
FIG. 16 is a cross-sectional view for describing a semiconductor device according to another embodiment.

FIG. 16 is a cross-sectional view for describing a semiconductor device 400 according to another embodiment. In FIG. 16, an enlarged cross-sectional surface of a region corresponding to a region EX2 of FIG. 6 is illustrated.

Referring to FIG. 16, the semiconductor device 400 may include substantially the same elements as those of the semiconductor device 100 described above with reference to FIGS. 4 to 10, except the semiconductor device 400 may include a first conductive landing via 472A and a second conductive landing via 472B, instead of the plurality of conductive landing vias 72.

The first conductive landing via 472A and the second conductive landing via 472B may include substantially the same elements as those of the plurality of conductive landing vias 72 described above with reference to FIGS. 5, 6, 8, and 9. The first conductive landing via 472A may include a top surface contacting a bottom surface of a memory cell contact MCC extending to a peripheral circuit structure PCS through a through opening 120H, and a bottom surface contacting a peripheral circuit wiring layer ML62. The second conductive landing via 472B may include a top surface which contacts a bottom surface of at least one dummy channel structure D140 extending to the peripheral circuit structure PCS through the through opening 120H, and a bottom surface contacting a lower substrate 52.

The first conductive landing via 472A may be configured to be connected to, through the peripheral circuit wiring layer ML62, at least one circuit of a plurality of circuits included in the peripheral circuit structure PCS. The second conductive landing via 472B may be configured to be grounded through the lower substrate 52.

Figure 17:
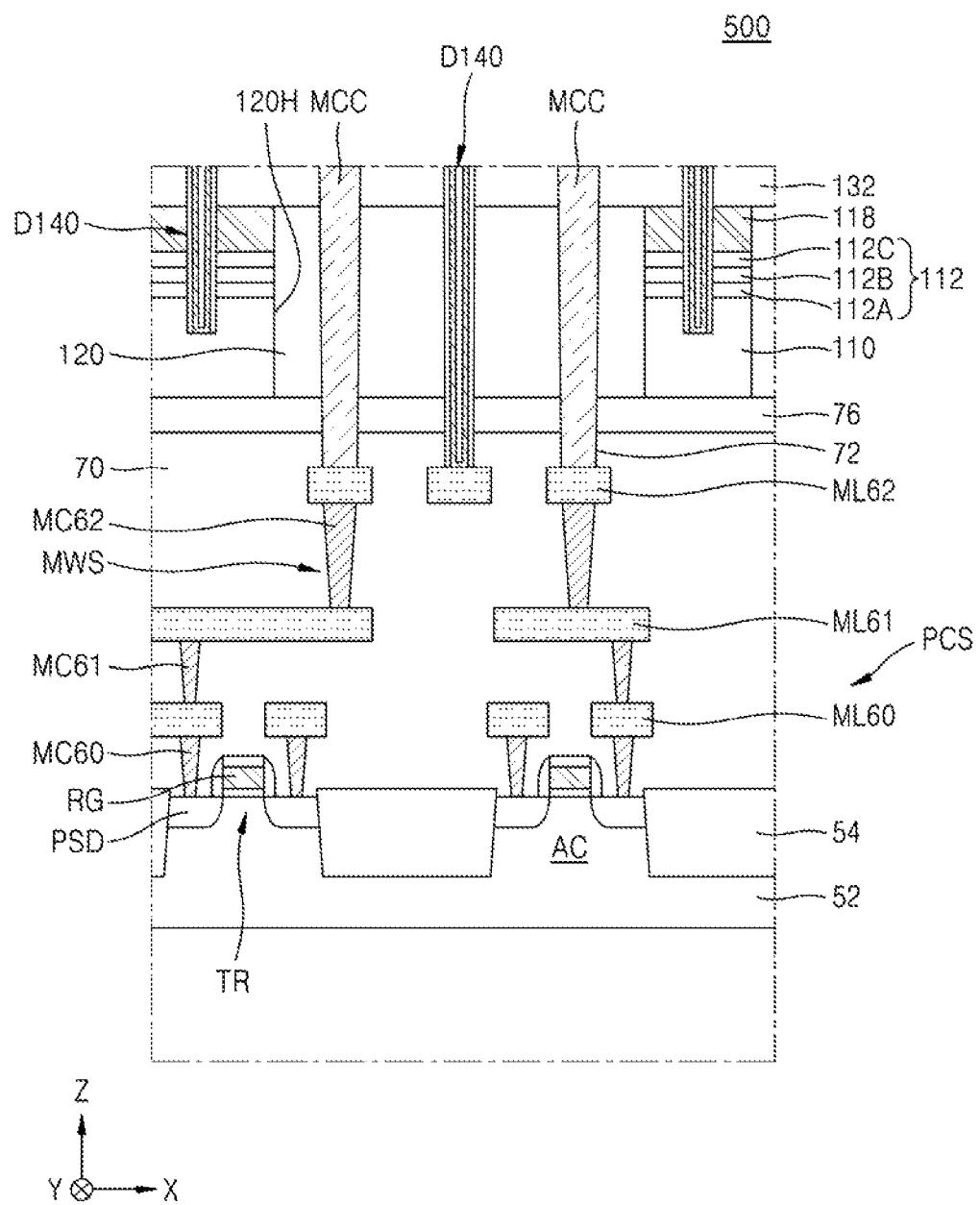
FIG. 17 is a cross-sectional view for describing a semiconductor device according to another embodiment.

FIG. 17 is a cross-sectional view for describing a semiconductor device 500 according to another embodiment. In FIG. 17, an enlarged plane configuration of a region corresponding to a region EX2 of FIG. 6 is illustrated.

Referring to FIG. 17, the semiconductor device 500 may include substantially the same elements as those of the semiconductor device 100 described above with reference to FIGS. 4 to 10, except the semiconductor device 400 may not include the plurality of conductive landing vias 72.

A bottom surface of a memory cell contact MCC, which extends up to a peripheral circuit structure PCS through a through opening 120H, may contact one peripheral circuit wiring layer ML62. A bottom surface of a dummy channel structure D140, which extends up to the peripheral circuit structure PCS through the through opening 120H, may contact one other peripheral circuit wiring layer ML62, and the peripheral circuit wiring layer ML62 contacting the dummy channel structure D140 may be configured to be floated.

Figure 18:
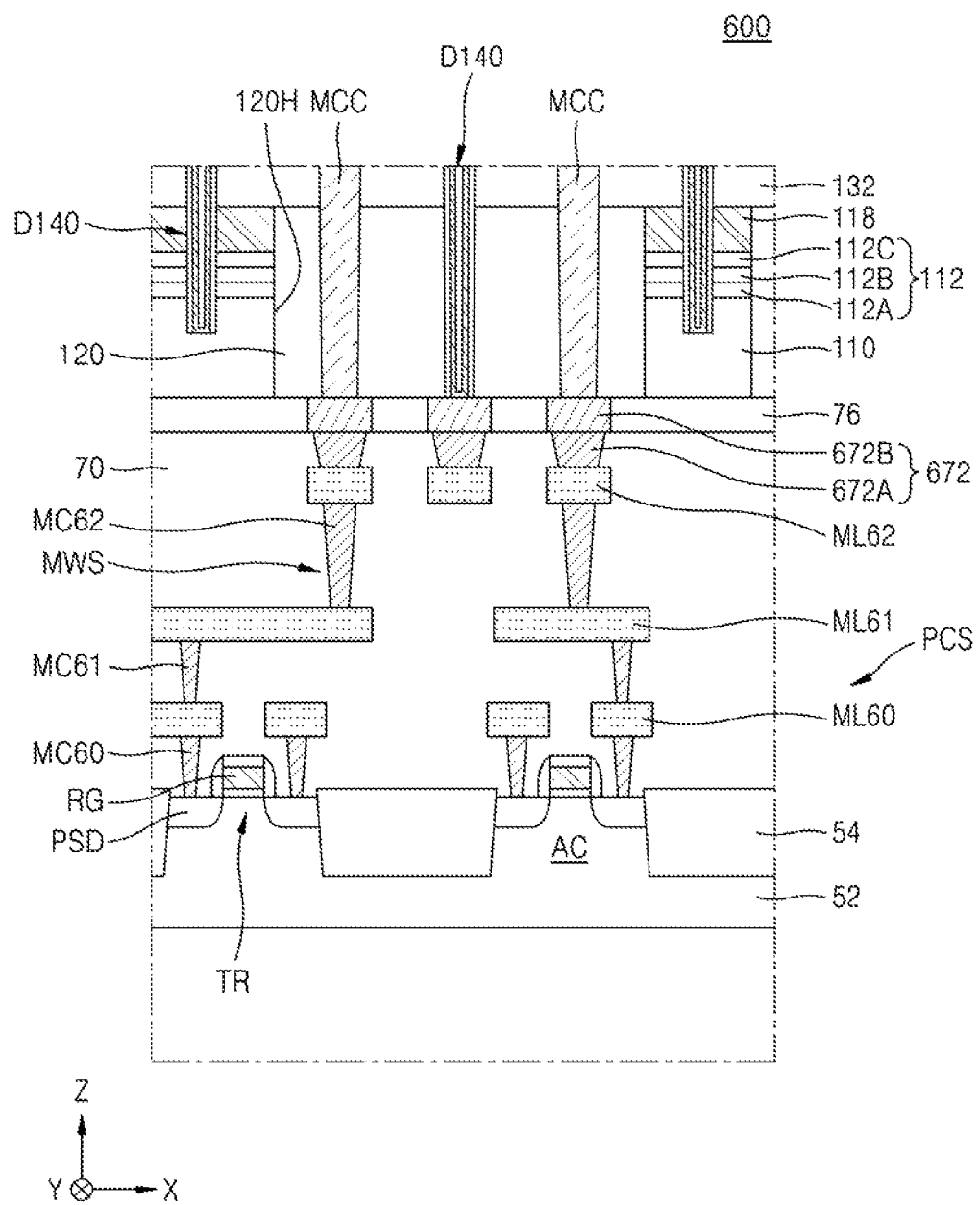
FIG. 18 is a cross-sectional view for describing a semiconductor device according to another embodiment.

FIG. 18 is a cross-sectional view for describing a semiconductor device 600 according to another embodiment. In FIG. 18, an enlarged plane configuration of a region corresponding to a region EX2 of FIG. 6 is illustrated.

Referring to FIG. 18, the semiconductor device 600 may include substantially the same elements as those of the semiconductor device 100 described above with reference to FIGS. 4 to 10, except the semiconductor device 600 may include a plurality of conductive landing vias 672 instead of the plurality of conductive landing vias 72.

The plurality of conductive landing vias 672 may include substantially the same elements as those of the plurality of conductive landing vias 72 described above with reference to FIGS. 5, 6, 8, and 9. The plurality of conductive landing vias 672 may include a lower landing via 672A and an upper landing via 672B, which are connected to each other. The lower landing via 672A may include a bottom surface, which passes through a portion of the interlayer insulation layer 70 and contacts a peripheral circuit wiring layer ML62, and a top surface which contacts a bottom surface of the upper landing via 672B. The upper landing via 672B may pass through the upper interlayer insulation layer 76, and may contact a top surface of the lower landing via 672A.

A bottom surface of a memory cell contact MCC extending to a peripheral circuit structure PCS through a through opening 120H may contact a top surface of one upper landing via 672B selected from among a plurality of upper landing vias 672B. A bottom surface of at least one dummy channel structure D140 extending to the peripheral circuit structure PCS through the through opening 120H may contact a top surface of one other upper landing via 672B selected from among the plurality of upper landing vias 672B.

The memory cell contact MCC extending to the peripheral circuit structure PCS through the through opening 120H may be configured to be connected to one of a plurality of circuits, included in the peripheral circuit structure PCS, through the conductive landing via 672 and the peripheral circuit wiring layer ML62. The lower landing via 672A and the peripheral circuit wiring layer ML62, connected to at least one dummy channel structure D140 extending to the peripheral circuit structure PCS through the through opening 120H, may be configured to be floated or grounded.

Figure 19:
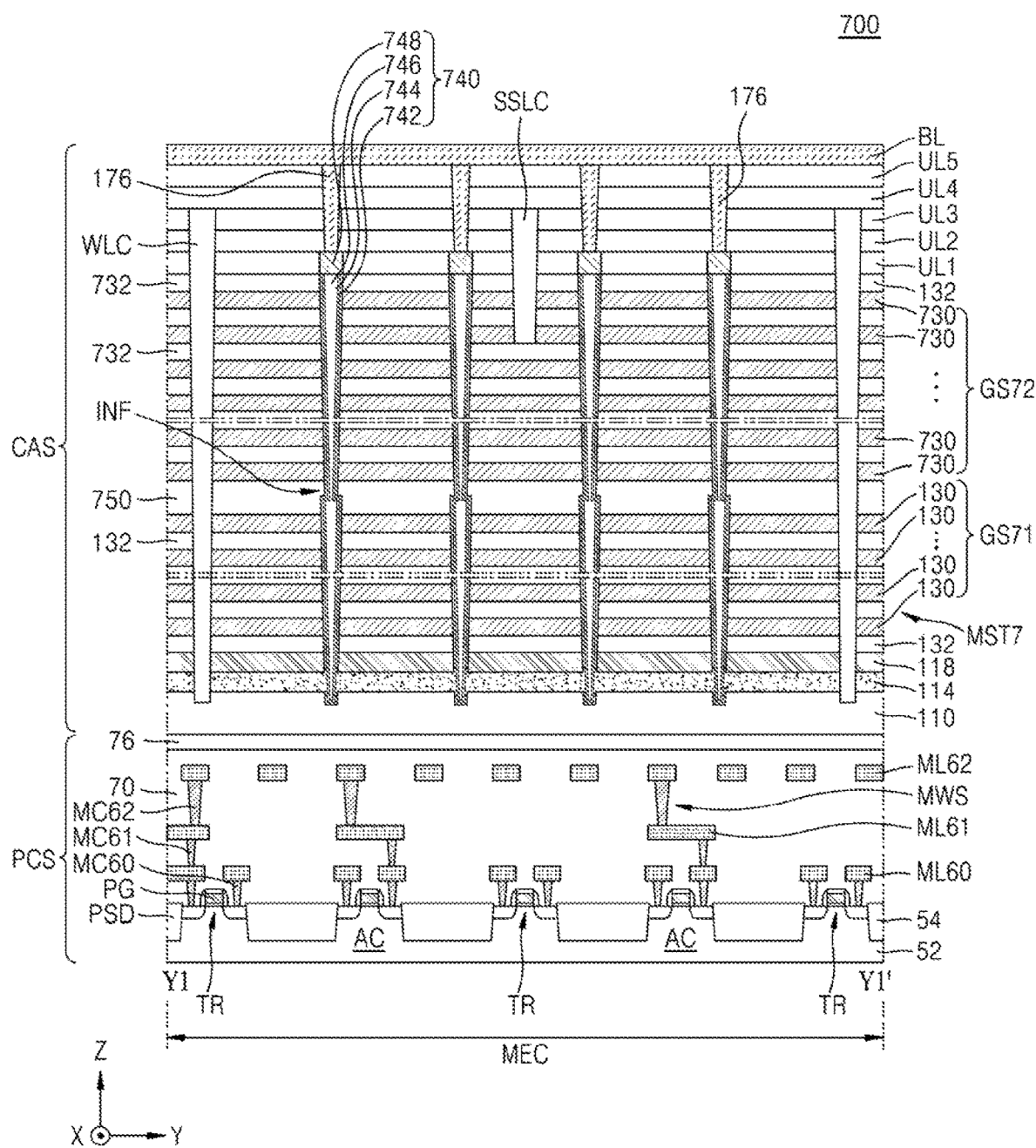
FIG. 19 is a cross-sectional view for describing a semiconductor device according to another embodiment.

FIG. 19 is a cross-sectional view for describing a semiconductor device 700 according to another embodiment. In FIG. 19, enlarged cross-sectional configurations of some elements of a region corresponding to a cross-sectional surface taken along line Y1-Y1' of FIG. 5 in the semiconductor device 700 are illustrated. In FIG. 19, the same reference numerals as FIGS. 4 to 10 refer to like elements, and their detailed descriptions are omitted.

Referring to FIG. 19, the semiconductor device 700 may include substantially the same elements as those of the semiconductor device 100 described above with reference to FIGS. 4 to 10, except the semiconductor device 700 may include a memory stack structure MST7 instead of the memory stack structure MST of the semiconductor device 100.

The memory stack structure MST7 may include a lower gate stack GS71 including a plurality of gate lines 130 and an upper gate stack GS72 including a plurality of gate lines 730. In the lower gate stack GS71, an insulation layer 132 may be disposed between two adjacent gate lines 130 of the plurality of gate lines 130. In the upper gate stack GS72, an insulation layer 732 may be disposed between two adjacent gate lines 730 of the plurality of gate lines 730. A middle insulation layer 750, having a greater thickness than that of the insulation layer 132 or the insulation layer 732, may be disposed between the lower gate stack GS71 and the upper gate stack GS72. The insulation layer 732 and the middle insulation layer 750 may each include silicon oxide.

In embodiments, the lower gate stack GS71 may include 48, 64, or 96 gate lines 130, which are stacked to overlap in a vertical direction (a Z direction), and the upper gate stack GS72 may include 48, 64, or 96 gate lines 730, which are stacked to overlap in the vertical direction (the Z direction). In embodiments, a sum of the number of gate lines 130 configuring the lower gate stack GS71 and the number of gate lines 730 configuring the lower gate stack GS72 may be at least 128. However, the number of stacks of the gate lines 130 and the number of stacks of the gate lines 730 may be varied.

In a memory cell region MEC of a cell array structure CAS, a plurality of channel structures 740 may pass through a plurality of gate lines 730, a plurality of insulation layers 732, the middle insulation layer 750, the plurality of gate lines 130, a plurality of insulation layers 132, a second conductive plate 118, and a first conductive plate 114, and may extend long in the vertical direction (the Z direction), on the upper substrate 110.

The plurality of channel structures 740 may include a gate dielectric layer 742, a channel region 744, a buried insulation layer 746, and a drain region 748. The gate dielectric layer 742, the channel region 744, the buried insulation layer 746, and the drain region 748 may have the same elements as those of the gate dielectric layer 142, the channel region 144, the buried insulation layer 146, and the drain region 148 included in the channel structure 140 described above with reference to FIG. 7. Each of the gate dielectric layer 742, the channel region 744, and the buried insulation layer 746 included in the plurality of channel structures 740 may include an inflection portion INF in a region surrounded by the middle insulation layer 750. In embodiments, in order to form the plurality of channel structures 740 in a process of manufacturing a semiconductor device 700, a lower channel hole passing through a lower mold structure including the plurality of insulation layers 132 may be formed first, and then, an upper channel hole passing through an upper mold structure including the plurality of insulation layers 732 and communicating with the lower channel hole may be formed in a state where a sacrificial layer is filled into the lower channel hole, thereby forming a channel hole having a two-step structure used for forming the plurality of channel structure 740. Subsequently, the gate dielectric layer 742, the channel region 744, and the buried insulation layer 746 may be formed in the channel hole having a two-step structure. In this case, a portion of a lower portion of the middle insulation layer 750 may include an insulation layer included in the lower mold structure, and a portion of an upper portion of the middle insulation layer 750 may include an insulation layer included in the upper mold structure. While the gate dielectric layer 742, the channel region 744, and the buried insulation layer 746 are being formed in the channel hole having this two-step structure, the inflection portion INF may be formed in each of the gate dielectric layer 742, the channel region 744, and the buried insulation layer 746 on the basis of a horizontal-direction width difference between the lower channel hole and the upper channel hole, near a portion at which the lower channel hole contacts the upper channel hole.

Although not shown, the plurality of dummy channel structures D140 described above with reference to FIGS. 5 and 6 may be disposed in a connection region CON of the semiconductor device 700. A cross-sectional structure of each of the plurality of dummy channel structures D140 may have a structure similar to that of each of the plurality of channel structures 740 described above with reference to FIG. 19.

Figure 20:
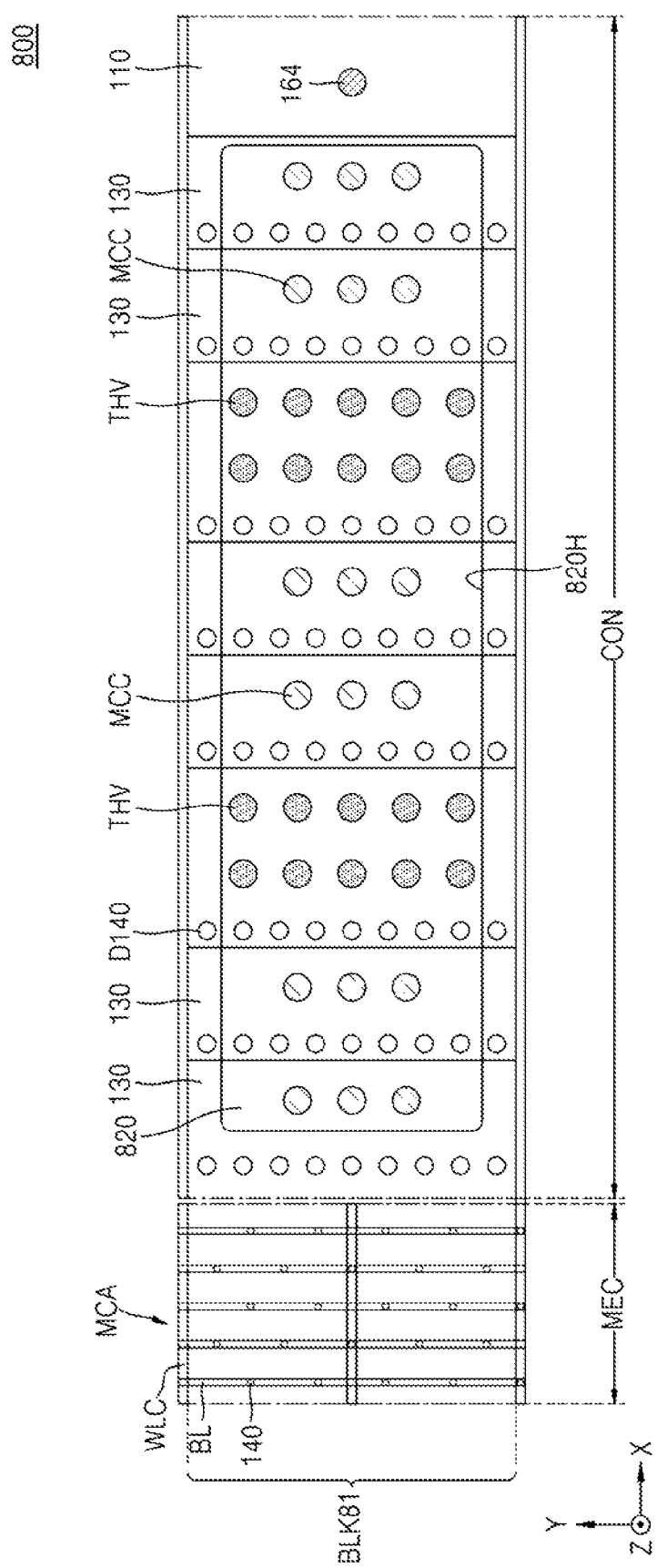
FIG. 20 is a plan view for describing a semiconductor device according to another embodiment.

FIG. 20 is a plan view for describing a semiconductor device 800 according to another embodiment. In FIG. 20, schematic plane configurations of some elements of a memory cell block BLK71 are illustrated. The memory cell block BLK71 may configure some of the plurality of memory cell blocks BLK1, BLK2, . . . , BLKp-1, and BLKp illustrated in FIG. 4.

Referring to FIG. 20, the semiconductor device 800 may have the same elements as those of the semiconductor device 100 described above with reference to FIGS. 4 to 10. In a connection region CON of the semiconductor device 800, a through opening 820H may be formed in an upper substrate 110. The through opening 820H may be filled with an insulation plug 820. The through opening 820H may be disposed at a position which overlaps a partial region of a peripheral circuit structure PCS (see FIG. 6) in a vertical direction (a Z direction). The insulation plug 820 may include silicon oxide, silicon nitride, or a combination thereof.

In the connection region CON, each of a plurality of memory cell contacts MCC, a plurality of dummy channel structures D140, and a plurality of through via electrodes THV may extend to the peripheral circuit structure PCS through the through opening 820H.

Hereinafter, a method of manufacturing a semiconductor device according to embodiments will be described in detail.

FIGS. 21A to 34B are cross-sectional views for describing a method of manufacturing a semiconductor device, according to embodiments. In particular, FIGS. 21A, 22A, 23A, 24A, 25, 26, 27A, 28, 29, 30A, 31, 32, 33, and 34A are cross-sectional views illustrating in process sequences a region corresponding to a cross-sectional surface taken along line X1-X1' of FIG. 5, and FIGS. 21B, 22B, 23B, 24B, 27B, 30B, and 34B are cross-sectional views illustrating in process sequences some elements of a region corresponding to a cross-sectional surface taken along line Y1-Y1' of FIG. 5.

A method of manufacturing the semiconductor device 100 described above with reference to FIGS. 4 to 10 will be described with reference to FIGS. 21A to 34B.

Figure 21A:
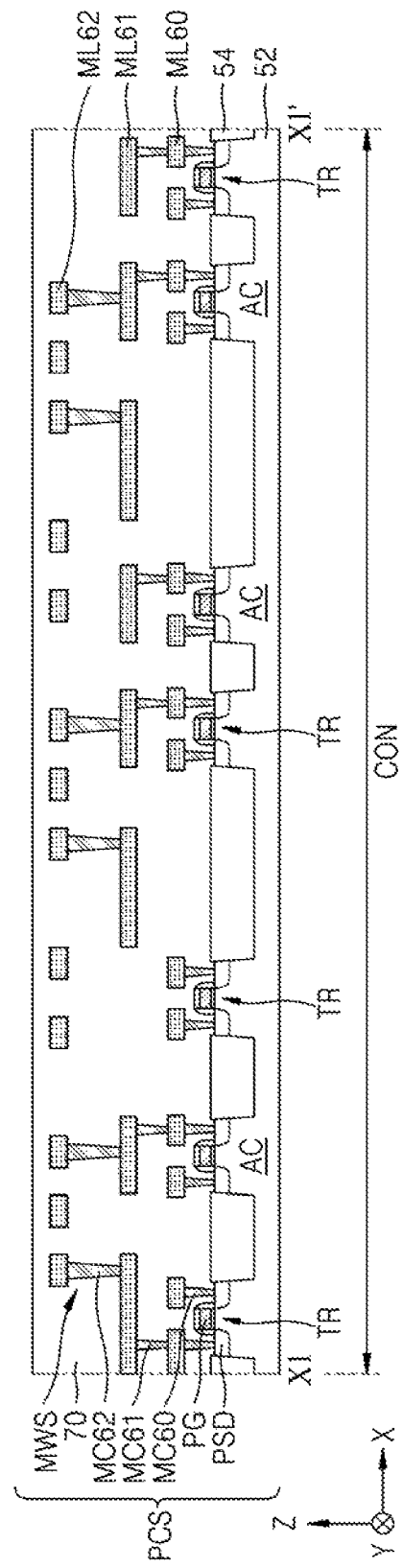
FIGS. 21A to 34B are cross-sectional views for describing a method of manufacturing a semiconductor device, according to embodiments.
Figure 21B:
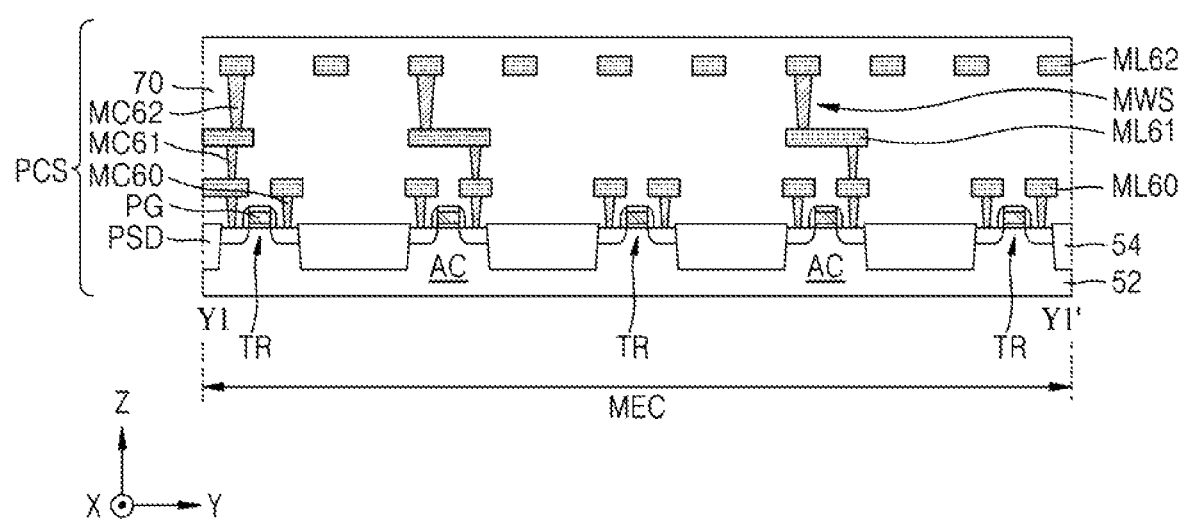

Referring to FIGS. 21A and 21B, a peripheral circuit structure PCS including a memory lower substrate 52, a plurality of transistors TR, a multilayer wiring structure MWS, and an interlayer insulation layer 70 may be formed. The interlayer insulation layer 70 may be formed to cover a plurality of peripheral circuit wiring layers ML62, which are uppermost layers, of a plurality of peripheral circuit wiring layers ML60, ML61, and ML62.

Figure 22A:
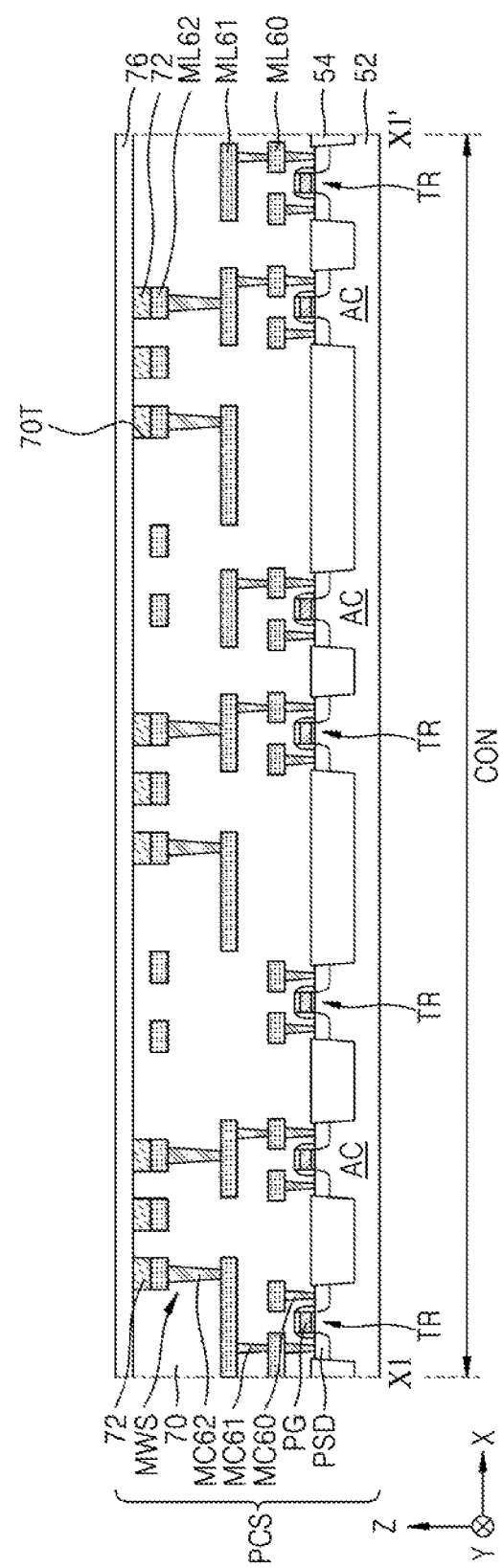
Figure 22B:
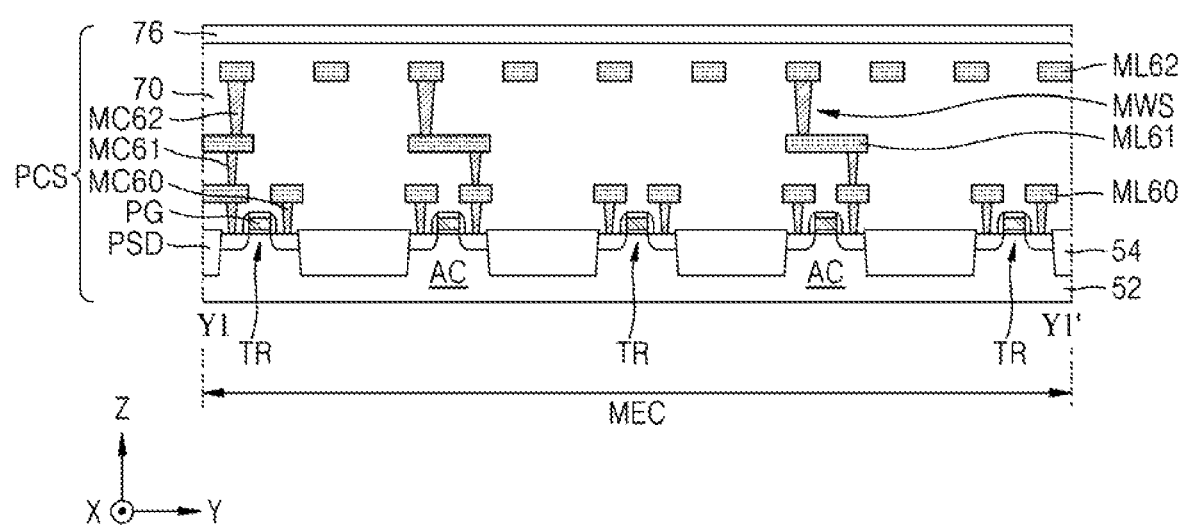

Referring to FIGS. 22A and 22B, a plurality of trenches 70T exposing top surfaces of some peripheral circuit wiring layers ML62 selected from among the plurality of peripheral circuit wiring layers ML62 may be formed by etching a portion of the interlayer insulation layer 70, and a plurality of conductive landing vias 72 filling the plurality of trenches 70T may be formed.

A conductive layer having a thickness sufficient to fill the plurality of trenches 70T may be formed for forming the plurality of conductive landing vias 72, and a resultant material where the conductive layer is formed may be planarized so that the conductive layer remains in only the plurality of trenches 70T. A chemical mechanical polishing (CMP) process may use for the planarization.

Subsequently, an upper interlayer insulation layer 76 covering a top surface of each of the plurality of conductive landing vias 72 and the interlayer insulation layer 70 may be formed.

Figure 23A:
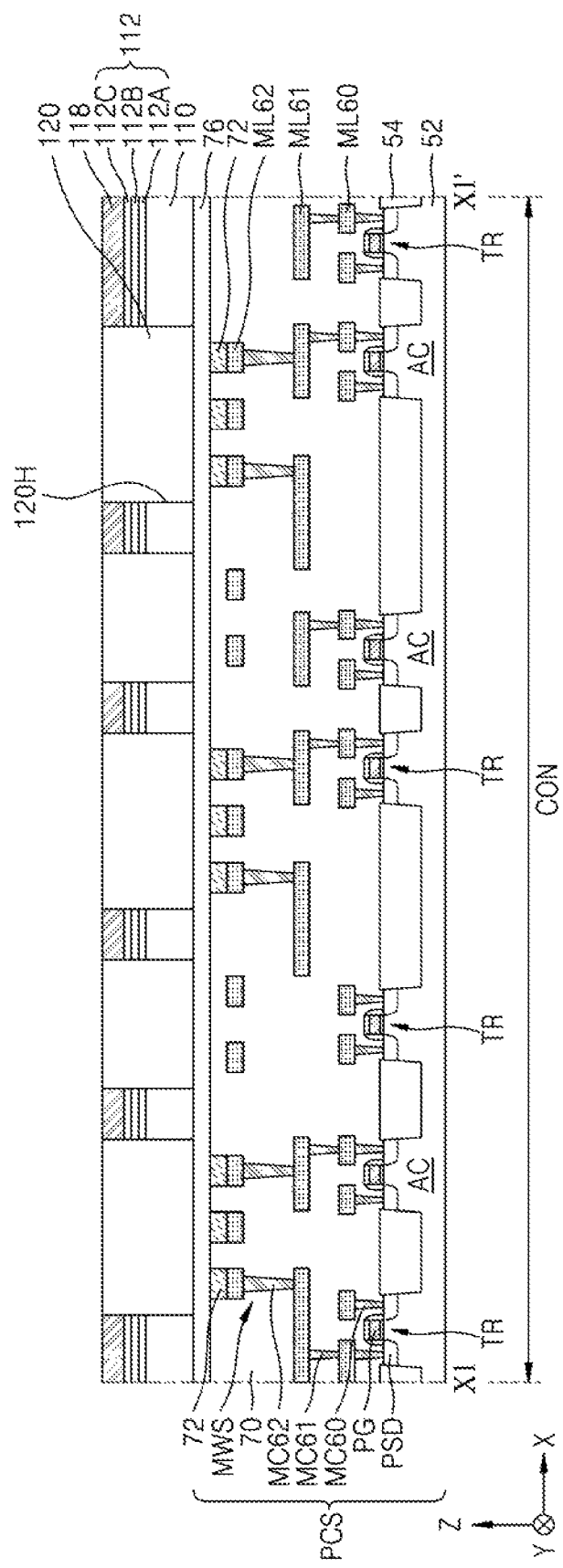
Figure 23B:
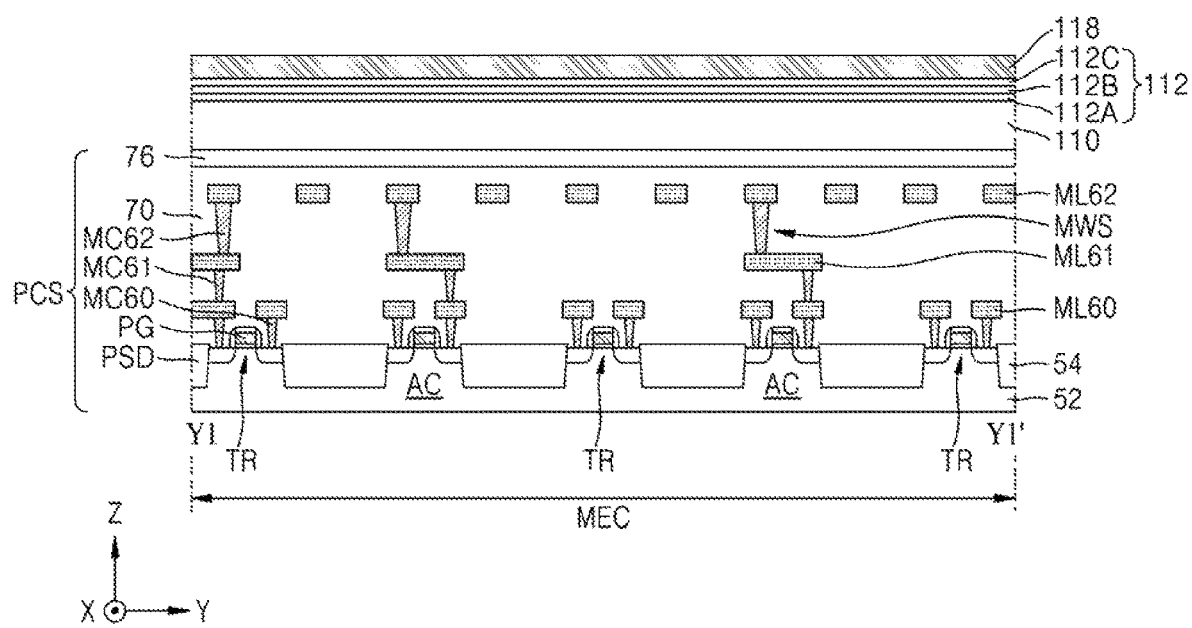

Referring to FIGS. 23A and 23B, an upper substrate 110 may be formed on a resultant material of FIGS. 22A and 22B, and an insulation plate 112 and a second conductive plate 118 each covering the upper substrate 110 may be sequentially formed in a memory cell region MEC and a connection region CON of a cell array structure CAS (see FIGS. 6 and 7) which is to be formed on a peripheral circuit structure PCS. The insulation plate 112 may include an insulation layer having a multi-layer structure which includes a first insulation layer 112A, a second insulation layer 112B, and a third insulation layer 113C.

In a partial region of the connection region CON, a plurality of through openings 120H passing through the upper substrate 110, the insulation plate 112, and the second conductive plate 118 may be formed, and a plurality of insulation plugs 120 filling the plurality of through openings 120H may be formed.

Figure 24B:
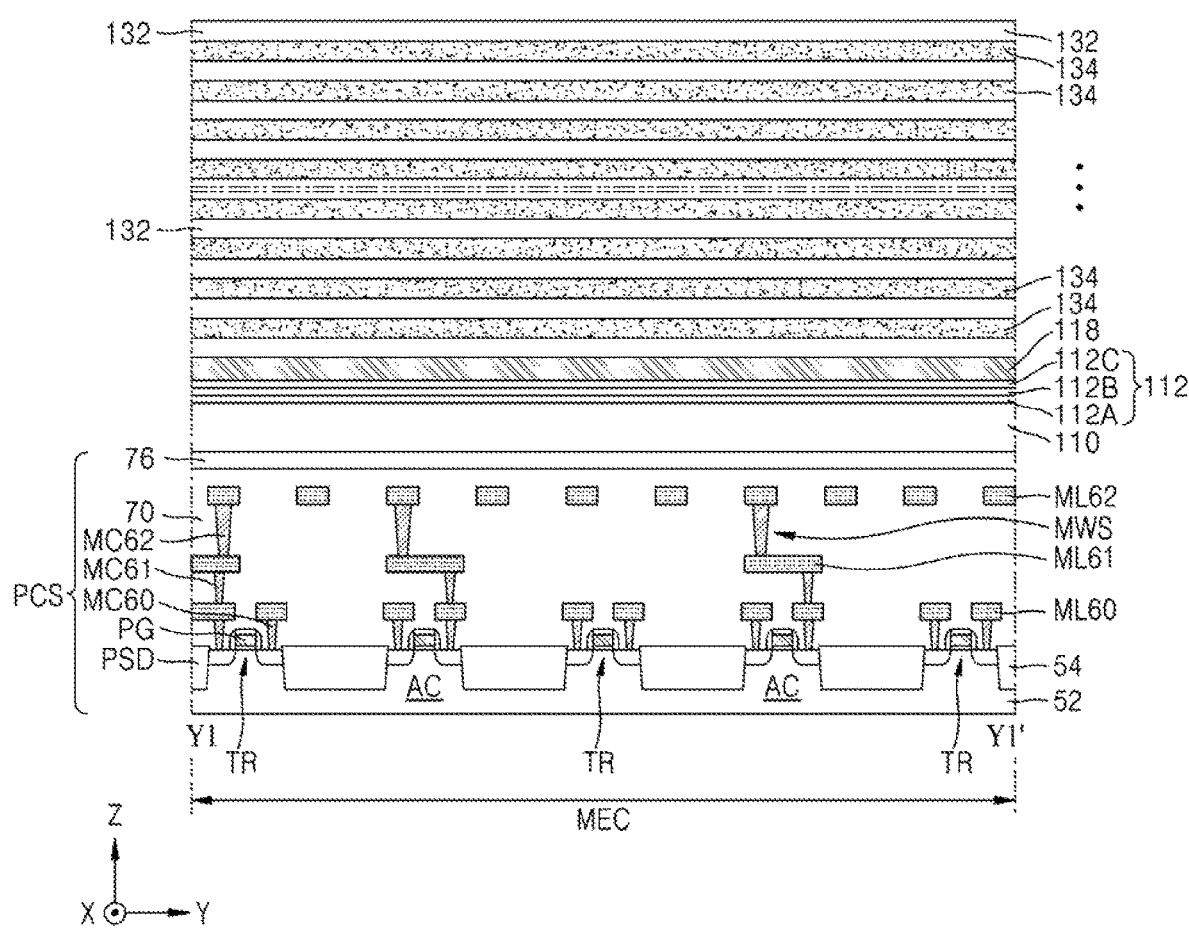

Referring to FIGS. 24A and 24B, in the memory cell region MEC and the connection region CON, a plurality of insulation layers 132 and a plurality of sacrificial insulation layers 134 may be alternately stacked one by one on the second conductive plate 118 and the insulation plug 120. The plurality of insulation layers 132 may include silicon oxide, and the plurality of sacrificial insulation layers 134 may include silicon nitride. Each of the plurality of sacrificial insulation layers 134 may secure a space where a plurality of gate lines 130 are to be formed, in a subsequent process.

Figure 25:
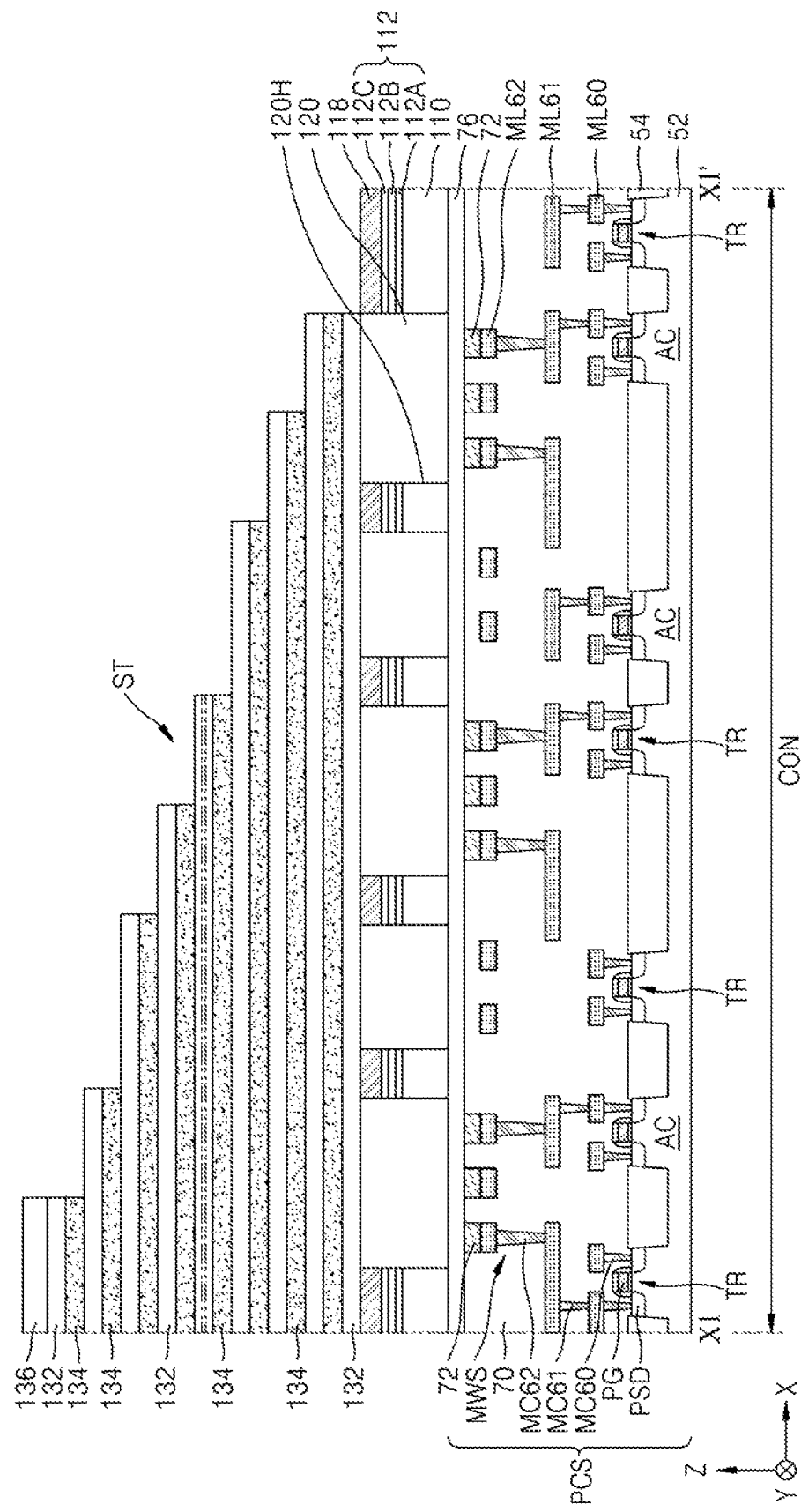

Referring to FIG. 25, in a resultant material of FIGS. 24A and 24B, an etch stop layer 136 covering an uppermost insulation layer 132 of the plurality of insulation layers 132 may be formed, and by removing a portion of each of the plurality of insulation layers 132 and the plurality of sacrificial insulation layers 134 in the connection region CON by using a photolithography process, one end portion of each of the plurality of insulation layers 132 and the plurality of sacrificial insulation layers 134 may configure a staircase structure ST having a width which is progressively reduced in a horizontal direction (e.g., in the X-direction) as a distance from the upper substrate 110 increases.

Figure 26:
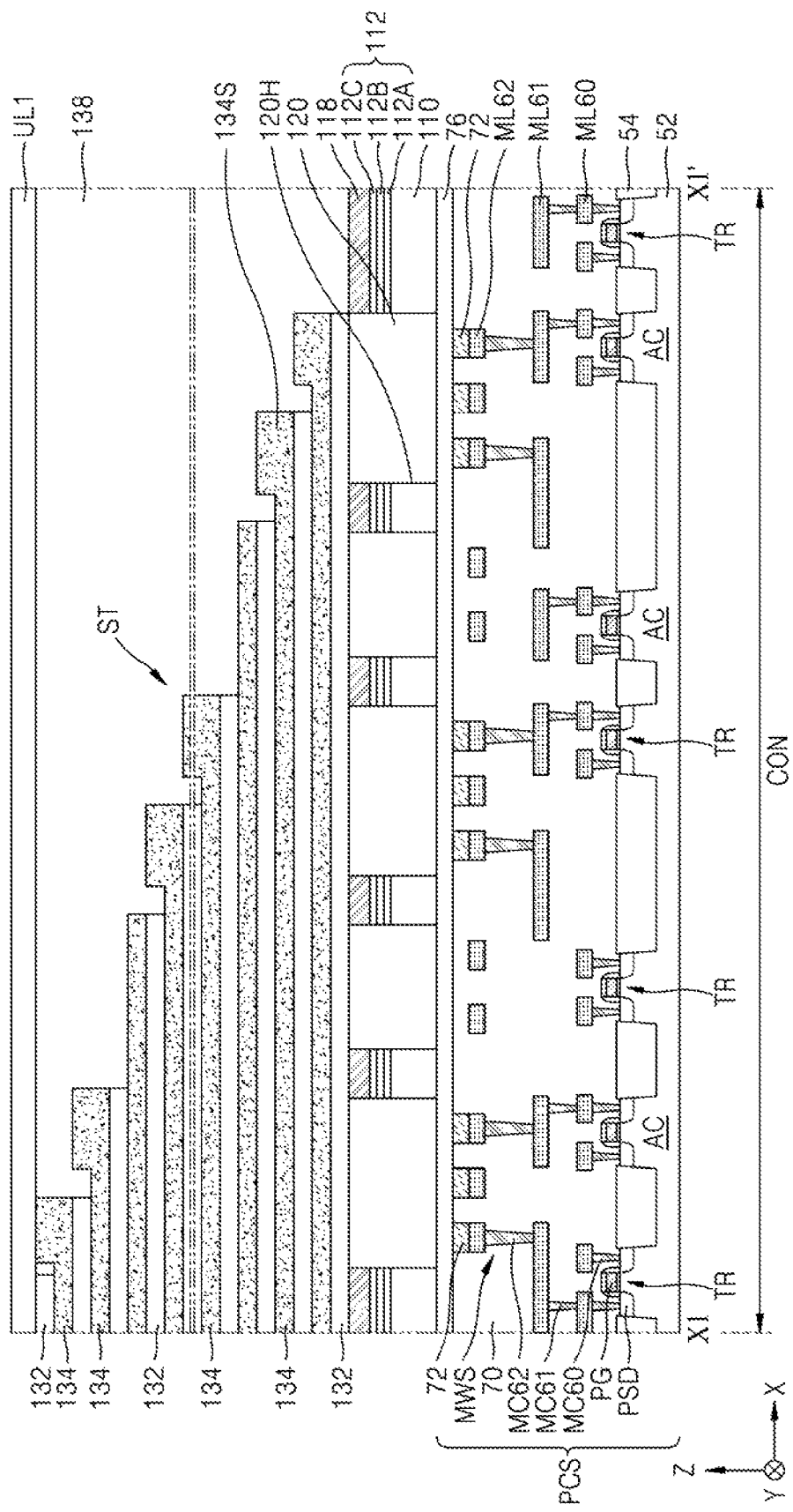

Referring to FIG. 26, a sacrificial pad portion 134S having an increased thickness may be formed at the one end portion of each of the plurality of sacrificial insulation layers 134 configuring the staircase structure ST. In FIG. 26, only the sacrificial pad portion 134S formed at one end portion of some of the plurality of sacrificial insulation layers 134 is illustrated, but in FIG. 26, a sacrificial insulation layer 134 where the sacrificial pad portion 134S is not seen may include a sacrificial pad portion 134S provided at another portion which is not seen.

In embodiments, in order to form the sacrificial pad portion 134S at one end portion of each of the plurality of sacrificial insulation layers 134, one end portion of each of the plurality of sacrificial insulation layers 134 configuring the staircase structure ST may be exposed by removing some of the plurality of insulation layers 132, and then, an additional layer including the same material as that of each of the plurality of sacrificial insulation layers 134 may be deposited on one end portion, which is exposed, of each of the plurality of sacrificial insulation layers 134, and the sacrificial pad portion 134S may remain by patterning the additional layer.

Subsequently, an interlayer insulation layer 138 covering the second conductive plate 118 and the staircase structure ST may be formed, and by planarizing a resultant material based thereon in a CMP process, a top surface of an uppermost sacrificial insulation layer 134 may be exposed. In the planarization process, the etch stop layer 136 may be removed. Subsequently, a first upper insulation layer UL1 covering a top surface of each of an uppermost sacrificial insulation layer 134 and the interlayer insulation layer 138 may be formed.

Figure 27A:
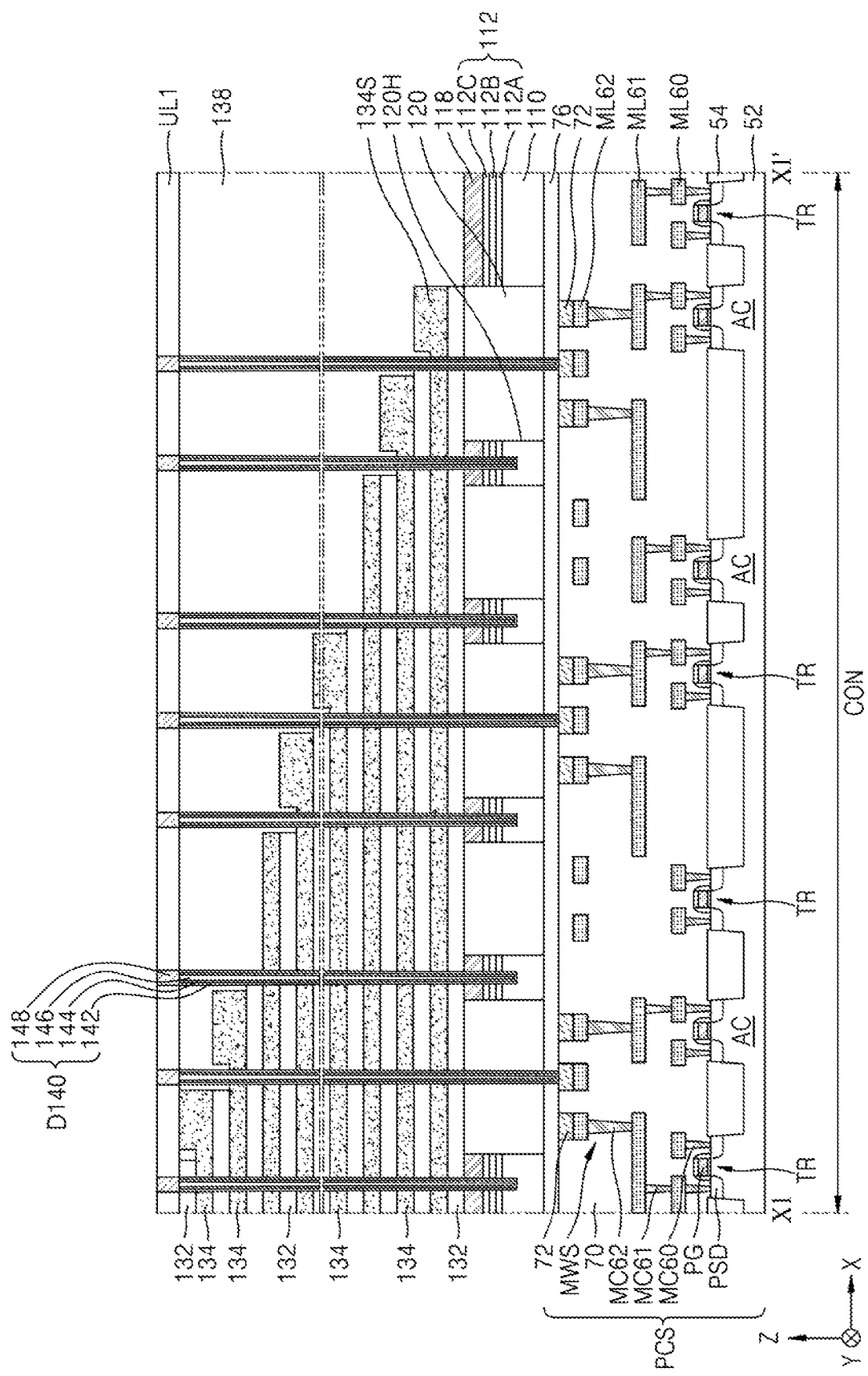
Figure 27B:
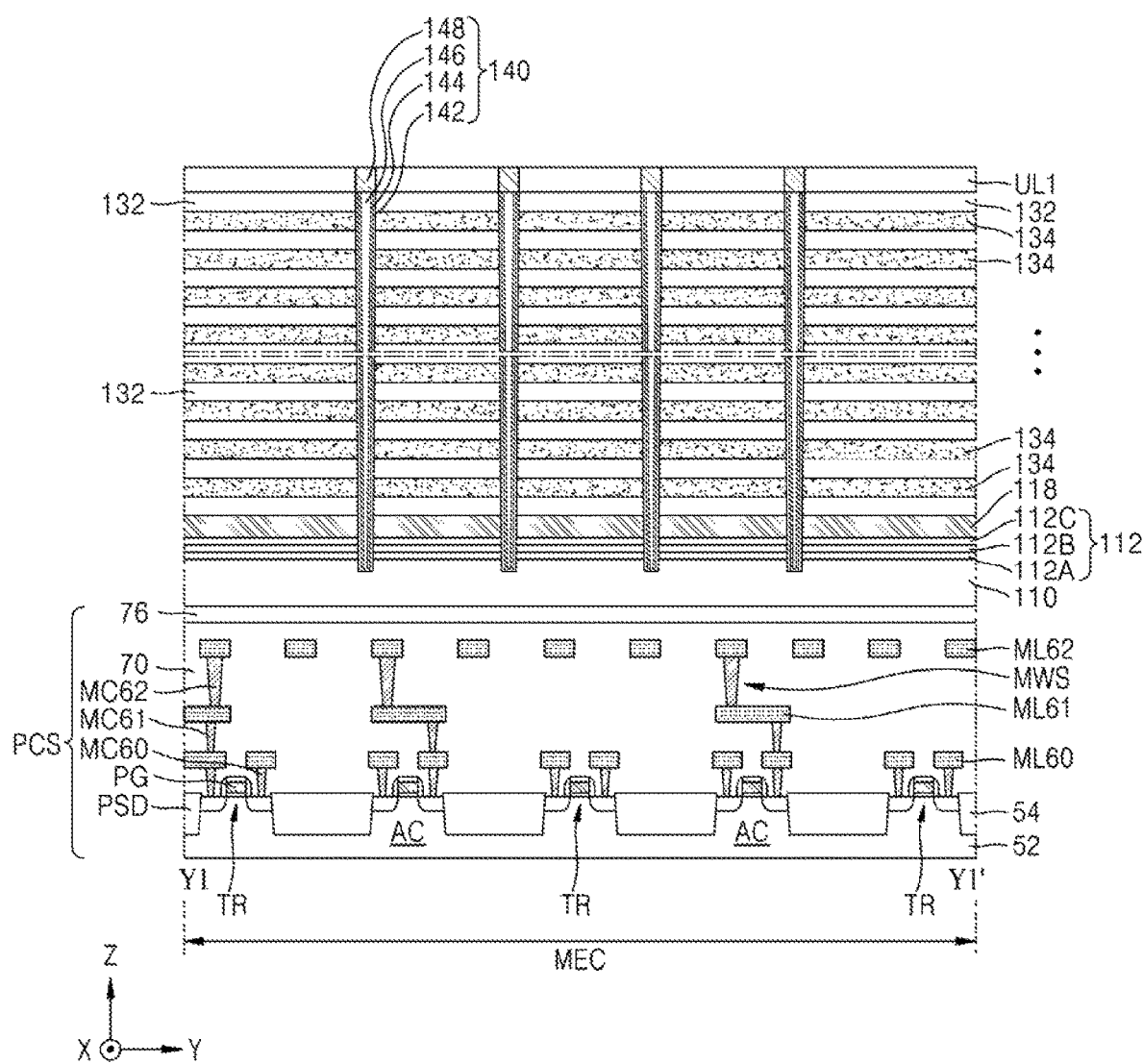

Referring to FIGS. 27A and 27B, in the memory cell region MEC, a plurality of channel structures 140 which pass through the first upper insulation layer UL1, the plurality of insulation layers 132, and the plurality of sacrificial insulation layers 134 and extend long in a vertical direction (a Z direction) may be formed, and in the connection region CON, a plurality of dummy channel structures D140 which pass through the first upper insulation layer UL1, the plurality of insulation layers 132, the plurality of sacrificial insulation layers 134, and the interlayer insulation layer 138 and extend long in the vertical direction (the Z direction) may be formed.

A dummy channel structure D140, overlapping the plurality of through openings 120H in the vertical direction (the Z direction), of the plurality of dummy channel structures D140 formed in the connection region CON may be formed to pass through the insulation plug 120 and the upper interlayer insulation layer 76 and contact a conductive landing via 72.

Figure 28:
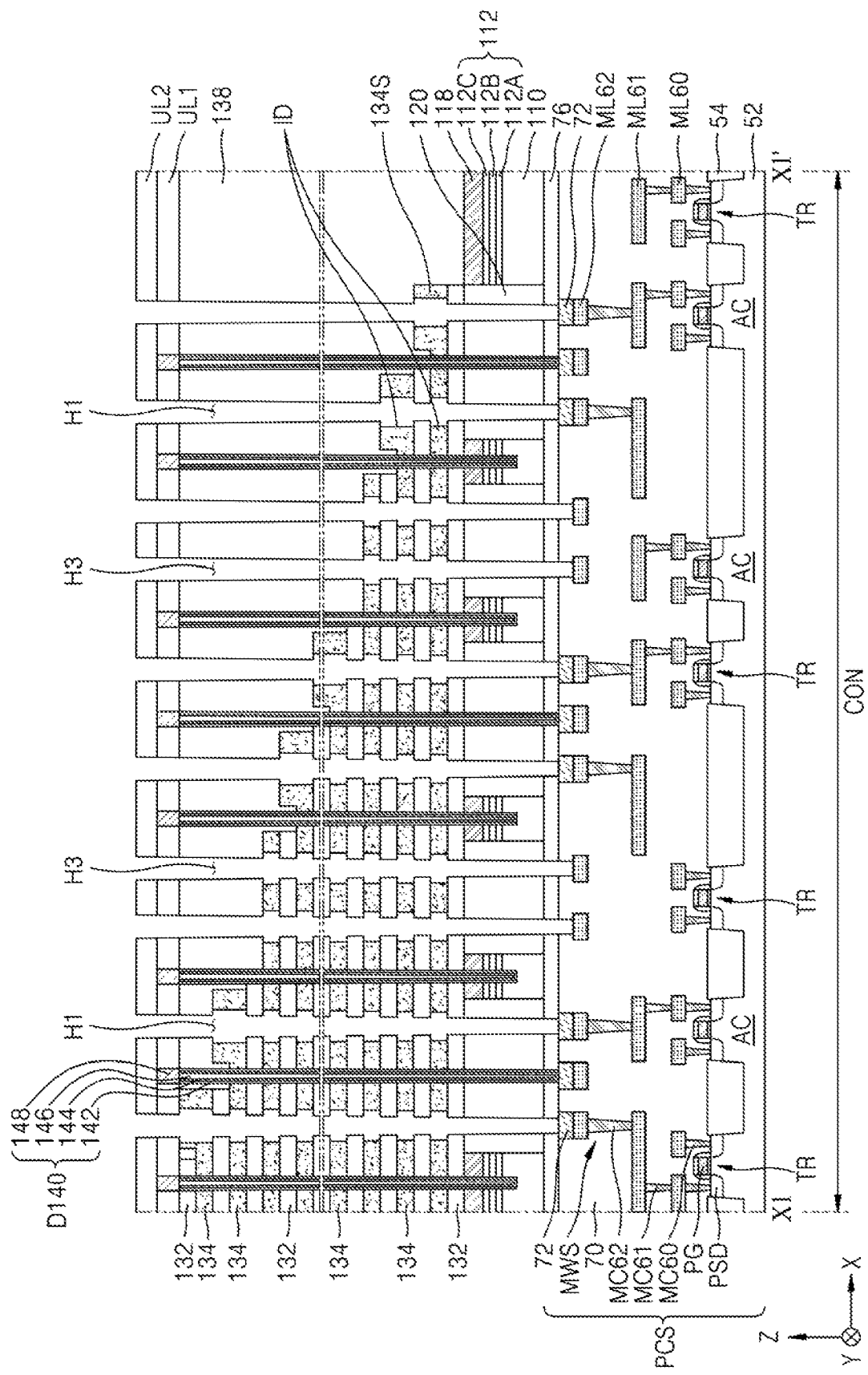

Referring to FIG. 28, a second upper insulation layer UL2 may be formed on a resultant material of FIGS. 27A and 27B, and then, a plurality of first holes H1 and a plurality of third holes H3 may be formed in the connection region CON.

The plurality of first holes H1 may pass through the second upper insulation layer UL2, the first upper insulation layer UL1, the interlayer insulation layer 138, one sacrificial pad portion 134S, the plurality of sacrificial insulation layers 134, the plurality of insulation layers 132, the insulation plug 120, and the upper interlayer insulation layer 76 to expose a top surface of the conductive landing via 72. The plurality of third holes H3 may pass through the second upper insulation layer UL2, the first upper insulation layer UL1, the interlayer insulation layer 138, the plurality of sacrificial insulation layers 134, the plurality of insulation layers 132, the insulation plug 120, and the upper interlayer insulation layer 76 to expose a top surface of an uppermost peripheral circuit wiring layer ML62.

Subsequently, by etching an exposed portion of each of the sacrificial pad portion 134S and the sacrificial insulation layer 134 in each of the plurality of first holes H1 and the plurality of third holes H3, a horizontal-direction width of each of the plurality of first holes H1 and the plurality of third holes H3 may be enlarged at the same vertical level as the sacrificial insulation layer 134, and thus, a plurality of indent spaces ID where a sidewall of each of the sacrificial pad portion 134S and the sacrificial insulation layer 134 is exposed may be formed.

Figure 29:
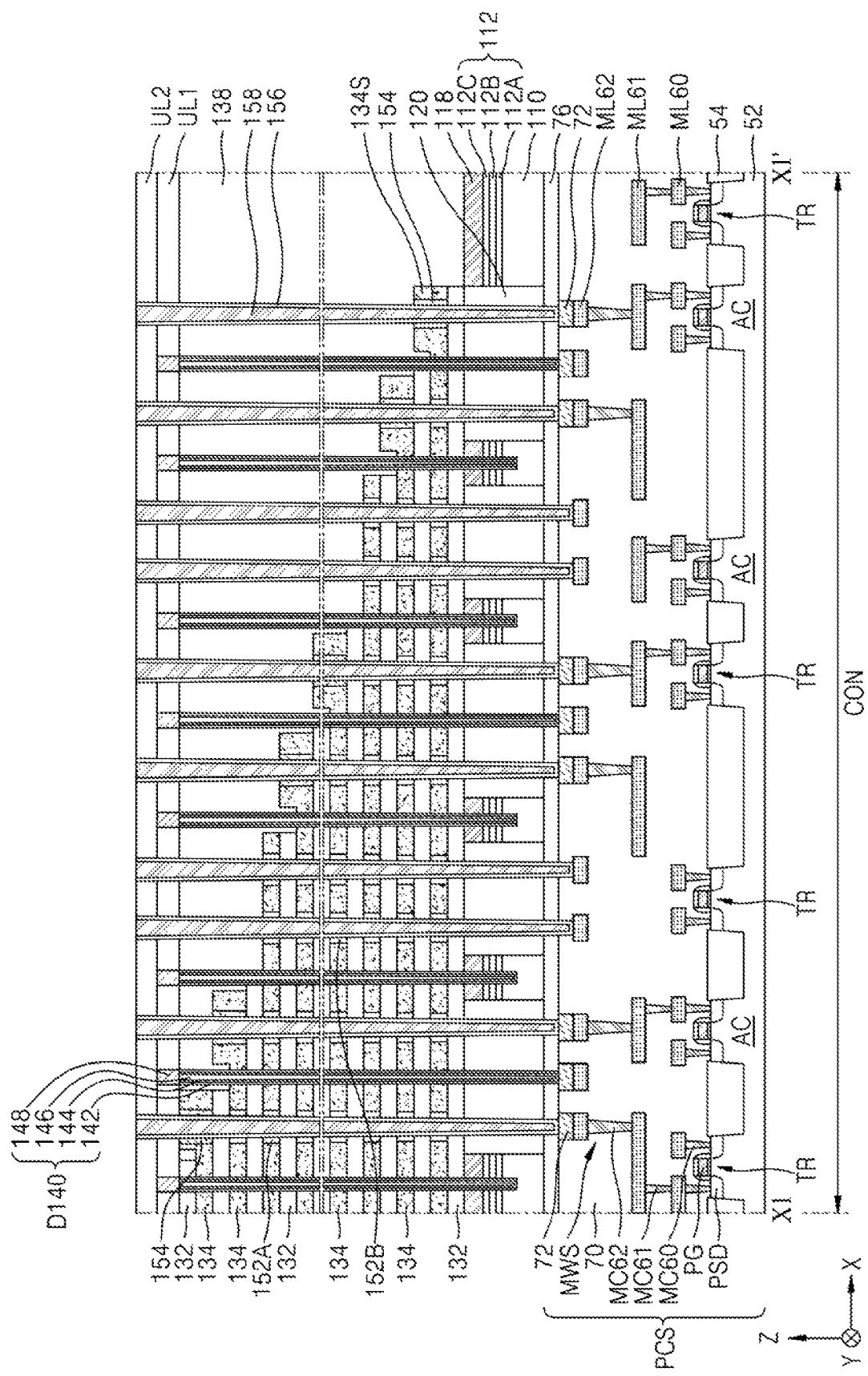

Referring to FIG. 29, in a resultant material of FIG. 28, an indent space ID exposing the sacrificial insulation layer 134 among the plurality of indent spaces ID connected to the plurality of first holes H1 may be filled with a first insulation ring 152A, and an indent space ID exposing the sacrificial pad portion 134S among the plurality of indent spaces ID may be filled with a sacrificial insulation ring 154. Also, in the resultant material of FIG. 28, the plurality of indent spaces ID connected to the plurality of third holes H3 may be filled with a second insulation ring 152B. The first insulation ring 152A and the second insulation ring 152B may include silicon oxide. The sacrificial insulation ring 154 may include the same material as that of the sacrificial insulation layer 134, and for example, may include silicon nitride.

In embodiments, a process of first forming the first insulation ring 152A and the second insulation ring 152B in the indent space ID exposing the sacrificial insulation layer 134 in the plurality of first holes H1 and the plurality of third holes H3 and then forming the sacrificial insulation ring 154 in the indent space ID exposing the sacrificial pad portion 134S in each of the plurality of first holes H1 may be performed. In embodiments, an etch stop insulation liner may be disposed between the sacrificial insulation layer 134 and the first insulation ring 152A and between the sacrificial insulation layer 134 and the second insulation ring 152B. The etch stop insulation liner may include silicon nitride.

Subsequently, an insulation spacer 156 and a sacrificial plug 158 may be filled into each of the plurality of first holes H1 and the plurality of third holes H3. In embodiments, the insulation spacer 156 may include silicon oxide, and the sacrificial plug 158 may include polysilicon.

Figure 30A:
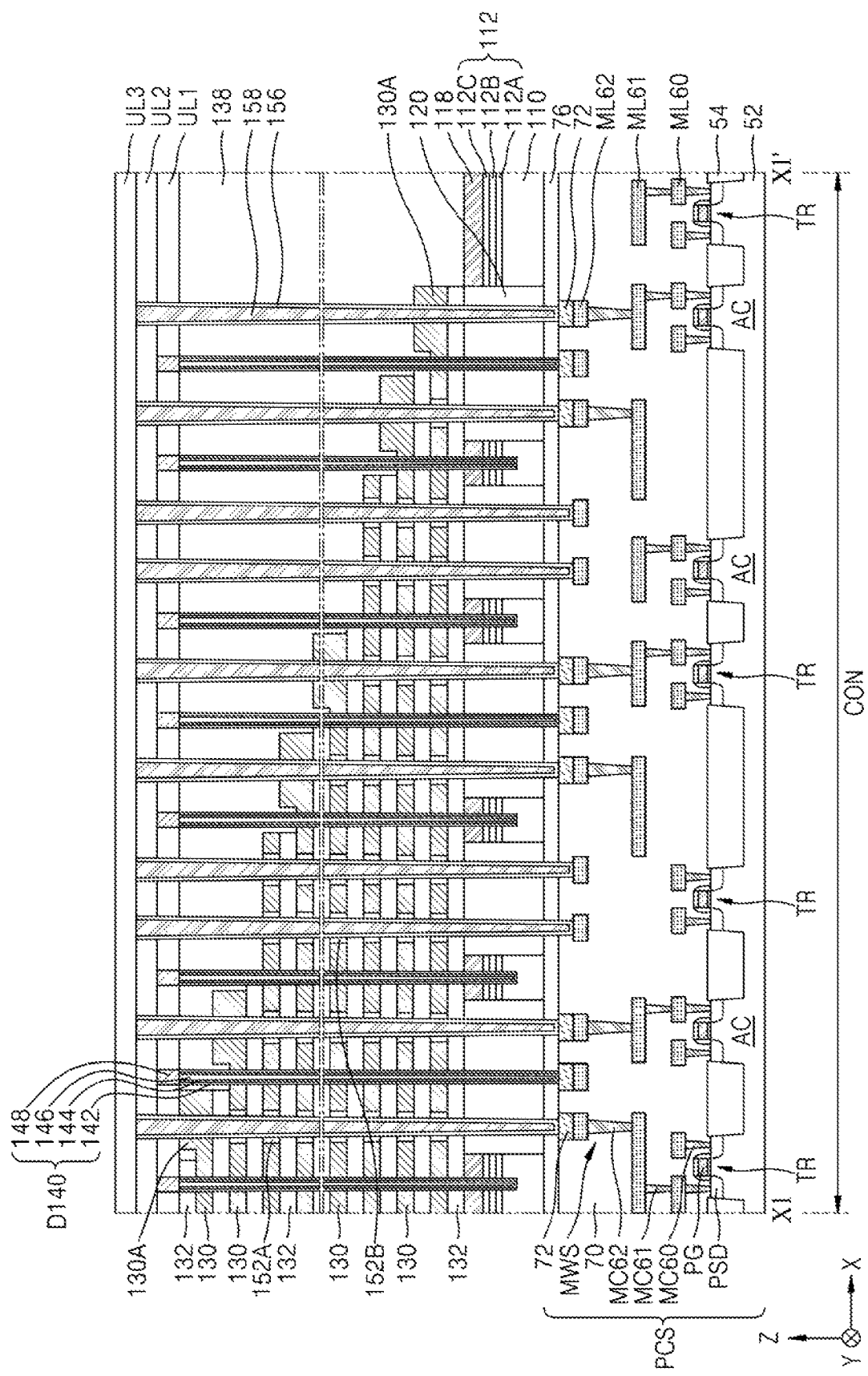
Figure 30B:
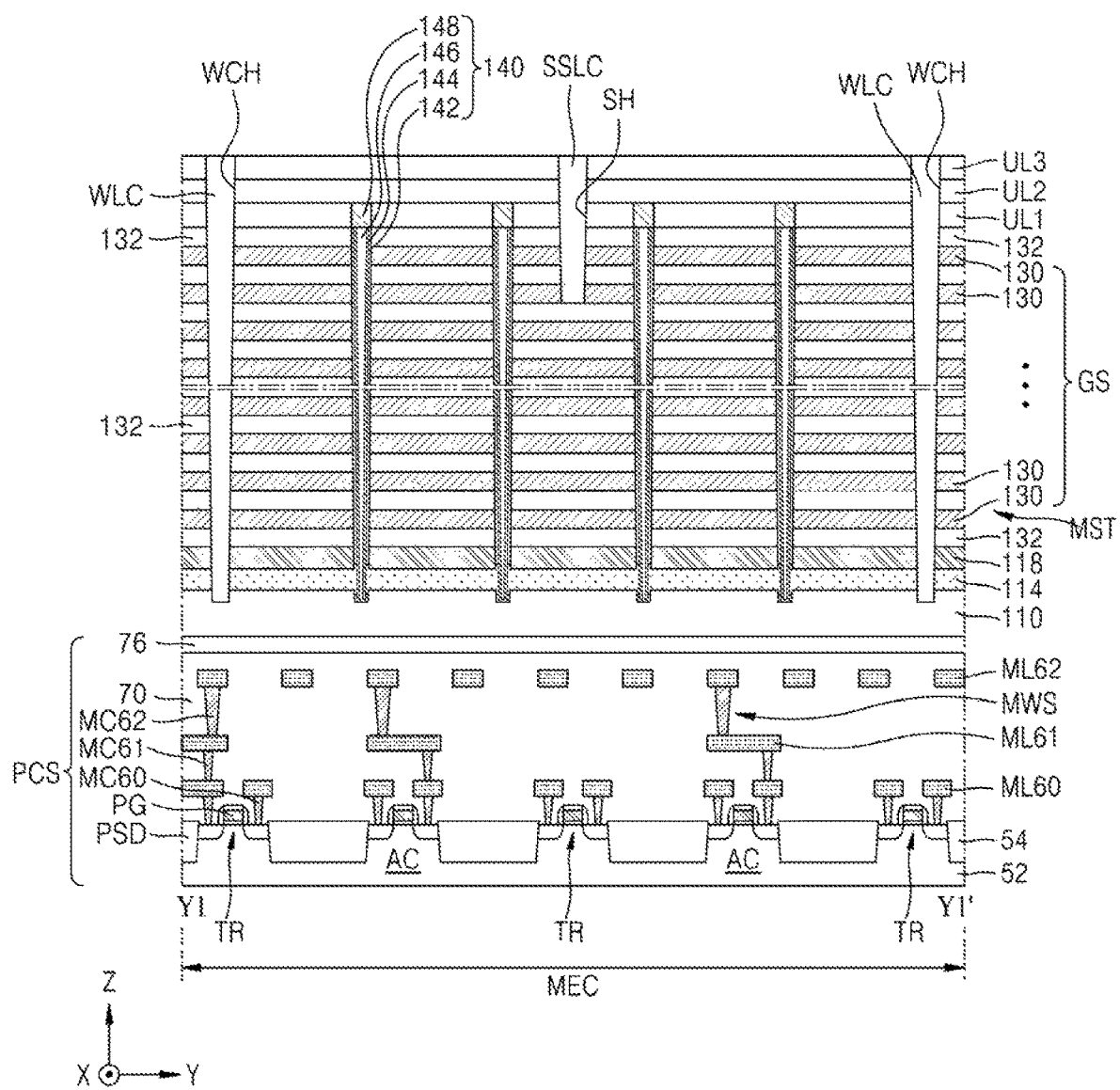

Referring to FIGS. 30A and 30B, in the memory cell region MEC and the connection region CON, a third upper insulation layer UL3 covering a top surface of each of the insulation spacer 156, the sacrificial plug 158, and the second upper insulation layer UL2 may be formed.

In a resultant material where the third upper insulation layer UL3 is formed, in the memory cell region MEC, a hole SH may be formed by etching the third upper insulation layer UL3, the second upper insulation layer UL2, the first upper insulation layer UL1, some of the plurality of insulation layers 132, and some of the plurality of sacrificial insulation layers 134, and a string selection line cut structure SSLC filling the hole SH may be formed.

In the memory cell region MEC and the connection region CON, a plurality of word line cut holes WCH passing through the third upper insulation layer UL3, the second upper insulation layer UL2, the first upper insulation layer UL1, the interlayer insulation layer 138, the plurality of insulation layers 132, the plurality of sacrificial insulation layers 134, the second conductive plate 118, and the insulation plate 112 to expose the upper substrate 110 may be formed.

In only the memory cell region MEC (from among the memory cell region MEC and the connection region CON), the insulation plate 112 may be selectively removed through an inner space of each of the plurality of word line cut holes WCH, and an empty space formed based thereon may be filled with the first conductive plate 114. While the insulation plate 112 is being removed in the memory cell region MEC, portions, which are adjacent to the insulation plate 112, of a gate dielectric layer 182 included in the channel structure 180 in the memory cell region MEC may be removed along with the insulation plate 112. Thus, the first conductive plate 114 may pass through a partial region of the gate dielectric layer 182 in a horizontal direction, and may contact the channel region 184.

The plurality of sacrificial insulation layers 134 and the sacrificial pad portion 134S (see FIG. 29) may be substituted into the plurality of gate lines 130 through an inner space of each of the plurality of word line cut holes WCH, in the memory cell region MEC and the connection region CON. A relatively thick end portion obtained by substituting the sacrificial pad portion 134S in each of the plurality of gate lines 130 may configure a gate pad portion 130A.

After the first conductive plate 114 and the plurality of gate lines 130 are formed, the plurality of word line cut holes WCH may be filled with a plurality of word line cut structures WLC.

Figure 31:
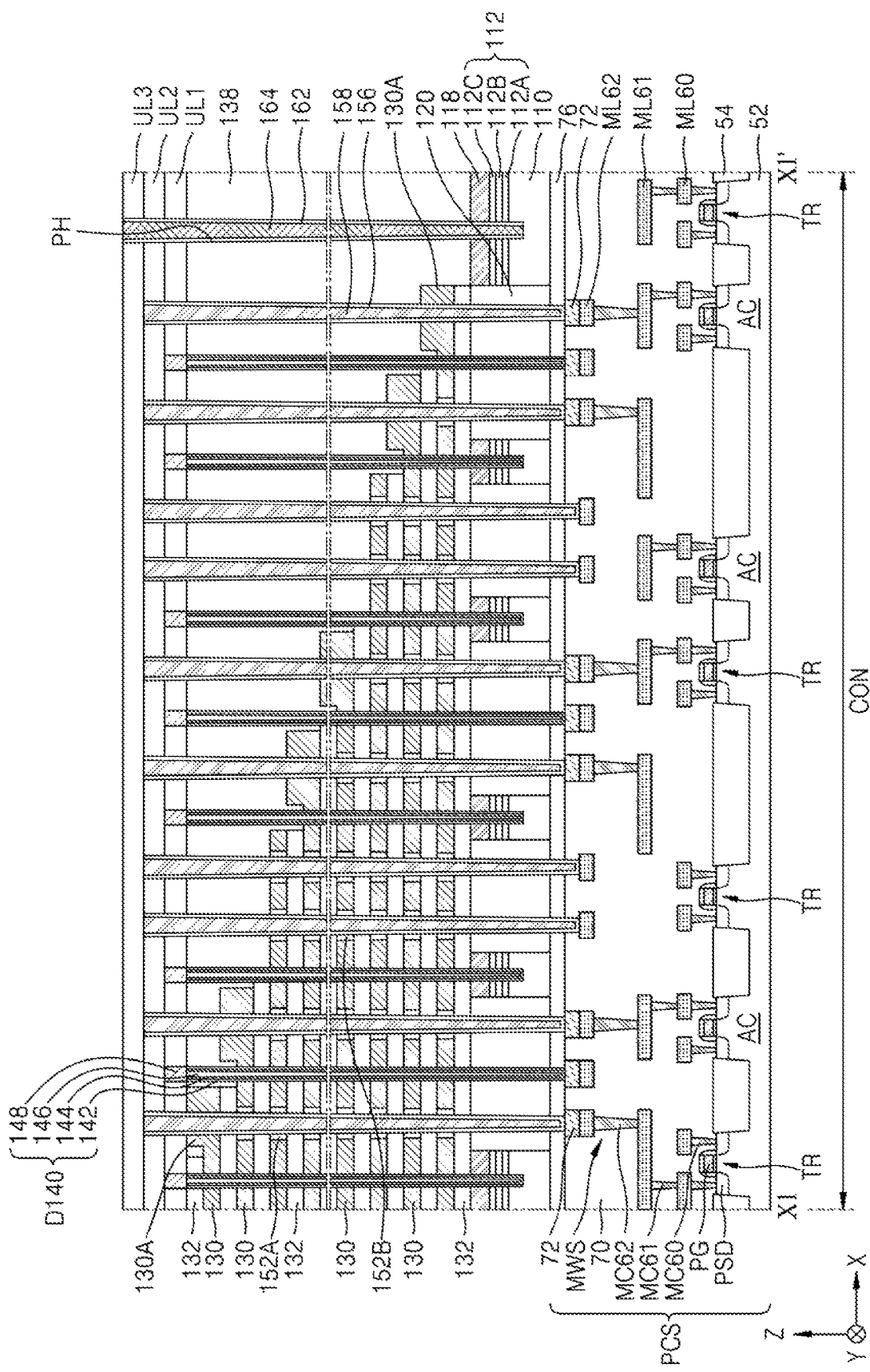

Referring to FIG. 31, in the connection region CON of a resultant material of FIGS. 30A and 30B, a hole PH passing through the third upper insulation layer UL3, the second upper insulation layer UL2, the first upper insulation layer UL1, the interlayer insulation layer 138, the second conductive plate 118, and the insulation plate 112 to expose the upper substrate 110 may be formed. Then, an insulation spacer 162 and a conductive plate contact 164 may be sequentially formed in the hole PH.

Figure 32:
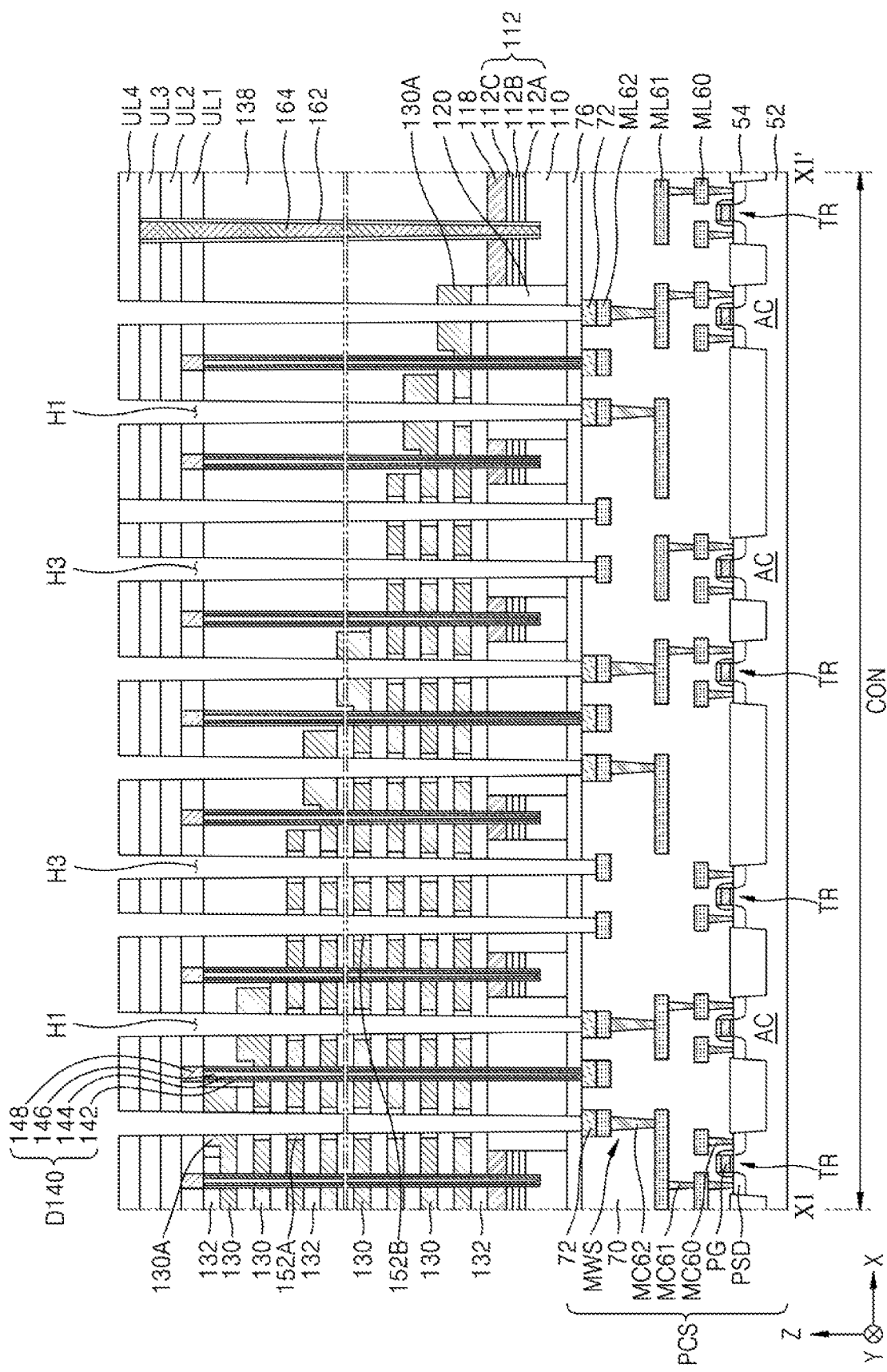

Referring to FIG. 32, in the connection region CON of a resultant material of FIG. 31, a fourth upper insulation layer UL4 covering the third upper insulation layer UL3, the insulation spacer 162, and the conductive plate contact 164 may be formed. Then, an insulation spacer 156 and a sacrificial plug 158 may be exposed by removing a portion of each of the fourth upper insulation layer UL4 and the third upper insulation layer UL3. Subsequently, by removing the exposed insulation spacer 156 and sacrificial plug 158, a plurality of conductive landing vias 72 may be exposed through the plurality of first holes H1 and the plurality of third holes H3.

Figure 33:
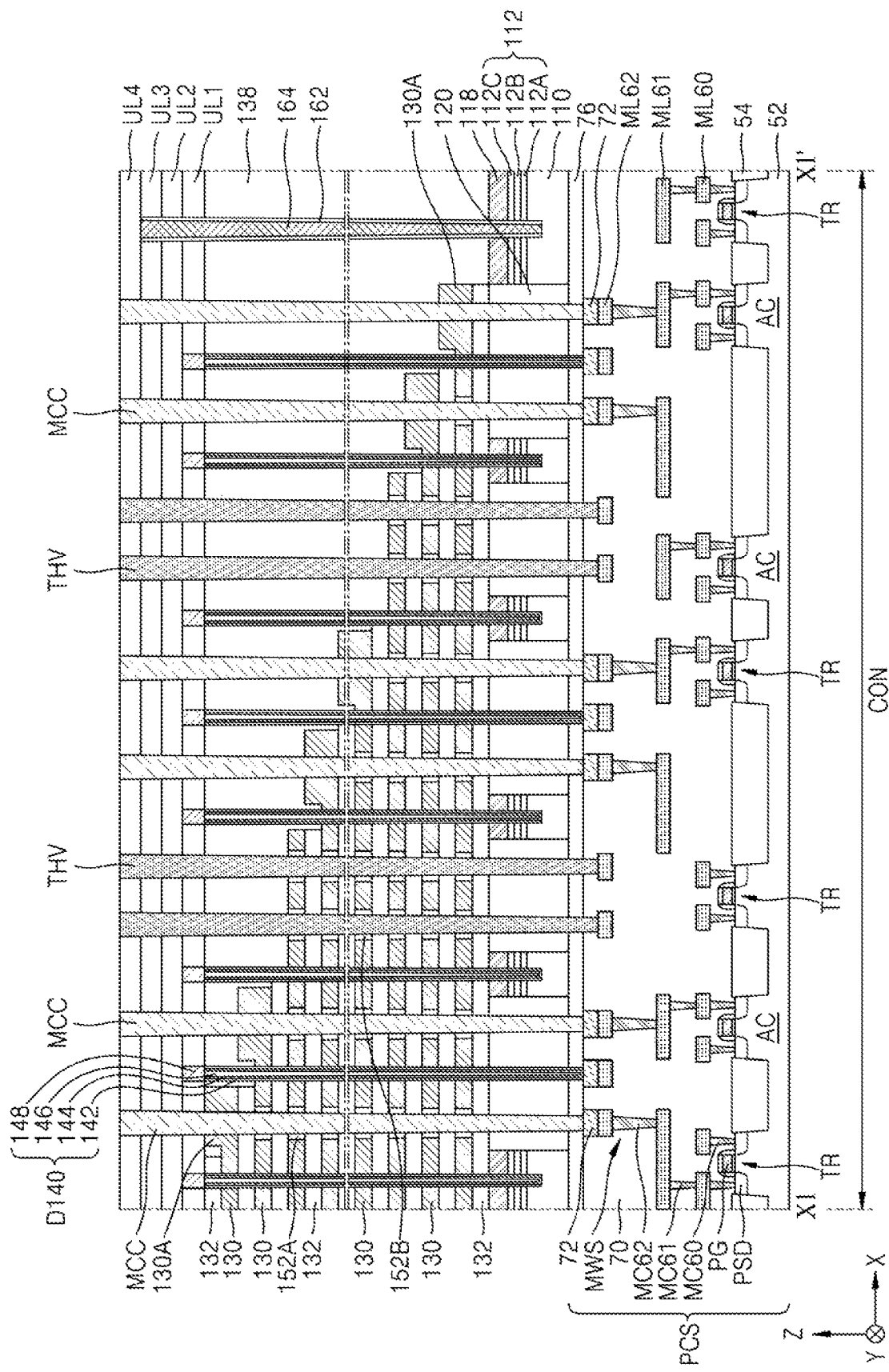

Referring to FIG. 33, in the connection region CON of a resultant material of FIG. 32, a plurality of memory cell contacts MCC filling the plurality of first holes H1 and a plurality of through via electrodes THV filling the plurality of third holes H3 may be formed. In embodiments, the plurality of memory cell contacts MCC and the plurality of through via electrodes THV may be simultaneously formed.

Figure 34A:
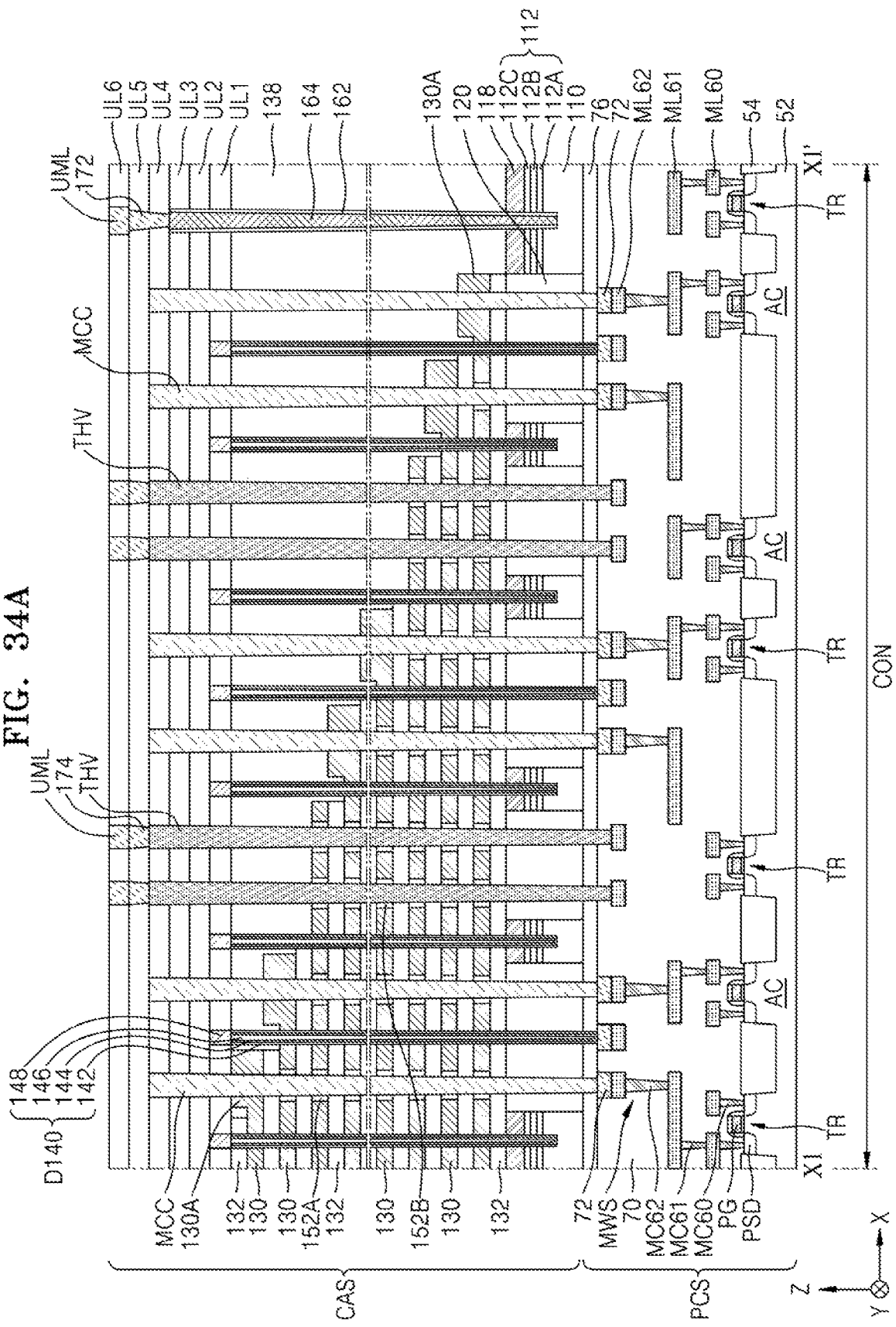
Figure 34B:
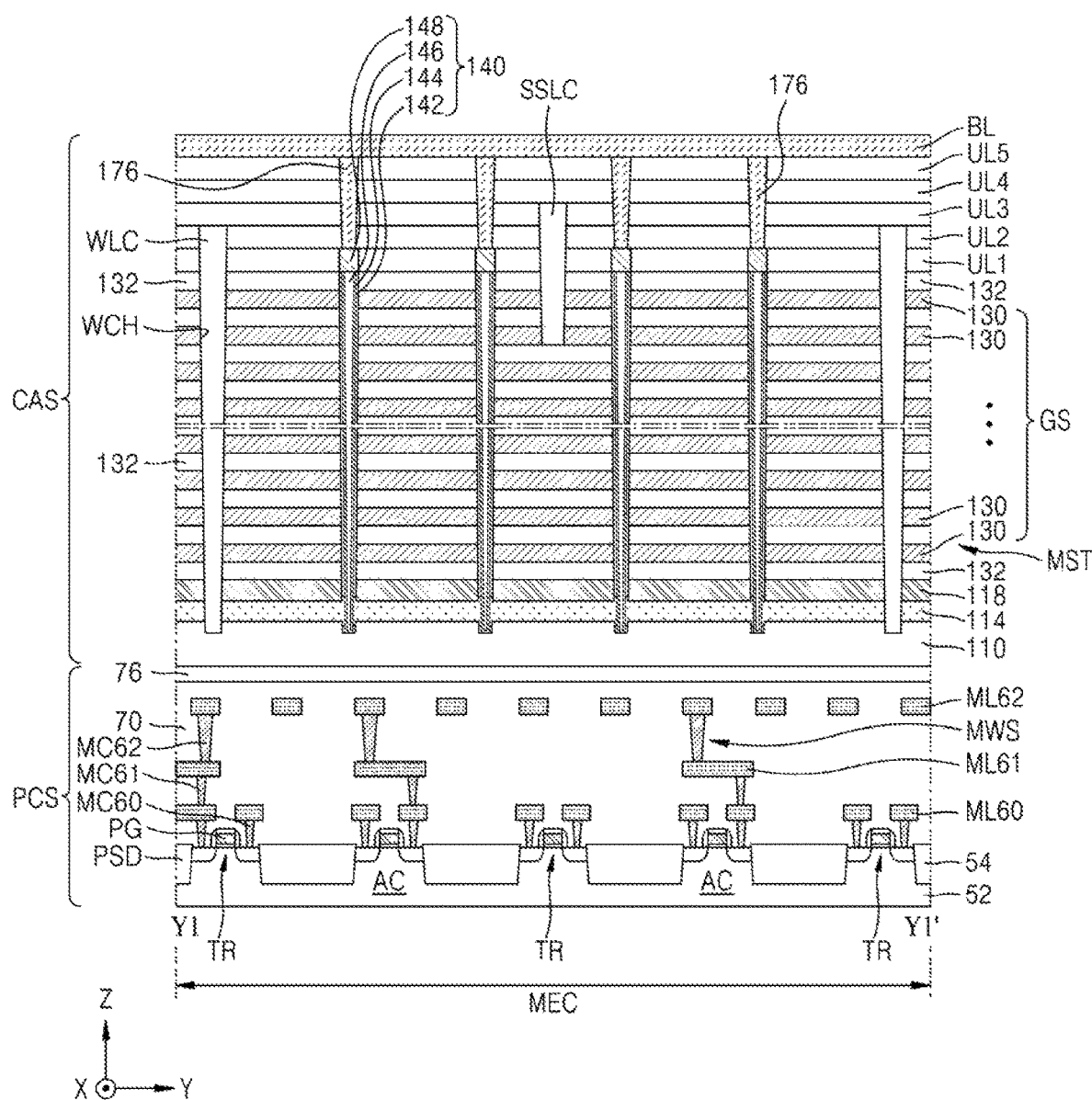

Referring to FIGS. 34A and 34B, a fifth upper insulation layer UL5 covering the memory cell region MEC and the connection region CON may be formed on the resultant material of FIG. 32.

Subsequently, a contact plug 172 which passes through the fifth upper insulation layer UL5 and the fourth upper insulation layer UL4 and is connected to the conductive plate contact 164 in the connection region CON, a plurality of contact plugs 174 which pass through the fifth upper insulation layer UL5 and are connected to the plurality of through via electrodes THV in the connection region CON, and a plurality of contact plugs 176 which pass through the fifth upper insulation layer UL5, the fourth upper insulation layer UL4, and the third upper insulation layer UL3 and are connected to a drain region 148 of each of the plurality of channel structures 140 may be formed.

Subsequently, a plurality of upper wiring layers UML connected to the contact plug 172 and the plurality of contact plugs 174 may be formed on the fifth upper insulation layer UL5 in the connection region CON, a plurality of bit lines BL connected to the plurality of contact plugs 176 may be formed on the fifth upper insulation layer UL5 in the memory cell region MEC, and a sixth upper insulation layer UL6 filling a space between each of the plurality of upper wiring layers UML and a corresponding bit line BL of the plurality of bit lines BL may be formed in the memory cell region MEC.

A method of manufacturing the semiconductor device 100 illustrated in FIGS. 21A to 34B has been described above with reference to FIGS. 4 to 10, but it will understood that the semiconductor devices 100A, 100B, 200, 300, 400, 500, 600, 700, and 800 described above with reference to FIGS. 11 to 20 and semiconductor devices having various structures obtained through various modifications and changes therefrom may be manufactured by performing various modifications and changes from the processes described above with reference to FIGS. 21A to 34B.

In embodiments, processes described above with reference to FIGS. 21A to 34B may be used for manufacturing the semiconductor device 200 illustrated in FIG. 13. Particularly, the plurality of first conductive landing vias 272A and the second conductive landing via 272B may be formed by a method similar to the description of a process of forming the plurality of conductive landing vias 72 described above with reference to FIGS. 22A and 22B. The second conductive landing via 272B may be formed not to be connected to another conductive region or another circuit included in the peripheral circuit structure PCS.

In embodiments, the processes described above with reference to FIGS. 21A to 34B may be used for manufacturing the semiconductor device 300 illustrated in FIGS. 14 and 15. In the processes described above with reference to FIGS. 21A and 21B, the plurality of peripheral circuit wiring layers ML62 may be formed, and then, before a portion, covering the plurality of peripheral circuit wiring layers ML62, of the interlayer insulation layer 70 is formed, a lower landing via BV1 which does not contact the peripheral circuit wiring layer ML62 and contacts the lower substrate 52 may be formed. Also, the plurality of first conductive landing vias 372A and an upper landing via BV2 may be formed by a method similar to the description of a process of forming the plurality of conductive landing vias 72 described above with reference to FIGS. 22A and 22B.

In embodiments, the processes described above with reference to FIGS. 21A to 34B may be used for manufacturing the semiconductor device 400 illustrated in FIG. 16. In the processes described above with reference to FIGS. 22A and 23B, the plurality of first conductive landing vias 472A and the second conductive landing via 472B may be formed instead of the plurality of conductive landing vias 72. Here, the second conductive landing via 472B may configure the lower landing via BV1 which does not contact the peripheral circuit wiring layer ML62 and contacts the lower substrate 52.

In embodiments, the processes described above with reference to FIGS. 21A to 34B may be used for manufacturing the semiconductor device 500 illustrated in FIG. 17. A process of forming the plurality of conductive landing vias 72 described above with reference to FIGS. 22A and 22B is omitted, and in forming the plurality of first holes H1 and the plurality of third holes H3 in a process described above with reference to FIG. 28, a top surface of an uppermost peripheral circuit wiring layer ML62 may be exposed through the plurality of first holes H1 and the plurality of third holes H3. Subsequently, processes similar to processes described above with reference to FIGS. 29 to 34B may be performed.

In embodiments, the processes described above with reference to FIGS. 21A to 34B may be used for manufacturing the semiconductor device 600 illustrated in FIG. 18. The plurality of lower landing vias 672A may be formed by a method similar to the description of a process of forming the plurality of conductive landing vias 72 described above with reference to FIGS. 22A and 22B. Subsequently, before the upper interlayer insulation layer 76 is formed or after the upper interlayer insulation layer 76 is formed, the plurality of upper landing vias 672B connected to the plurality of lower landing vias 672A may be formed. Subsequently, processes similar to processes described above with reference to FIGS. 23A to 34B may be performed.

Figure 35:
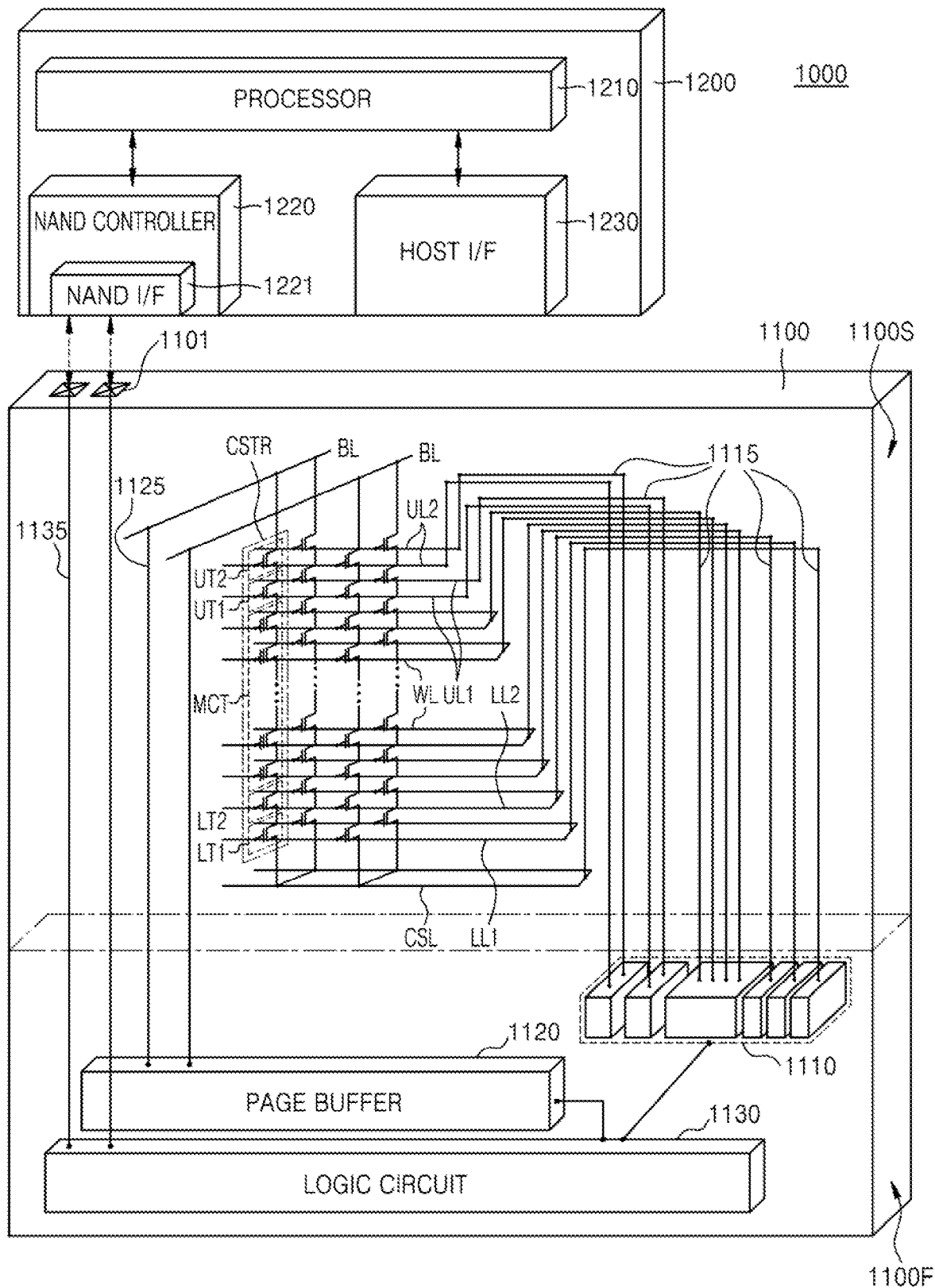
FIG. 35 is a diagram schematically illustrating an electronic system including a semiconductor device according to an embodiment.

FIG. 35 is a diagram schematically illustrating an electronic system 1000 including a semiconductor device according to an embodiment.

Referring to FIG. 35, the electronic system 1000 according to embodiments may include a semiconductor device 1100 and a controller 1200 electrically connected to the semiconductor device 1100. The electronic system 1000 may be a storage device, including one or a plurality of semiconductor devices 1100, or an electronic device including the storage device. For example, the electronic system 1000 may include a solid state drive (SSD) device, a universal serial bus (USB), a computing system, a medical device, or a communication device, which includes at least one semiconductor device 1100.

The semiconductor device 1100 may include a non-volatile memory device. For example, the semiconductor device 1100 may include a NAND flash memory device including at least one of the above-described structures associated with the semiconductor devices 100, 100A, 100B, 200, 300, 400, 500, 600, 700, and 800 described above with reference to FIGS. 4 to 20. The semiconductor device 1100 may include a first structure 1100F and a second structure 1100S on the first structure 1100F. In embodiments, the first structure 1100F may be disposed next to the second structure 1100S. The first structure 1100F may include a peripheral circuit structure which includes a decoder circuit 1110, a page buffer 1120, and a logic circuit 1130. The second structure 1100S may include a memory cell structure which includes a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, the plurality of memory cell strings CSTR may each include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to embodiments.

In embodiments, the upper transistors UT1 and UT2 may include a string selection transistor, and the lower transistors LT1 and LT2 may include a ground selection transistor. The first and second gate lower lines LL1 and LL2 may respectively be gate electrodes of the lower transistors LT1 and LT2. The word line WL may be a gate electrode of the memory cell transistor MCT. The gate upper lines UL1 and UL2 may be gate electrodes of the upper transistors UT1 and UT2.

The common source line CSL, the first and second gate lower lines LL1 and LL2, the plurality of word lines WL, and the first and second gate upper lines UL1 and UL2 may be electrically connected to the decoder circuit 1110 through a plurality of first connection wirings 1115 extending to the second structure 1100S from an inner portion of the first structure 1100F. The plurality of bit lines BL may be electrically connected to the page buffer 1120 through a plurality of second connection wirings 1125 extending to the second structure 1100S from the inner portion of the first structure 1100F.

In the first structure 1100F, the decoder circuit 1110 and the page buffer 1120 may perform a control operation on at least one memory cell transistor MCT of the plurality of memory cell transistors MCT. The decoder circuit 1110 and the page buffer 1120 may be controlled by the logic circuit 1130.

The semiconductor device 1100 may communicate with the controller 1200 through an I/O pad 1101 electrically connected to the logic circuit 1130. The I/O pad 1101 may be electrically connected to the logic circuit 1130 through an I/O connection wiring 1135 extending to the second structure 1100S from the inner portion of the first structure 1100F.

The controller 1200 may include a processor 1210, a NAND controller 1220, and a host interface 1230. According to embodiments, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate based on certain firmware and may control the NAND controller 1220 to access the semiconductor device 1100. The NAND controller 1220 may include a NAND interface 1221 which processes communication with the semiconductor device 1100. A control command for controlling the semiconductor device 1100, data which is to be written in the plurality of memory cell transistors MCT of the semiconductor device 1100, and data which is to be read from the plurality of memory cell transistors MCT of the semiconductor device 1100 may be transferred through the NAND interface 1221. The host interface 1230 may provide a communication function between the electronic system 1000 and an external host. When the control command is received from the external host through the host interface 1230, the processor 1210 may control the semiconductor device 1100 in response to the control command.

Figure 36:
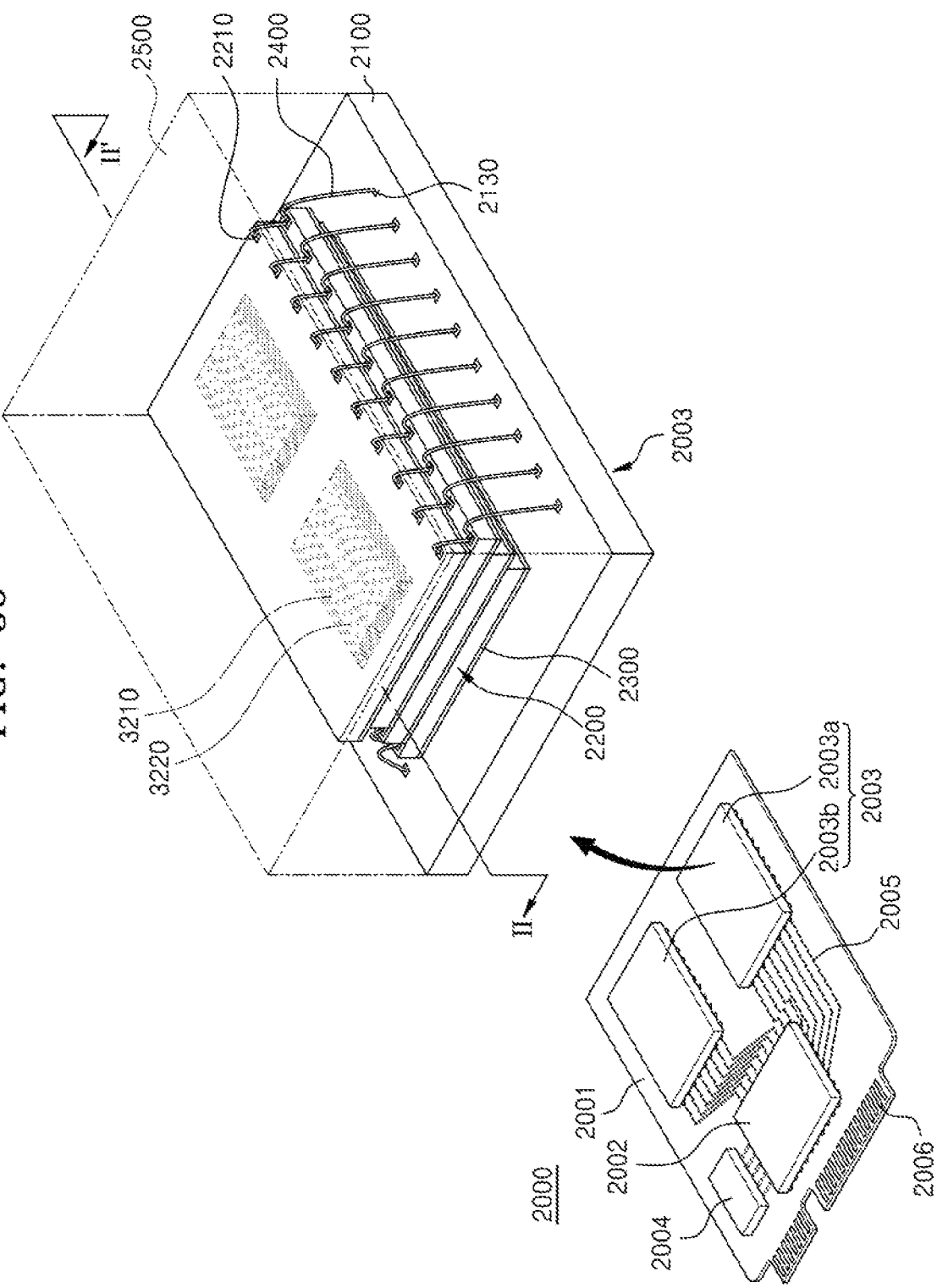
FIG. 36 is a perspective view schematically illustrating an electronic system including a semiconductor device according to an embodiment.

FIG. 36 is a perspective view schematically illustrating an electronic system 2000 including a semiconductor device according to an embodiment.

Referring to FIG. 36, the electronic system 2000 according to an embodiment may include a main substrate 2001, a controller 2002 mounted on the main substrate 2001, one or more semiconductor packages 2003, and dynamic random access memory (DRAM) 2004. The semiconductor packages 2003 and the DRAM 2004 may be connected to the controller 2002 by a plurality of wiring patterns 2005 formed on the main substrate 2001.

The main substrate 2001 may include a connector 2006 including a plurality of pins to be coupled to an external host. The number and arrangement of the plurality of pins in the connector 2006 may vary based on a communication interface between the electronic system 2000 and the external host. In embodiments, the electronic system 2000 may communicate with the external host one the basis of one of interfaces such as universal serial bus (USB), peripheral component interconnect express (PCI-Express), serial advanced technology attachment (SATA), and M-Phy for universal flash storage (UFS). In embodiments, the electronic system 2000 may operate with power supplied from the external host via the connector 2006. The electronic system 2000 may further include a power management integrated circuit (PMIC) distributing the power, which is supplied from the external host, to the controller 2002 and the semiconductor packages 2003.

The controller 2002 may write data to or read data from the semiconductor packages 2003 and may improve an operation speed of the electronic system 2000.

The DRAM 2004 may include a buffer memory for alleviating a speed difference between the external host and the semiconductor packages 2003, which are data storage spaces. The DRAM 2004 included in the electronic system 2000 may also operate as a kind of cache memory and may provide a space for temporarily storing data in a control operation on the semiconductor packages 2003. When the DRAM 2004 is included in the electronic system 2000, the controller 2002 may further include a DRAM controller for controlling the DRAM 2004, in addition to a NAND controller for controlling the semiconductor packages 2003.

The semiconductor packages 2003 may include first and second semiconductor packages 2003a and 2003b, which are spaced apart from each other.

Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may include a printed circuit board including a plurality of package upper pads 2130. Each of the plurality of semiconductor chips 2200 may include an I/O pad 2210. The I/O pad 2210 may correspond to the I/O pad 1101 of FIG. 19. Each of the plurality of semiconductor chips 2200 may include a plurality of gate stacks 3210 and a plurality of channel structures 3220. Each of the plurality of semiconductor chips 2200 may include at least one of the semiconductor devices 100, 100A, 100B, 200, 300, 400, 500, 600, 700, and 800 described with reference to FIGS. 4 to 20.

In embodiments, the connection structure 2400 may include a bonding wire electrically connecting the I/O pad 2210 to the package upper pad 2130. Accordingly, in the first and second semiconductor packages 2003a and 2003b, the plurality of semiconductor chips 2200 may be electrically connected to each other in a bonding wire manner, and may be electrically connected to the package upper pads 2130 of the package substrate 2100. In embodiments, in the first and second semiconductor packages 2003a and 2003b, the plurality of semiconductor chips 2200 may be electrically connected to each other by a connection structure including a through via electrode rather than by the connection structure 2400 of the bonding wire manner.

In embodiments, the controller 2002 and the plurality of semiconductor chips 2200 may be included in one package. In embodiment, the controller 2002 and the plurality of semiconductor chips 2200 may be mounted on a separate interposer substrate, which differs from the main substrate 2001, and may be connected to each other by wirings formed on the interposer substrate.

Figure 37:
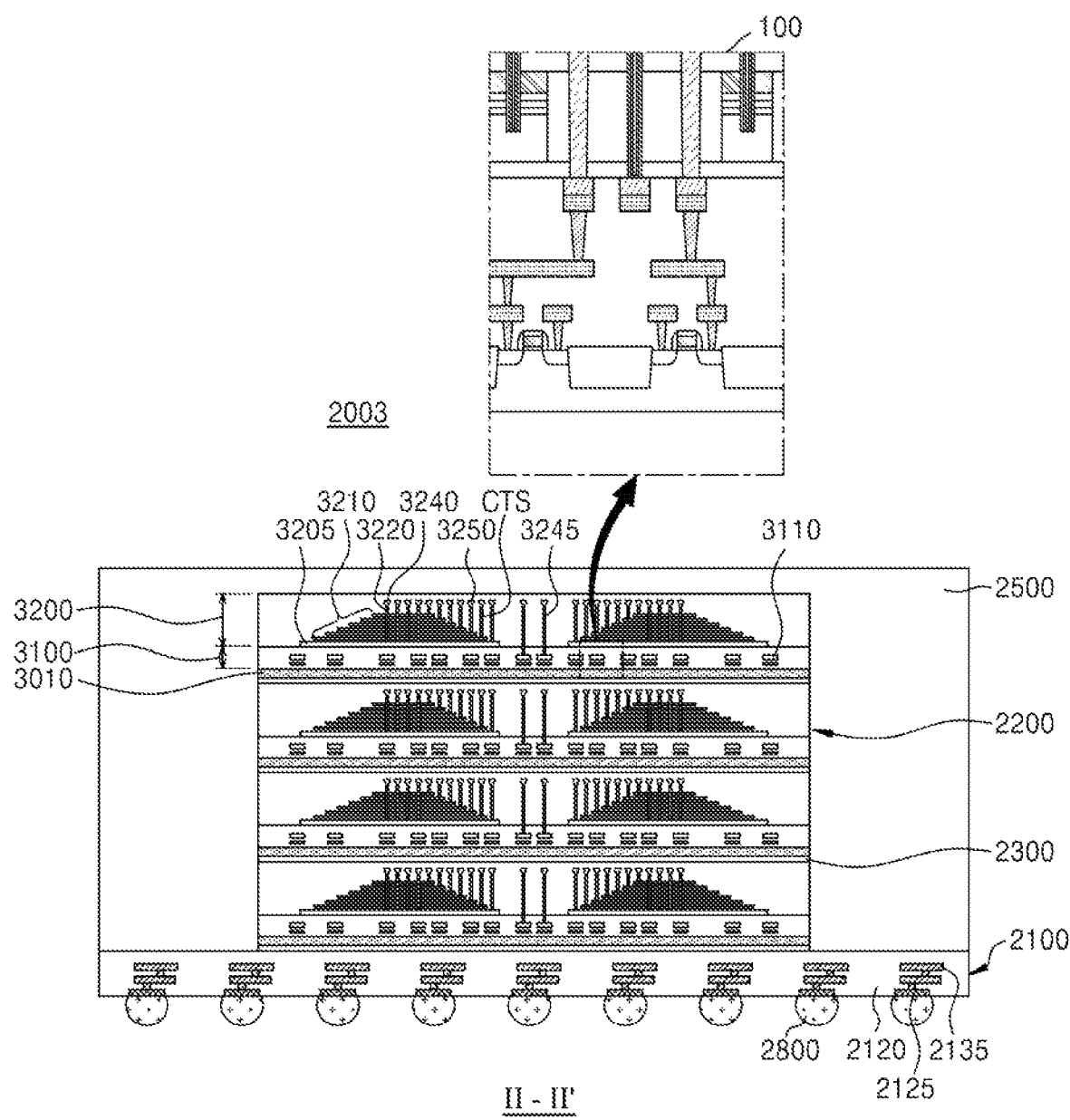
FIG. 37 is a cross-sectional view schematically illustrating semiconductor packages according to an embodiment.

FIG. 37 is a cross-sectional view schematically illustrating semiconductor packages according to an embodiment. FIG. 37 illustrates a configuration corresponding to a cross-sectional surface taken along a line II-II' of FIG. 36, in more detail.

Referring to FIG. 37, in the semiconductor package 2003, the package substrate 2100 may include a printed circuit board. The package substrate 2100 may include a package substrate body 2120, the plurality of package upper pads 2130 (see FIG. 36) arranged on a top surface of the package substrate body 2120, a plurality of lower pads 2125 arranged on or exposed by a bottom surface of the package substrate body 2120, and a plurality of internal wirings 2135 arranged inside the package substrate body 2120 to electrically connect the plurality of package upper pads 2130 to the plurality of lower pads 2125. The plurality of package upper pads 2130 may be electrically connected to a plurality of connection structures 2400. The plurality of lower pads 2125 may be connected to the plurality of wiring patterns 2005 on the main substrate 2001 of the electronic system 2000, which is illustrated in FIG. 36, via a plurality of conductive connection units 2800.

Each of the plurality of semiconductor chips 2200 may include a semiconductor substrate 3010, a first structure 3100, and a second structure 3200, the first structure 3100 and the second structure 3200 being sequentially stacked on the semiconductor substrate 3010 in the stated order. The first structure 3100 may include a peripheral circuit region including a plurality of peripheral wirings 3110. The second structure 3200 may include a common source line 3205, a gate stack 3210 on the common source line 3205, a channel structure 3220 passing through the gate stack 3210, and a bit line 3240 electrically connected to the channel structure 3220. In embodiments, each of the plurality of semiconductor chips 2200 may include the same elements as those of the semiconductor devices 100, 100A, 100B, 200, 300, 400, 500, 600, 700, and 800 described above with reference to FIGS. 4 to 20.

Each of the plurality of semiconductor chips 2200 may include a through wiring 3245, which is electrically connected to the plurality of peripheral wirings 3110 of the first structure 3100 and extends to an inner portion of the second structure 3200. The through wiring 3245 may be disposed outside the gate stack 3210. In other embodiments, the semiconductor package 2003 may further include a through wiring passing through the gate stack 3210. Each of the plurality of semiconductor chips 2200 may include an I/O pad (2210 of FIG. 36) electrically connected to the plurality of peripheral wirings 3110 of the first structure 3100.

As described above, embodiments relate to a semiconductor device including a non-volatile vertical memory device and an electronic system including the semiconductor device. Embodiments may provide a semiconductor device including a plurality of memory cells arranged three-dimensionally and capable of maintaining desired electrical characteristics and reliability despite an increase in the number of stacks of word lines, so as to enhance the degree of integration. Embodiments may provide an electronic system including a semiconductor device including a plurality of memory cells arranged three-dimensionally and capable of maintaining desired electrical characteristic and reliability despite an increase in the number of stacks of word lines, so as to enhance the degree of integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a peripheral circuit structure including a lower substrate, a plurality of circuits on the lower substrate, and a plurality of wiring layers connected to the plurality of circuits;
    an upper substrate extending in a horizontal direction to cover the peripheral circuit structure and including a through opening overlapping a partial region of the peripheral circuit structure in a vertical direction;
    a memory stack structure including a plurality of gate lines overlapping one another in the vertical direction on the upper substrate;
    a memory cell contact disposed in a first hole passing through at least one gate line of the plurality of gate lines to contact one gate line selected from among the plurality of gate lines in the first hole and disposed apart from a gate line other than the selected one gate line in the horizontal direction, the memory cell contact extending to the peripheral circuit structure through the through opening and being electrically connected to a first wiring layer of the plurality of wiring layers; and
    a plurality of dummy channel structures disposed in a second hole passing through at least one gate line of the plurality of gate lines to extend to the peripheral circuit structure through the through opening.

2. The semiconductor device as claimed in claim 1, further comprising a plurality of conductive landing vias disposed at a position overlapping the through opening in the vertical direction at a first level, which is higher than a level of the plurality of wiring layers and lower than a level of the upper substrate in the vertical direction, and disposed apart from one another in the horizontal direction, wherein the plurality of conductive landing vias include:
    a first conductive landing via including a top surface contacting the memory cell contact and a bottom surface contacting the first wiring layer, and
    a second conductive landing via including a top surface contacting at least one dummy channel structure of the plurality of dummy channel structures.

3. The semiconductor device as claimed in claim 1, further comprising a plurality of conductive landing vias disposed at a position overlapping the through opening in the vertical direction at a first level, which is higher than a level of the plurality of wiring layers and lower than a level of the upper substrate in the vertical direction, and disposed apart from one another in the horizontal direction, wherein:
    the plurality of conductive landing vias include:
        a first conductive landing via including a top surface contacting the memory cell contact and a bottom surface contacting the first wiring layer, the first conductive landing via being connected to at least one circuit of the plurality of circuits; and
        a second conductive landing via including a top surface contacting one dummy channel structure of the plurality of dummy channel structures, and
    each conductive landing via of the plurality of conductive landing vias is floated or grounded.

4. The semiconductor device as claimed in claim 1, further comprising a plurality of conductive landing vias disposed at a position overlapping the through opening in the vertical direction at a first level, which is higher than a level of the plurality of wiring layers and lower than a level of the upper substrate in the vertical direction, and disposed apart from one another in the horizontal direction, wherein:

the plurality of conductive landing vias include:
a first conductive landing via including a top surface contacting the memory cell contact and a bottom surface contacting the first wiring layer, the first conductive landing via being connected to at least one circuit of the plurality of circuits; and
a second conductive landing via including a top surface contacting the plurality of dummy channel structures, and
the second conductive landing via is floated or grounded.

5. The semiconductor device as claimed in claim 1, further comprising:
a first conductive landing via disposed at a first level, which is higher than a level of the plurality of wiring layers and lower than a level of the upper substrate in the vertical direction, and disposed between the memory cell contact and the first wiring layer, the first conductive landing via including a top surface contacting the memory cell contact and a bottom surface contacting the first wiring layer; and
a second conductive landing via disposed at the first level, the second conductive landing via including a top surface contacting at least one dummy channel structure of the plurality of dummy channel structures and a bottom surface contacting a second wiring layer of the plurality of wiring layers, wherein:
the first conductive landing via is connected to at least one circuit of the plurality of circuits through the first wiring layer, and
the second conductive landing via and the second wiring layer are floated or grounded.

6. The semiconductor device as claimed in claim 1, further comprising:
a first conductive landing via disposed at a first level, which is higher than a level of the plurality of wiring layers and lower than a level of the upper substrate in the vertical direction, and disposed between the memory cell contact and the first wiring layer, the first conductive landing via including a top surface contacting the memory cell contact and a bottom surface contacting the first wiring layer; and
a second conductive landing via disposed at the first level, the second conductive landing via including a top surface contacting at least one dummy channel structure of the plurality of dummy channel structures, wherein:
the first conductive landing via is connected to at least one circuit of the plurality of circuits through the first wiring layer, and
the second conductive landing via is not connected to any wiring layer of the plurality of wiring layers, and is floated or grounded.

7. The semiconductor device as claimed in claim 1, further comprising:
a first conductive landing via disposed at a first level, which is higher than a level of the plurality of wiring layers and lower than a level of the upper substrate in the vertical direction, and disposed between the memory cell contact and the first wiring layer, the first conductive landing via including a top surface contacting the memory cell contact and a bottom surface contacting the first wiring layer; and
a second conductive landing via disposed at the first level, the second conductive landing via including a top surface contacting at least one dummy channel structure of the plurality of dummy channel structures, and a bottom surface contacting the lower substrate, wherein:
the first conductive landing via is connected to at least one circuit of the plurality of circuits through the first wiring layer, and
the second conductive landing via is grounded.

8. The semiconductor device as claimed in claim 1, further comprising:
a first conductive landing via disposed at a first level higher than a level of the plurality of wiring layers and lower than a level of the upper substrate in the vertical direction, disposed between the memory cell contact and the first wiring layer, and being connected to at least one circuit of the plurality of circuits through the first wiring layer, the first conductive landing via including a top surface contacting the memory cell contact and a bottom surface contacting the first wiring layer; and
a second conductive landing via including a top surface contacting at least one dummy channel structure of the plurality of dummy channel structures, the second conductive landing via being grounded, wherein the second conductive landing via includes:
a lower landing via extending toward the upper substrate from the lower substrate in the vertical direction; and
an upper landing via disposed at the first level, the upper landing via including a top surface contacting the at least one dummy channel structure and a bottom surface contacting the lower landing via.

9. The semiconductor device as claimed in claim 1, wherein:
the first wiring layer includes a top surface contacting the memory cell contact,
at least one dummy channel structure of the plurality of dummy channel structures includes a bottom surface contacting a second wiring layer of the plurality of wiring layers, and
the second wiring layer is floated or grounded.

10. The semiconductor device as claimed in claim 1, further comprising:
a through via electrode disposed in a third hole passing through at least one other gate line of the plurality of gate lines, the through via electrode extending to the peripheral circuit structure through the through opening and being electrically connected to a second wiring layer of the plurality of wiring layers; and
an insulation ring disposed between the through via electrode and a gate electrode surrounding the through via electrode.

11. The semiconductor device as claimed in claim 10, further comprising a plurality of conductive landing vias disposed at a position to overlap the through opening in the vertical direction at a first level, which is higher than a level of the plurality of wiring layers and lower than a level of the upper substrate in the vertical direction, and disposed apart from one another in the horizontal direction, wherein the plurality of conductive landing vias include:
a first conductive landing via disposed between the memory cell contact and the first wiring layer, the first conductive landing via including a top surface contacting the memory cell contact and a bottom surface contacting the first wiring layer; and
a second conductive landing via including a top surface contacting at least one dummy channel structure of the plurality of dummy channel structures.

12. A semiconductor device, comprising:
- a peripheral circuit structure including a lower substrate, a plurality of circuits on the lower substrate, and a plurality of wiring layers connected to the plurality of circuits;
- an upper substrate extending in a horizontal direction in a memory cell region and a connection region on the peripheral circuit structure and including a plurality of through openings overlapping a partial region of the peripheral circuit structure in a vertical direction in the connection region;
- a memory stack structure including a plurality of gate lines overlapping one another in the vertical direction on the upper substrate in the memory cell region and the connection region;
- a memory cell contact disposed in a first hole passing through at least one gate line of the plurality of gate lines in the connection region to contact one gate line selected from among the plurality of gate lines in the first hole and disposed apart from a gate line other than the selected one gate line in the horizontal direction, the memory cell contact extending to the peripheral circuit structure through a first through opening of the plurality of through openings and being electrically connected to a first wiring layer of the plurality of wiring layers;
- a dummy channel structure disposed in a second hole passing through at least one gate line of the plurality of gate lines in the connection region to extend to the peripheral circuit structure through the first through opening; and
- a through via electrode disposed in a third hole passing through at least one gate line of the plurality of gate lines in the connection region, the through via electrode extending to the peripheral circuit structure through a second through opening of the plurality of through openings and being electrically connected to a second wiring layer of the plurality of wiring layers.

13. The semiconductor device as claimed in claim 12, further comprising a plurality of conductive landing vias disposed at a position overlapping the first through opening in the vertical direction at a first level, which is higher than a level of the plurality of wiring layers and lower than a level of the upper substrate in the vertical direction, and disposed apart from one another in the horizontal direction, the plurality of conductive landing vias including a material different from a material of each of the plurality of wiring layers, wherein the plurality of conductive landing vias include:
- a first conductive landing via including a top surface contacting the memory cell contact and a bottom surface contacting the first wiring layer; and
- a second conductive landing via including a top surface contacting the dummy channel structure.

14. The semiconductor device as claimed in claim 12, further comprising:
- a first conductive landing via disposed at a first level higher than a level of the plurality of wiring layers and lower than a level of the upper substrate in the vertical direction, the first conductive landing via including a top surface contacting the memory cell contact and a bottom surface contacting the first wiring layer; and
- a second conductive landing via disposed at the first level, the second conductive landing via including a top surface contacting a bottom surface of the dummy channel structure and a bottom surface contacting a third wiring layer of the plurality of wiring layers, wherein:
- the first conductive landing via is connected to at least one circuit of the plurality of circuits, and
- the second conductive landing via and the third wiring layer are floated or grounded.

15. The semiconductor device as claimed in claim 12, further comprising:
- a first conductive landing via disposed at a first level higher than a level of the plurality of wiring layers and lower than a level of the upper substrate in the vertical direction, the first conductive landing via including a top surface contacting the memory cell contact and a bottom surface contacting the first wiring layer; and
- a second conductive landing via disposed at the first level, the second conductive landing via including a top surface contacting the dummy channel structure, wherein:
- the first conductive landing via is connected to at least one circuit of the plurality of circuits, and
- the second conductive landing via is not connected to any wiring layer of the plurality of wiring layers, and is floated or grounded.

16. The semiconductor device as claimed in claim 12, further comprising:
- a first conductive landing via disposed at a first level higher than a level of the plurality of wiring layers and lower than a level of the upper substrate in the vertical direction, the first conductive landing via including a top surface contacting the memory cell contact and a bottom surface contacting the first wiring layer; and
- a second conductive landing via disposed at the first level, the second conductive landing via including a top surface contacting the dummy channel structure and a bottom surface contacting the lower substrate, wherein:
- the first conductive landing via is connected to at least one circuit of the plurality of circuits, and
- the second conductive landing via is grounded.

17. The semiconductor device as claimed in claim 12, further comprising:
- a first conductive landing via disposed at a first level higher than a level of the plurality of wiring layers and lower than a level of the upper substrate in the vertical direction, and being connected to at least one circuit of the plurality of circuits through the first wiring layer, the first conductive landing via including a top surface contacting the memory cell contact and a bottom surface contacting the first wiring layer; and
- a second conductive landing via including a top surface contacting the dummy channel structure, the second conductive landing via being grounded, wherein the second conductive landing via includes:
- a lower landing via extending toward the upper substrate from the lower substrate in the vertical direction; and
- an upper landing via disposed at the first level, the upper landing via including a top surface contacting the dummy channel structure and a bottom surface contacting the lower landing via.

18. The semiconductor device as claimed in claim 12, wherein:
- the first wiring layer includes a top surface contacting the memory cell contact,
- the second wiring layer includes a top surface contacting the through via electrode,
- the dummy channel structure includes a bottom surface contacting a third wiring layer of the plurality of wiring layers, and
- the third wiring layer is floated or grounded.

19. An electronic system, comprising:
a semiconductor device on a main substrate, and a controller electrically connected to the semiconductor device and on the main substrate, wherein the semiconductor device includes:
a peripheral circuit structure including a lower substrate, a plurality of circuits on the lower substrate, and a plurality of wiring layers connected to the plurality of circuits;
an upper substrate extending in a horizontal direction to cover the peripheral circuit structure and including a through opening overlapping a partial region of the peripheral circuit structure in a vertical direction;
a memory stack structure including a plurality of gate lines overlapping one another in the vertical direction on the upper substrate;
a memory cell contact disposed in a first hole passing through at least one gate line of the plurality of gate lines to contact one gate line selected from among the plurality of gate lines in the first hole and disposed apart from a gate line other than the selected one gate line in the horizontal direction, the memory cell contact extending to the peripheral circuit structure through the through opening and being electrically connected to a first wiring layer of the plurality of wiring layers;
a plurality of dummy channel structures disposed in a second hole passing through at least one gate line of the plurality of gate lines to extend to the peripheral circuit structure through the through opening; and
an input/output pad electrically connected to the peripheral circuit structure.

20. The electronic system as claimed in claim 19, wherein:
the main substrate includes a plurality of wiring patterns electrically connecting the semiconductor device to the controller,
the semiconductor device further includes a plurality of conductive landing vias disposed at a position to overlap the through opening in the vertical direction at a first level higher than a level of the plurality of wiring layers and lower than a level of the upper substrate in the vertical direction, and disposed apart from one another in the horizontal direction, and
the plurality of conductive landing vias include:
a first conductive landing via including a top surface contacting the memory cell contact and a bottom surface contacting the first wiring layer; and
a second conductive landing via including a top surface contacting at least one dummy channel structure of the plurality of dummy channel structures.

* * * * *